(12) United States Patent
Lee et al.

(10) Patent No.: US 9,608,652 B2
(45) Date of Patent: Mar. 28, 2017

(54) METHODS AND APPARATUS FOR REDUCING TIMING-SKEW ERRORS IN TIME-INTERLEAVED ANALOG-TO-DIGITAL CONVERTERS

(71) Applicants: Sunghyuk Lee, Cambridge, MA (US); Hae-Seung Lee, Lexington, MA (US); Anantha Chandrakasan, Belmont, MA (US)

(72) Inventors: Sunghyuk Lee, Cambridge, MA (US); Hae-Seung Lee, Lexington, MA (US); Anantha Chandrakasan, Belmont, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 10 days.

(21) Appl. No.: 14/948,875

(22) Filed: Nov. 23, 2015

(65) Prior Publication Data
US 2016/0079994 A1    Mar. 17, 2016

Related U.S. Application Data

(63) Continuation of application No. PCT/US2015/014890, filed on Feb. 6, 2015.
(Continued)

(51) Int. Cl.
*H03M 1/06*    (2006.01)
*H03M 1/08*    (2006.01)
(Continued)

(52) U.S. Cl.
CPC ......... *H03M 1/0609* (2013.01); *H03M 1/002* (2013.01); *H03M 1/0836* (2013.01);
(Continued)

(58) Field of Classification Search
CPC .... H03M 1/0609; H03M 1/123; H03M 1/002; H03M 1/46; H03M 1/181;
(Continued)

(56) References Cited

U.S. PATENT DOCUMENTS 6,115,675 A    9/2000  Benco et al.
7,058,911 B2   6/2006  Singh
(Continued)

OTHER PUBLICATIONS

Boni, A. et al., "LVDS I/O Interface for Gb/s-per-pin Operation in 0.35um CMOS," IEEE Journal of Solid-State Circuits, vol. 36, No. 4, Apr. 2001, pp. 706-711.
(Continued)

*Primary Examiner* — Jean B Jeanglaude
(74) *Attorney, Agent, or Firm* — Cooley LLP

(57) ABSTRACT

A time-interleaved (TI) analog-to-digital converter (ADC) architecture employs a low resolution coarse ADC channel that samples an input analog signal at a Nyquist rate and facilitates background calibration of timing-skew error without interrupting normal operation to sample/convert the input signal. The coarse ADC channel provides a timing reference for multiple higher resolution TI ADC channels that respectively sample the input signal at a lower sampling rate. The coarse ADC digital output is compared to respective TI ADC digital outputs to variably adjust in time corresponding sampling clocks of the TI ADC channels so as to substantially align them with the sampling clock of the coarse ADC channel, thus reducing timing-skew error. In one example, the coarse ADC output provides the most significant bits (MSBs) of the respective TI ADC digital outputs to further improve conversion speed and reduce power consumption in these channels.

38 Claims, 44 Drawing Sheets

Related U.S. Application Data

(60) Provisional application No. 61/936,459, filed on Feb. 6, 2014.

(51) Int. Cl.
  *H03M 1/00* (2006.01)
  *H03M 1/18* (2006.01)
  *H03M 1/46* (2006.01)
  *H03M 1/12* (2006.01)

(52) U.S. Cl.
  CPC ........... *H03M 1/121* (2013.01); *H03M 1/123* (2013.01); *H03M 1/1245* (2013.01); *H03M 1/181* (2013.01); *H03M 1/46* (2013.01); *H03M 1/1215* (2013.01)

(58) Field of Classification Search
  CPC .. H03M 1/1245; H03M 1/121; H03M 1/1215; H03M 1/12; H03M 1/00
  USPC .......................................... 341/118–120, 155
  See application file for complete search history.

(56) References Cited

U.S. PATENT DOCUMENTS

| | | | | |
|---|---|---|---|---|
| 7,135,999 B2* | 11/2006 | Kuttner | ............... | H03M 1/0643 341/118 |
| 7,250,885 B1 | 7/2007 | Nairn | | |
| 8,159,377 B2 | 4/2012 | Goldman et al. | | |
| 8,212,697 B2* | 7/2012 | Jansson | ............... | H03M 1/1019 327/248 |
| 8,456,347 B2* | 6/2013 | Wikner | ............... | H03M 1/1023 341/118 |
| 8,471,751 B2* | 6/2013 | Wang | ................... | H03M 1/145 327/307 |
| 8,604,954 B2 | 12/2013 | Chen et al. | | |
| 2006/0066466 A1 | 3/2006 | Pan et al. | | |
| 2007/0194960 A1 | 8/2007 | Wang et al. | | |
| 2008/0048896 A1 | 2/2008 | Parthasarthy et al. | | |
| 2011/0304489 A1* | 12/2011 | Christer | .............. | H03M 1/1019 341/118 |
| 2012/0025903 A1 | 2/2012 | Foote et al. | | |
| 2012/0213531 A1 | 8/2012 | Nazarathy et al. | | |
| 2013/0069812 A1 | 3/2013 | Waltari | | |

OTHER PUBLICATIONS

Chen, S.W. et al., "A 6b 600MS/s 5.3mW Asynchronous ADC in 0.13mu CMOS," IEEE ISSCC Dig. Tech. Papers, Feb. 2006, pp. 2350-2359.
Chu, J. et al., "A 450 MS/s 10-bit Time-Interleaved Zero-Crossing Based ADC," IEEE Custom Integrated Circuits Conference, Sep. 2011, pp. 1-4.
Craninckx, J. et al., "A 65fJ/Conversion-Step 0-to-50MS/s 0-to-0.7mW 9b Charge-Sharing SAR ADC in 90nm Digital CMOS," IEEE ISSCC Dig. Tech. Papers, Feb. 2007, pp. 246-247.
Dessouky, M. et al., "Very Low-Voltage Digital-Audio Delta-Sigma Modulator with 88-dB Dynamic Range Using Local Switch Bootstrapping," IEEE Journal of Solid-State Circuits, vol. 36, No. 3, Mar. 2001, pp. 349-355.
Divi, V. et al., "Blind Calibration of Timing Skew in Time-Interleaved Analog-to-Digital Converters," IEEE Journal of Selected Topics in Signal Processing, vol. 3, No. 3, Jun. 2009, pp. 509-522.
Doris, K. et al., "A 480mW 2.6GS/s 10b 65nm CMOS time-interleaved ADC with 48.5dB SNDR up to Nyquist," IEEE ISSCC Dig. Tech. Papers, Feb. 2011, pp. 180-181.
Ei-Chammas, M. et al., "A 12-GS/s 81-mW 5-bit Time-Interleaved Flash ADC With Background Timing Skew Calibration," IEEE Journal of Solid State Circuits, vol. 46, No. 4, Apr. 2011, pp. 838-847.
Greshishchev, Y. et al., "A 40GS/s 6b ADC in 65nm CMOS," IEEE ISSCC Dig. Tech. Papers, Feb. 2010, pp. 390-391.
Harpe, P. et al., "A 26 uW 8 bit 10 MS/s Asynchronous SAR ADC for Low Energy Radios," IEEE Journal of Solid-State Circuits, vol. 46, No. 7, 2011, pp. 1585-1595.
Harwood, M. et el., "A 12.5Gb/s SerDes in 65nm CMOS Using a Baud-Rate ADC with Digital Receiver Equalization and Clock Recovery," IEEE ISSCC Dig. Tech. Papers, Feb. 2007, pp. 436-437.
Huang, Guan-Ying et al., "A 10b 200MS/s 0.82mW SAR ADC in 40nm CMOS," IEEE Asian Solid-State Circuits Conference, Nov. 2013, pp. 289-292.
Jin, H. et al., "A Digital-Background Calibration Technique for Minimizing Timing-Error Effects in Time-Interleaved ADCs," IEEE Transactions on Circuits and Systems II, vol. 47, No. 7, Jul. 2000, pp. 603-613.
Kurosawa, N. et al., "Explicit analysis of channel mismatch effects in time-interleaved ADC systems," IEEE Transactions on Circuits and Systems I, vol. 48, No. 3, Mar. 2001, pp. 261-271.
Laakso, T. et al., "Splitting the Unit Delay [FIR/all pass filters design]," IEEE Signal Processing Magazine, vol. 13, No. 1, Jan. 1996, pp. 30-60.
Le Dortz, N. et al., "A 1.62GS/s time-interleaved SAR ADC with digital background mismatch calibration achieving interleaving spurs below 70dBFS," IEEE ISSCC Dig. Tech. Papers, Feb. 2014, pp. 386-388.
Lee, S., "Techniques for Low-Power High-Performance ADCs," Ph.D. thesis, Department of Electrical Engineering and Computer, indexed at Library of Massachusetts Institute of Technology, Jun. 2014, 79 pages.
Lee, S. et al., "A 1 GS/s 10b 18.9 mW Time-Interleaved SAR ADC With Background Timing Skew Calibration," IEEE Journal of Solid-State Circuits, vol. 49, No. 12, Dec. 2014, pp. 2846,2856.
Lee, S. et al., "A 10-b, 1GS/s Time-interleaved SAR ADC with a Background Timing-skew Calibration," MIT Annual Research Report 2013 (http://www-mtl.mit.edu/wpmu/ar2013/a-10-b-1gss-time-interleaved-sar-adc-with-a-background-timing-skew-calibration/).
Lewis, S. H. et al., "A pipelined 5-Msample/s 9-bit analog-to-digital converter," IEEE Journal of Solid-State Circuits, vol. 22, No. 6, Dec. 1987, pp. 954-961.
Lin, Y.-Z. et al., "A 9-bit 150-MS/s 1.53-mW Subranged SAR ADC in 90-nm CMOS," IEEE Symposium on VLSI Circuits, Jun. 2010, pp. 243-244.
Liu, C.-C. et al., "A 10-bit 50-MS/s SAR ADC With a Monotonic Capacitor Switching Procedure," IEEE Journal of Solid State Circuits, vol. 45, No. 4, Apr. 2010, pp. 731-740.
Murmann, B. "ADC Performance Survey 1997-2013," [Online]. Available: http://www.stanford.edu/~murmann/adcsurvey.html.
Nuzzo, P., "Noise Analysis of Regenerative Comparators for Reconfigurable ADC Architectures," IEEE Transactions on Circuits and Systems I: Regular Papers, vol. 55, No. 6, Jul. 2008, pp. 1441-1454.
Poulton, K. et al., "A 20 GS/s 8 b ADC with a 1 MB memory in 0.18 um CMOS," IEEE ISSCC Dig. Tech. Papers, Feb. 2003, pp. 318-319.
Tripathi, V. et al., "Mismatch characterization of small metal fringe capacitors," IEEE Custom Integrated Circuits Conference (CICC), Sep. 2013, pp. 1-4.
Stepanovic, D. et al., "A 2.8 GS/s 44.6 mW Time-Interleaved ADC Achieving 50.9 dB SNDR and 3 dB Effective Resolution Bandwidth of 1.5 GHz in 65 nm CMOS," IEEE Journal of Solid State Circuits, vol. 48, No. 4, Apr. 2013, pp. 971-982.
Sung, B. et al., "A 6 bit 2 GS/s flash-assisted time-interleaved (FATI) SAR ADC with background offset calibration," IEEE Asian Solid-State Circuits Conference, Nov. 2013, pp. 281-284.
Notification of Transmittal of the International Search Report and the Written Opinion of the International Searching Authority, or the Declaration in related PCT Application No. PCT/US2015/14890, filed Feb. 6, 2015, mailed May 15, 2015, 10 pages.

* cited by examiner

METHODS AND APPARATUS FOR REDUCING TIMING-SKEW ERRORS IN TIME-INTERLEAVED ANALOG-TO-DIGITAL CONVERTERS

CROSS-REFERENCES TO RELATED APPLICATIONS

This application claims a priority benefit to PCT Application No. PCT/US2015/014890, filed Feb. 6, 2015, entitled "METHODS AND APPARATUS FOR REDUCING TIMING-SKEW ERRORS IN TIME-INTERLEAVED ANALOG-TO-DIGITAL CONVERTERS", which is hereby incorporated by reference in its entirety, including drawings.

PCT application No. PCT/US2015/014890 in turn claims a priority benefit to U.S. Provisional Application No. 61/936,459, filed Feb. 6, 2014, entitled "A Background Timing-Skew Detection Technique for Time-Interleaved ADCs," which is hereby incorporated by reference in its entirety, including drawings.

BACKGROUND

A time-interleaved (TI) analog-to-digital converter (ADC) architecture increases the effective conversion rate of an ADC by multiplexing several ADC "channels" in parallel. In a time-interleaved structure, the effective sampling rate can be increased by n times, by having n time-interleaved channels.

FIG. 1 shows a block diagram of a conventional TI ADC architecture including multiple TI ADCs $120a\text{-}n$. The respective TI ADCs sample an input signal 102 at interleaved timing based on a plurality of clock signals $103_1\text{-}n$ (also shown in FIG. 1 with labels $T_1\text{-}T_N$) applied to sample/hold (S/H) circuits $105_1\text{-}n$. The combination of one TI ADC and its corresponding S/H circuit is sometimes referred to as a TI ADC "channel." When the digital outputs $122_1\text{-}n$ of the respective TI ADCs (or TI ADC channels) are combined and placed in an interleaved sequence by a multiplexer 150, the collection of TI ADC channels functions effectively as a single converter operating at a higher conversion rate (the effective conversion rate ($f_s$) of a TI ADC architecture can be expressed as $f_s = f_c \cdot n$, where $f_c$ is the conversion rate of each channel and n is number of the interleaved channels; thus, the effective conversion rate can be increased linearly by interleaving more channels). The TI ADC architecture can be applied to most ADC architectures, some examples of which include flash, folding, pipelined, successive approximation (SAR), single slope, and sigma-delta architectures.

Conventional TI ADC architectures generally provide for increased power efficiency. In non-time-interleaved conventional ADCs, the power consumption of an ADC generally grows much faster than proportional to the conversion rate of the ADC. However, in the time-interleaved architecture shown in FIG. 1, the effective conversion rate can be increased by n times at the cost of only n times power consumption. Although there is some additional power overhead due to components that facilitate the TI ADC architecture (e.g., an interleaved clock generator and a digital output combiner), this additional power overhead is typically an insignificant portion of the overall power consumption.

The resolution of a TI ADC architecture overall is the same as the resolution of the ADC in each channel. However, in some implementations, mismatches between the channels introduce additional error sources that limit the accuracy of the analog to digital conversion. Because most errors from conventional TI ADC architectures appear as harmonics and spurs in the output spectrum, these types of errors are especially detrimental to applications which require high Spurious-Free Dynamic Range (SFDR).

The effective sampling rate of the TI ADC architecture may not be increased arbitrarily high due to some practical limitations. The sample and hold (S/H) circuits $105_1\text{-}n$ shown in FIG. 1 present one such limitation; namely, the S/H circuits $105_1\text{-}n$ should be fast enough to track the input signal accurately up to the speed and resolution of the corresponding TI ADC in the channel. Thus, the ultimate effective sampling rate is limited by the bandwidth of the S/H circuit. Furthermore, the area and on-chip wiring of a TI ADC architecture sets a practical limitation on the number of channels. Because of the parallel structure, the area and cost of TI ADCs $120a\text{-}n$ increase linearly with the number of channels. Also, it is difficult to connect sensitive signals, such as the input analog signal and the clock signals, over a wide area without introducing some degree of mismatch and noise. Thus, increasing the number of interleaved channels can in some respects degrade overall performance of the TI ADC architecture.

Another issue with the conventional TI ADC architecture shown in FIG. 1 relates to offset and mismatch. The offset of an ADC manifests itself as a static value added at the input regardless of the input signal. A fixed amount of error caused by random variation, such as charge injection from the sampling switches and the offsets of comparators and amplifiers, can cause ADC offsets. The offset of a single channel ADC appears as a DC signal in the frequency domain and does not degrade the dynamic performance of the ADC.

In TI ADCs $120_1\text{-}n$, however, the offset mismatches between channels generates tones at the frequencies that are multiples of $$\frac{fs}{n}.$$

FIG. 2 snows an example of me offset errors (301) in a 4-channel TI ADC. In the time domain, the error from the offset mismatches 301 is periodic with a frequency of $$\frac{fs}{4}.$$

Thus, this error appears as multiple tones at the frequencies of $$0, \frac{fs}{4}, \frac{2fs}{4}, \frac{3fs}{4}$$

in the frequency domain 300. Because the offset error does not vary with the input signal 102, the amplitude and frequency of the error tones are independent of the input signal 102. Another way of analyzing TI ADC offset error is that the mean of the offsets of the interleaved channels (e.g., see graph 302) is the offset of the TI ADC and the deviation of the offsets from the interleaved channels (e.g., see graph 303) causes spurs at frequencies of $$\frac{fs}{4}, \frac{2fs}{4}, \frac{3fs}{4}.$$

The offset of each ADC channel can be defined as the y intercept of the best fit line of each ADC transfer function. The calibration of offset mismatches can be done in either the analog domain or the digital domain. Digital offset calibration means an addition or subtraction of an offset value at the digital output. This can be done easily with low power consumption, but, due to the quantization level, the remaining error can be as large as ½ Least Significant Bits (LSBs) of the ADC. On the other hand, the offset calibration in the analog domain can have better accuracy at the cost of additional power and increased circuit complexity.

The gain of an ADC is the slope of the best fit line of the ADC transfer function. Ideally, the gain is equal to 1, but several error sources, such as capacitor mismatches and variations in the reference voltage, cause gain error. In a single channel ADC, gain error changes the amplitude of the output signal, but does not degrade the dynamic performance of the ADC.

The effect of gain mismatches in a four channel TI ADC is described in FIG. 3 (e.g., see graph 401). Errors from gain mismatches are $\Delta g_i \cdot v_{in}$, where $\Delta g_i$ is the gain error of the ith channel and $v_{in}$ is the input signal (102 in FIG. 1). In the time domain, this error can be analyzed as a product of the periodic sequence of $\Delta g_1$, $\Delta g_2$, $\Delta g_3$, $\Delta g_4$ (e.g., see graph 403) and the input signal $v_{in}$, which can be time-variant (e.g., see graph 402).

Thus, the result in the frequency domain 300 can be calculated by the convolution of the two spectra. Because the periodic sequence of $\Delta g_1$, $\Delta g_2$, $\Delta g_3$, $\Delta g_4$ have four tones at frequencies of $$0, \frac{fs}{4}, \frac{2fs}{4}, \frac{3fs}{4},$$

the spurs appear at $$0 \pm f_{in}, \frac{fs}{4} \pm f_{in}, \frac{2fs}{4} \pm f_{in}, \frac{3fs}{4} \pm f_{in}$$

in the frequency domain 300. This is different from the offset errors in that the frequencies of the error tones depend on the input frequency, and the amplitude of the error tones increases linearly with the amplitude of the input signal 102. Multiplications at the digital output can be used for gain-error correction. The digital multiplication increases hardware and power consumption compared to the addition needed for offset calibration.

Another issue with the TI ADC architecture shown in FIG. 1 is referred to as time-skew error. The clock signals $103_1$-n shown in FIG. 1 (or $\phi_1, \ldots \phi_4$ as shown in the data plot in FIG. 5) are usually generated on-chip by dividing a high frequency clock. Ideally, the clocks should be uniformly spaced in time. However, due to unavoidable mismatches in layout, random mismatches in clock generator circuits, and random variations of the threshold voltage in the sampling switches, the clock edges often deviate from the ideal case and are spaced non-uniformly, as shown in FIG. 4 by $\Delta t_1$, $\Delta t_2$, $\Delta t_3$, and $\Delta t_4$. This error of the clock edges in time is called "timing-skew" (and is generally denoted in FIG. 4 with the reference numeral 502). Timing-skew is a unique and additional error source of the TI ADC architecture which does not happen in a single channel ADC.

When a pure single tone signal is applied to the input, the errors from the timing-skew can be expressed as $$v_{IN}(t) = A e^{j w_{in} t} \quad (1)$$

$$e_{skew,i} = \frac{d v_{in}(t)}{dt} \cdot \Delta t_i \quad (2)$$

$$= j w_{in} A e^{j w_{in} t} \cdot \Delta t_i \quad (3)$$

$$= j w_{in} \Delta t_i \cdot v_{IN}(t) \quad (4)$$

where $\Delta t_i$ is the timing-skew 502 of the ith channel. Similar to the gain error case shown in FIG. 4, the error from timing skew can be analyzed as a product of the periodic sequence of $j w \Delta t_1$, $j w \Delta t_2$, ..., $j w \Delta t_N$ and the input signal $V_{IN}$ (102).

FIG. 5 shows an example of the timing-skew error (e.g., see graph 601) in a four channel interleaved ADC. Note that the frequencies of the error tones are the same as the frequency of the tones generated by gain mismatches in the frequency domain 300. This shows that timing-skew and gain errors may not be distinguished from the frequency of the error tones. However, there is an important difference between the gain errors (shown in graph 501) and timing-skew errors (shown in graph 601) that allows the two error sources to be separated. As derived in Equation (4), the timing-skew errors are proportional to the input frequency (e.g., see graph 603), while the errors from gain mismatches are independent of the input frequency. Thus, the gain error can be measured and calibrated from a low frequency input test and the timing-skew errors can be processed later with a high frequency input test.

Considering that the conventional TI ADC architecture shown in FIG. 1 typically is employed to expand the bandwidth of input analog signals for conversion to digital outputs, in practical applications the input analog signals of interest tend to have relatively high frequency components. Unfortunately, given the above-noted relation between the timing-skew error and input frequency, timing-skew errors can thus constitute a dominant source of conversion error in the TI ADC architecture. For example, the timing-skew requirement for a 10 bit 1 GS/s TI ADC can be roughly calculated as follows:

$$\frac{e_{skew,i}}{v_{in}} < \frac{1}{2^N} \quad (5)$$

$$\Delta t_i < \frac{1}{w_{max} \cdot 2^N} = \frac{1}{2\pi 0.5 e^9 \cdot 2^{10}} \approx 300 \, fs \quad (6)$$

Generally, conventional timing-skew calibrations are processed in two steps: timing-skew measurement (or estimation) and error correction. Timing skew can be measured with a predetermined input signal such as a linear ramp or a sine wave with known frequency and amplitude. This makes the measurement relatively easy and accurate. However, to apply such a specific input signal, the normal ADC operation is interrupted to allow for the calibration. Timing-skew is sensitive to temperature and supply voltage changes. Temperature and supply voltage change the sharpness of clock transition edges, which in turn affect the timing-skew caused by random variation of the threshold voltage in the clock generators. The ability to track variations in the timing-skew is an important aspect of the calibration. Thus, these calibrations are limited to applications where ADCs are allowed to a have an off-phase for a foreground calibration (i.e., an interruption to the normal operation of the ADC to sample an input analog signal and provide a corresponding digital output).

Timing-skew can also be measured with arbitrary inputs, which allows for some types of background calibration. In one conventional example, a correlation-based algorithm can be used to measure the timing-skew. A dedicated timing reference TI ADC channel which does not suffer from timing-skew can be used as a reference for the TI ADC channels that are actively sampling and converting an input analog signal. For example, two additional TI ADC channels dedicated to a direct measurement of the timing-skew error can be used. One such TI ADC channel dedicated to calibration serves as a reference for the other "active" TI ADC channels that are sampling and converting the input analog signal, and the other TI ADC channel dedicated to calibration is used to measure the derivative of the input signal. In this example, the additional dedicated TI ADC channels required for the calibration are an expensive overhead.

The correction of timing-skew error can be done in either the digital domain or the analog domain. Digital interpolation filters, fractional delay filters, and Taylor series approximations are examples of digital filters for timing-skew calibration. Although these techniques can be demonstrated in simulation, only a few implementations of these techniques (e.g., in actual silicon chips) have been reported to date in the literature. This is not surprising, as the cost in power consumption and area of the digital calibration block is significant, even in modern CMOS technology.

In another example, programmable-delay blocks are placed at the sampling clock to compensate the timing-skew. This is the most practical and frequently used conventional solution. However, this technique also suffers from some drawbacks in that it tends to increase the noise and jitter of the clock signals used for sampling in the TI ADC channels. The impact of clock jitter is usually negligible for low-performance ADCs, but it becomes more notable for high-speed and high-resolution ADCs. Thus, when sampling speed is improved with TI ADC architecture, clock jitter can limit the accuracy of digital output. Unlike timing-skew, due to its random characteristics, clock jitter increases the noise floor of the output spectrum, but does not cause spurs. The requirement of the clock jitter can be calculated similarly to Equation (6) above.

SUMMARY

In view of the foregoing challenges relating to practical implementation of conventional time-interleaved (TI) analog-to-digital converter (ADC) architectures (and various error sources in these architectures that in some respects undermine the benefits of such architectures), various inventive embodiments disclosed herein are generally directed to mitigating timing-skew errors in such architectures.

To this end, the Inventors have recognized and appreciated that adding a coarse ADC channel to a TI ADC architecture provides for significant advantages in addressing timing-skew errors via background calibration techniques (so as to not interrupt normal operation of sampling and converting an input analog signal). For example, in one illustrative implementation, a coarse ADC channel samples an input analog signal at a "full" sampling rate (e.g., a Nyquist rate based on the input analog signal of interest) to provide a relatively lower resolution digital output corresponding to the input analog signal. This coarse ADC channel also provides a timing reference for a plurality of higher resolution TI ADC channels that respectively sample the input analog signal at relatively lower sampling rates in a time-interleaved manner.

The role of the coarse ADC channel as a timing reference for the TI ADC channels in a TI ADC architecture obviates the need for one or more dedicated TI ADC channels to facilitate background calibration to reduce timing-skew error (and thus reduces some circuit overhead involved in the background calibration). Furthermore, in some implementations, the digital output provided by the coarse ADC may be used to provide the most significant bits (MSBs) of the respective digital outputs provided by the TI ADC channels, thereby improving conversion speed and reducing power consumption in the TI ADC channels. Thus, strategic use of a coarse ADC channel in a TI ADC architecture according to various inventive embodiments disclosed herein provides multiple benefits including, but not limited to, a significant reduction in timing-skew error, improved speed, and reduced power consumption as compared to conventional TI ADC architectures.

In sum, one embodiment of the present invention is directed to an analog-to-digital converter (ADC) apparatus (100), comprising: a coarse ADC (110) to convert an input analog signal (102) to a coarse digital output (112) at a first sampling rate in response to a first clock signal (106) having a first frequency, the coarse digital output constituting a timing reference for the ADC apparatus; a plurality of time-interleaved (TI) ADCs (120) comprising at least a first TI ADC ($120_1$) to convert the input analog signal to a first TI digital output ($122_1$) at a second sampling rate in response to a second clock signal ($116_1$) having a second frequency, wherein: the second frequency of the second clock signal is less than the first frequency of the first clock signal; the first TI ADC is coupled to the coarse ADC so as to receive the coarse digital output; the first TI ADC digital output includes a plurality of most significant bits (MSBs) and a plurality of least significant bits (LSBs); and the plurality of MSBs of the TI ADC digital output are based on the coarse digital output; and a timing-skew controller (124), coupled to at least the first TI ADC, to make a first comparison of the coarse digital output constituting the timing reference and the first TI digital output and significantly reduce a first timing-skew error between the coarse digital output and the first TI digital output based at least in part on the first comparison.

Another embodiment is directed to a method for converting an input analog signal to a digital output, the method comprising: A) converting the input analog signal to a coarse digital output at a first sampling rate in response to a first clock signal having a first frequency, the coarse digital output constituting a timing reference; B) converting the input analog signal to a first time-interleaved (TI) digital output at a second sampling rate in response to a second clock signal having a second frequency, wherein the second frequency of the second clock signal is less than the first frequency of the first clock signal; C) making a first comparison of the coarse digital output constituting the timing reference and the first TI digital output; and D) variably adjusting the second clock signal in time with respect to the first clock signal, based at least in part on C), so as to substantially align the second clock signal and the first clock signal and thereby significantly reduce a first timing-skew error between the coarse digital output and the first TI digital output.

Another embodiment is directed to an analog-to-digital converter (ADC) apparatus (100), comprising: a flash ADC channel (104, 110) to sample an input analog signal (102) according to a first clock signal (106) having a first frequency, the flash ADC channel comprising: a first sampling switch (104) to receive the first clock signal (106) and to sample the input analog signal (102) at a first sampling rate corresponding to the first frequency of the first clock signal so as to provide a first sampled input signal (108); a flash ADC (110) coupled to the first sampling switch to receive the first sampled input signal and to provide a flash digital output (112) corresponding to the first sampled input signal, the flash digital output constituting a timing reference for the ADC apparatus; a plurality of time-interleaved (TI) successive-approximation-register (SAR) ADC channels (114, 120) to respectively sample the input analog signal, each of the TI SAR ADC channels controlled by a corresponding TI clock signal ($116_1, 116_2 \ldots 116_n$) to sample the input analog signal, the plurality of TI SAR ADC channels comprising: a plurality of additional sampling switches (114) comprising at least a second sampling switch ($114_1$) to receive a second clock signal ($116_1$) and to sample the input analog signal at a second sampling rate corresponding to a second frequency of the second clock signal, so as to provide a second sampled input signal ($118_1$), wherein the second frequency of the second clock signal is less than the first frequency of the first clock signal; a plurality of TI SAR ADCs (120) respectively coupled to the plurality of additional sampling switches, the plurality of TI SAR ADCs comprising at least a first TI SAR ADC ($120_1$) coupled to the second sampling switch to receive the second sampled input signal and coupled to the flash ADC so as to receive the flash digital output, to provide a first TI digital output ($122_1$) corresponding to the second sampled input signal and the flash digital output, wherein: the first TI ADC digital output includes a plurality of most significant bits (MSBs) and a plurality of least significant bits (LSBs); and the plurality of MSBs of the TI ADC digital output are based on the flash digital output; a timing-skew controller (124) coupled to the flash ADC channel and the plurality of TI SAR ADC channels to calculate a first variance of at least a portion of the first TI digital output provided by the first TI SAR ADC, based at least in part on the flash digital output constituting the timing reference, and thereby generate at least one first delay control signal ($126_1$); and a clock generator controller (128), coupled to at least the timing-skew controller, to receive the at least one delay control signal from the timing-skew controller and a master clock signal (130), generate the first clock signal and the second clock signal based at least in part on the master clock signal, and variably adjust the second clock signal in time, with respect to the first clock signal, based on the at least one delay control signal, so as to facilitate background timing-skew calibration of the ADC apparatus without interrupting normal operation of the ADC apparatus.

Another embodiment is directed to an analog-to-digital converter (ADC) apparatus (100), comprising: a plurality of time-interleaved (TI) ADC channels ($109_1$-$109_n$) to respectively sample an input analog signal (102), each of the TI ADC channels controlled by a corresponding TI clock signal ($116_1, 116_2 \ldots 116_n$) to sample the input analog signal; and a timing-skew controller (124) coupled to the plurality of TI ADC channels to variably control a delay of at least one corresponding TI clock signal so as to facilitate background timing-skew calibration of the ADC apparatus without interrupting normal operation of the ADC apparatus, wherein the ADC apparatus does not include a separate TI ADC channel of the plurality of TI ADC channels as a timing reference channel to facilitate the background timing-skew calibration.

Another embodiment is directed to an analog-to-digital converter (ADC) apparatus (100), comprising: a coarse ADC channel (107) to sample an input analog signal (102) according to a first clock signal (106) having a first frequency, the coarse ADC channel providing a coarse digital output (112) corresponding to the sampled input analog signal at the first frequency and constituting a timing reference for the ADC apparatus; and a plurality of time-interleaved (TI) ADC channels ($109_1$-$109_n$) to respectively sample the input analog signal, each of the TI ADC channels controlled by a corresponding TI clock signal ($116_1, 116_2 \ldots 116_n$) to sample the input analog signal, each corresponding TI clock signal having a TI clock signal frequency that is lower than the first frequency of the first clock signal, wherein: a delay of at least one corresponding TI clock signal is variably controlled based at least in part on the coarse digital output constituting the timing reference for the ADC apparatus so as to facilitate background timing-skew calibration of the ADC apparatus without interrupting normal operation of the ADC apparatus; and the ADC apparatus does not include a separate timing reference TI ADC channel to facilitate the background timing-skew calibration.

Another embodiment is directed to a method for converting an input analog signal to a digital output, the method comprising: A) sampling an input analog signal (102) according to a first clock signal (106) having a first frequency to provide a coarse digital output (112) corresponding to the sampled input analog signal at the first frequency and constituting a timing reference for the ADC apparatus; B) respectively sampling the input analog signal via a plurality of time-interleaved (TI) channels according to a plurality of corresponding TI clock signals ($116_1, 116_2 \ldots 116_n$), each corresponding TI clock signal having a TI clock signal frequency that is lower than the first frequency of the first clock signal; and C) variably controlling a delay of at least one corresponding TI clock signal based at least in part on the coarse digital output constituting the timing reference for the ADC apparatus so as to facilitate background timing-skew calibration of the ADC apparatus without interrupting normal operation of the ADC apparatus, wherein the plurality of TI channels does not include a separate timing reference TI channel to facilitate the background timing-skew calibration.

The following publication is hereby incorporated herein by reference: "A 1 GS/s 10b 18.9 mW Time-Interleaved SAR ADC With Background Timing Skew Calibration," Sunghyuk Lee, Anantha P. Chandrakasan, and Hae-Seung Lee, IEEE Journal of Solid-State Circuits, Vol. 49, No. 12, December 2014.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Following below are more detailed descriptions of various concepts related to, and embodiments of, inventive methods and apparatus for reducing timing-skew errors in time-interleaved analog-to-digital converters. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

I. Overview

In various embodiments discussed in detail further below, a time-interleaved (TI) analog-to-digital converter (ADC) architecture employs a low resolution coarse ADC channel that samples an input analog signal at a relatively high or "full" sampling rate (e.g., a Nyquist rate based on the input analog signal of interest) and facilitates background calibration of timing-skew error without interrupting normal operation to sample/convert the input signal. The coarse ADC channel provides a timing reference for multiple higher resolution TI ADC channels that respectively sample the input signal at a lower sampling rate. The coarse ADC digital output is compared to respective TI ADC digital outputs to variably adjust in time corresponding sampling clocks of the TI ADC channels so as to substantially align them with the sampling clock of the coarse ADC channel, thus reducing timing-skew error. In some implementations, the coarse ADC output provides the most significant bits (MSBs) of the respective TI ADC digital outputs to further improve conversion speed and reduce power consumption in these channels. In some particular examples discussed in detail below, the coarse ADC is constituted by a flash ADC, and the TI ADC channels include subranging ADCs which inherently implement a subtraction process to facilitate mitigation of timing-skew error.

The strategic use of a coarse ADC channel in a TI ADC architecture according to various inventive embodiments disclosed herein provides multiple benefits including, but not limited to, a significant reduction in timing-skew error, improved conversion speed, and reduced power consumption as compared to conventional TI ADC architectures. These benefits are accomplished without sacrificing any signal bandwidth (e.g., the TI ADC architecture operates up to the full Nyquist rate of an input analog signal of interest) and without requiring any dedicated TI ADC channels to facilitate background calibration to reduce timing-skew error.

Figure 6:
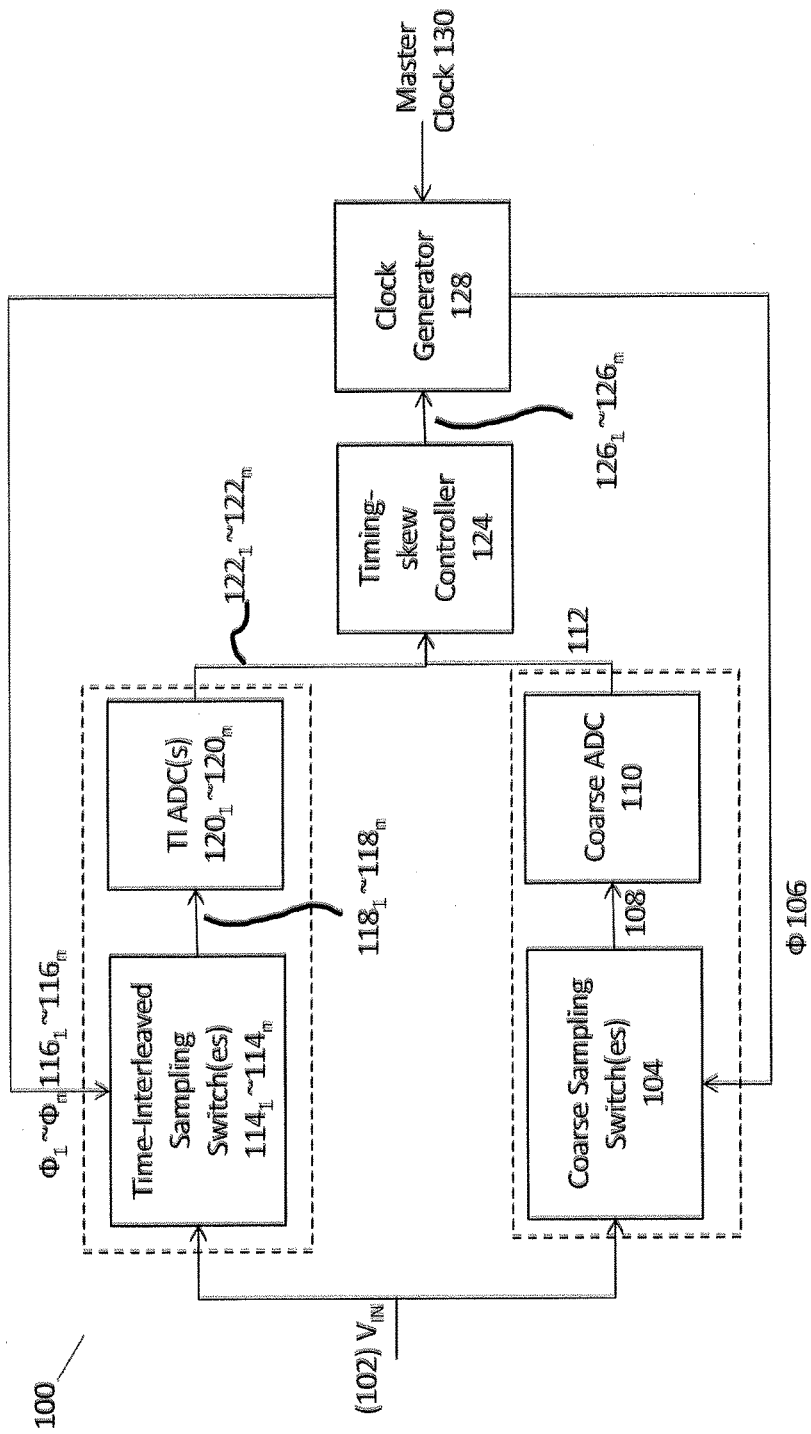
FIG. 6 is a block diagram of an analog-to-digital converter (ADC) apparatus, based on a TI ADC architecture, in which timing-skew error is significantly reduced, according to one embodiment of the present invention.

FIG. 6 illustrates a block diagram of an analog-to-digital converter (ADC) apparatus 100, based on a TI ADC architecture, in which timing-skew error is significantly reduced, according to one embodiment. As shown in FIG. 6, the ADC apparatus 100 comprises a coarse ADC channel 107 to sample an input analog signal 102 according to a first clock signal 106 having a first frequency. The coarse ADC channel provides a coarse digital output 112 corresponding to the sampled input analog signal at the first frequency, and this coarse digital output also serves as a timing reference for the ADC apparatus, as discussed in greater detail below. The ADC apparatus 100 further comprises a plurality of time-interleaved (TI) ADC channels $109_1$-$109_n$ to respectively sample the input analog signal. Each of the TI ADC channels is controlled by a corresponding TI clock signal $116_1$-$116_n$ to sample the input analog signal, wherein each corresponding TI clock signal has a TI clock signal frequency that is lower than the first frequency of the first clock signal. In one exemplary implementation, a delay of at least one corresponding TI clock signal is variably controlled, based at least in part on the coarse digital output constituting the timing reference for the ADC apparatus, so as to facilitate background timing-skew calibration of the ADC apparatus without interrupting normal operation of the ADC apparatus. In one aspect, the ADC apparatus does not include a separate timing reference TI ADC channel to facilitate the background timing-skew calibration. In other aspects discussed below, the coarse ADC channel may include a flash ADC, and the TI ADC channels may include subranging TI ADCs.

More specifically, as shown in FIG. 6, an input signal 102 is coupled to multiple TI ADC channels $109_1$-$109_n$ and a coarse ADC channel 107. In one embodiment, the respective TI ADC channels sample the input signal 102 via a plurality of TI sampling switches $114_1$-$114_n$, controlled by corresponding sampling TI clock signals $116_1$-$116_n$ ($\phi_1$-$\phi_n$). The sampled input signals $118_1$-$118_n$ are applied to corresponding TI ADCs $120_1$-$120_n$ and converted to TI digital outputs $122_1$-$122_n$. The input signal 102 is also coupled to a coarse sampling switch 104, which samples the input signal 102 in response to clock signal 106 at a "full" sampling rate (e.g., a Nyquist rate based on the input signal of interest). The sampled analog output 108 is coupled to the coarse ADC 110 and converted to a coarse ADC digital output 112.

As the coarse ADC channel is operated at a full sampling rate, no timing-skew exists for the coarse ADC operation; thus, the coarse ADC output 112 can be used as a timing reference to align the clock signals for the TI ADC channels. To this end, a timing-skew controller 124 compares the coarse digital output 112 of the coarse ADC channel with the TI digital outputs $122_1$-$122_n$ of the TI ADC channels, and generates control signals $126_1$-$126_n$ that are coupled to a clock generator controller 128. The clock generator controller 128 generates the coarse ADC clock signal 106 and the TI clock signals $116_1$-$116_n$ based on a master clock signal 130 and the control signals $126_1$-$126_n$ from the timing-skew controller 124. In one implementation, the timing-skew controller 124 generates the control signals $126_1$-$126_n$ so as to variably adjust in time one or more of the TI clock signals $116_1$-$116_n$ with respect to the coarse ADC clock signal 106 so as to substantially align respective ones of the TI clock signals and the coarse ADC clock signal, thereby significantly reducing timing-skew errors in the apparatus 100.

Figure 7:
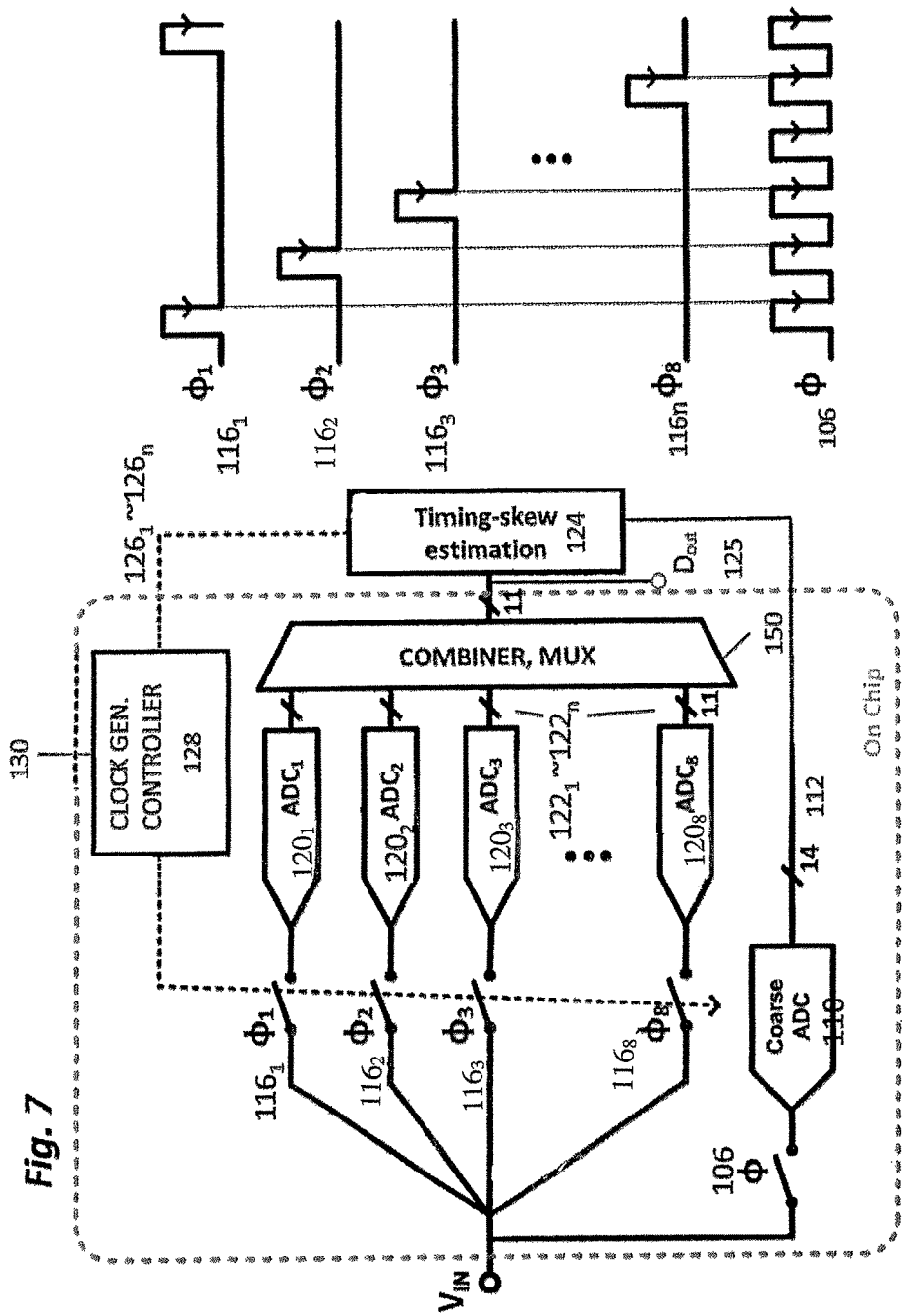
FIG. 7 is a block diagram showing additional details of the apparatus of FIG. 7, according to one embodiment of the present invention.

FIG. 7 shows a more expansive block diagram of the apparatus illustrated in FIG. 6 according to one embodiment, in which respective TI ADC channels and timing waveforms for clock signals $116_1$-$116_n$ and 106 are specifically depicted. In the embodiment of FIG. 7, a multiplexer 150 is employed to multiplex the TI digital outputs $122_1$-$122_n$ from the respective TI ADC channels to generate a multiplexed output $D_{out}$ 125 with TI segments equivalent to $122_1$-$122_n$, and $D_{out}$ 125 is passed to the timing-skew controller 124 for comparison with a corresponding coarse digital output of the coarse ADC. In some implementations as discussed in greater detail below, the computation for timing-skew estimation can be performed off-chip by the timing skew controller 124 (as indicated by the dashed lines surrounding the coarse ADC channel, the TI ADC channels, the clock generator circuit, and the multiplexer), while in other implementations timing-skew controller 124 may be integrated with the other components of the ADC apparatus on a same chip.

Figure 8:
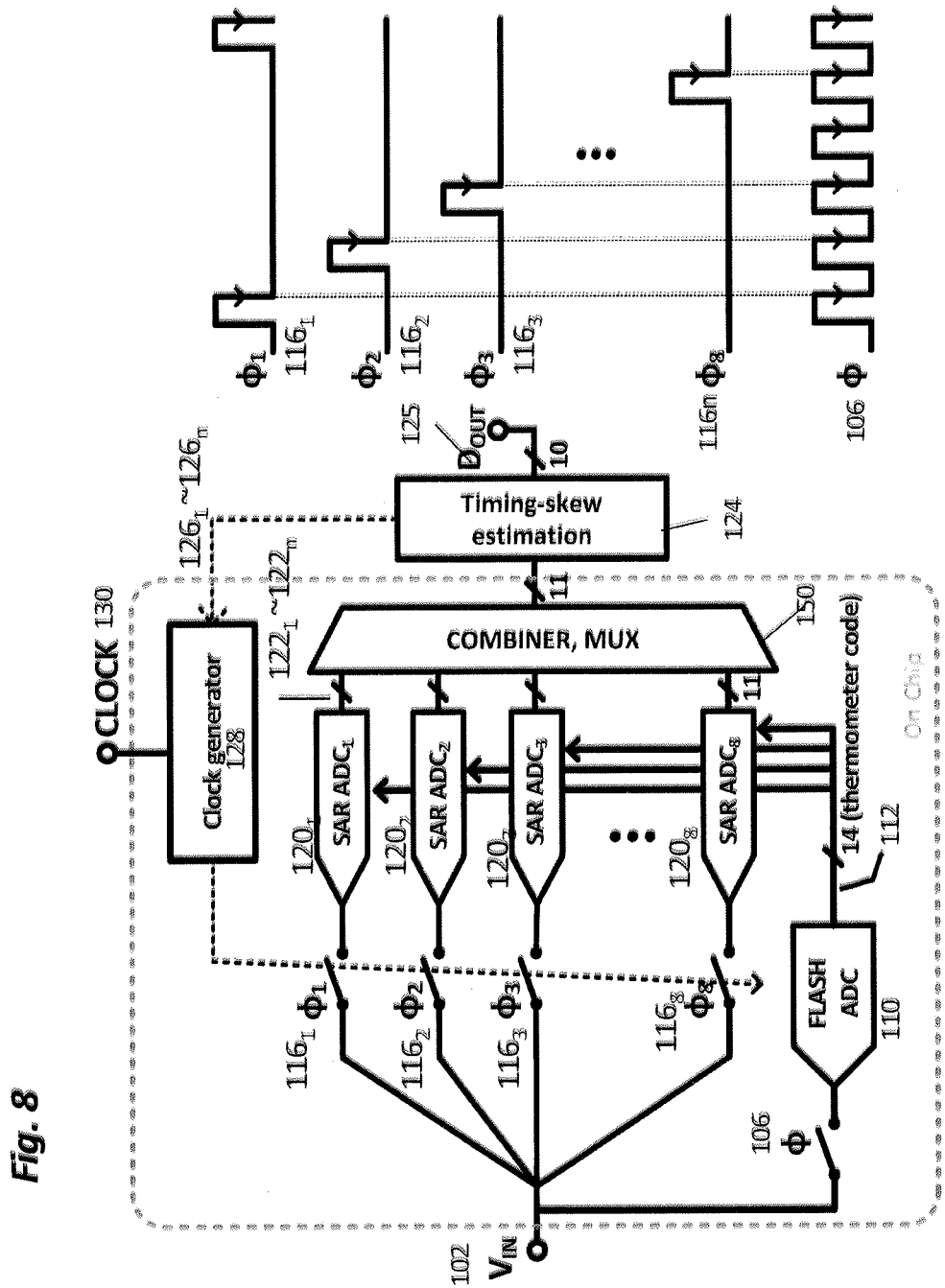
FIG. 8 is a block diagram showing additional details of the apparatus of FIG. 7 according to another embodiment of the present invention.

FIG. 8 shows the block diagram of another embodiment in which the TI ADCs $120_1$-$120n$ are implemented as sub-ranging successive-approximation-register (SAR ADCs), and the coarse ADC 110 is a flash ADC having an output that is connected to each of the TI SAR ADCs. More specifically, the digital output 112 of the flash ADC 110 provides the most significant bits (MSBs) of each TI SAR ADC at the full clock speed, i.e., the first frequency of the first clock signal 106 ($\phi$). In this way, the flash ADC output 112 is used as a coarse estimation of SAR conversion. Because the flash ADC 110 does not suffer from timing-skew, the flash ADC output 112 is also used as a timing reference. SAR ADCs $120_1$-$120_n$ resolve LSBs at the divided clock speed ($\phi_1$-$\phi_8$). The timing-skew controller 124 controls the clock generator controller 128 to correct the timing-skew error by substantially aligning the sampling clocks $116_1$-$116_n$ ($\phi_1$-$\phi_8$) of SAR ADCs $120_1$-$120_n$ to the sampling clock 106 ($\phi$) of the flash ADC 110.

In some instances, the timing-skew controller 124 may generate a signal for correction of the timing-skew error in the digital domain by for example, digital interpolation filters, fractional delay filters, and Taylor series approximations instead of aligning the sampling clocks $116_1$-$116_n$ ($\phi_1$-$\phi_8$) of SAR ADCs $120_1$-$120_n$ to the sampling clock 106 ($\phi$) of the flash ADC 110.

In some instances, the resolution of the flash ADC 110 can be chosen for practical reasons. The flash ADC resolution affects the calibration time. With higher resolution, flash ADC outputs 112 provide more accurate timing information with lower quantization error. Thus, timing skew information can be extracted with fewer samples. However, the resolution of the flash ADC 110 affects overall power consumption of the ADC. Power consumption of the flash ADC 110 increases exponentially with its resolution. Although higher resolution flash ADC reduces the number of successive approximation cycles and the power consumption of the SAR ADC, the savings may be marginal. Given the discussed factors, in one example, 4 bit flash resolution can be chosen, and the remaining 7 bits including 1 bit redundancy are allocated in the SAR conversion.

Figure 1:
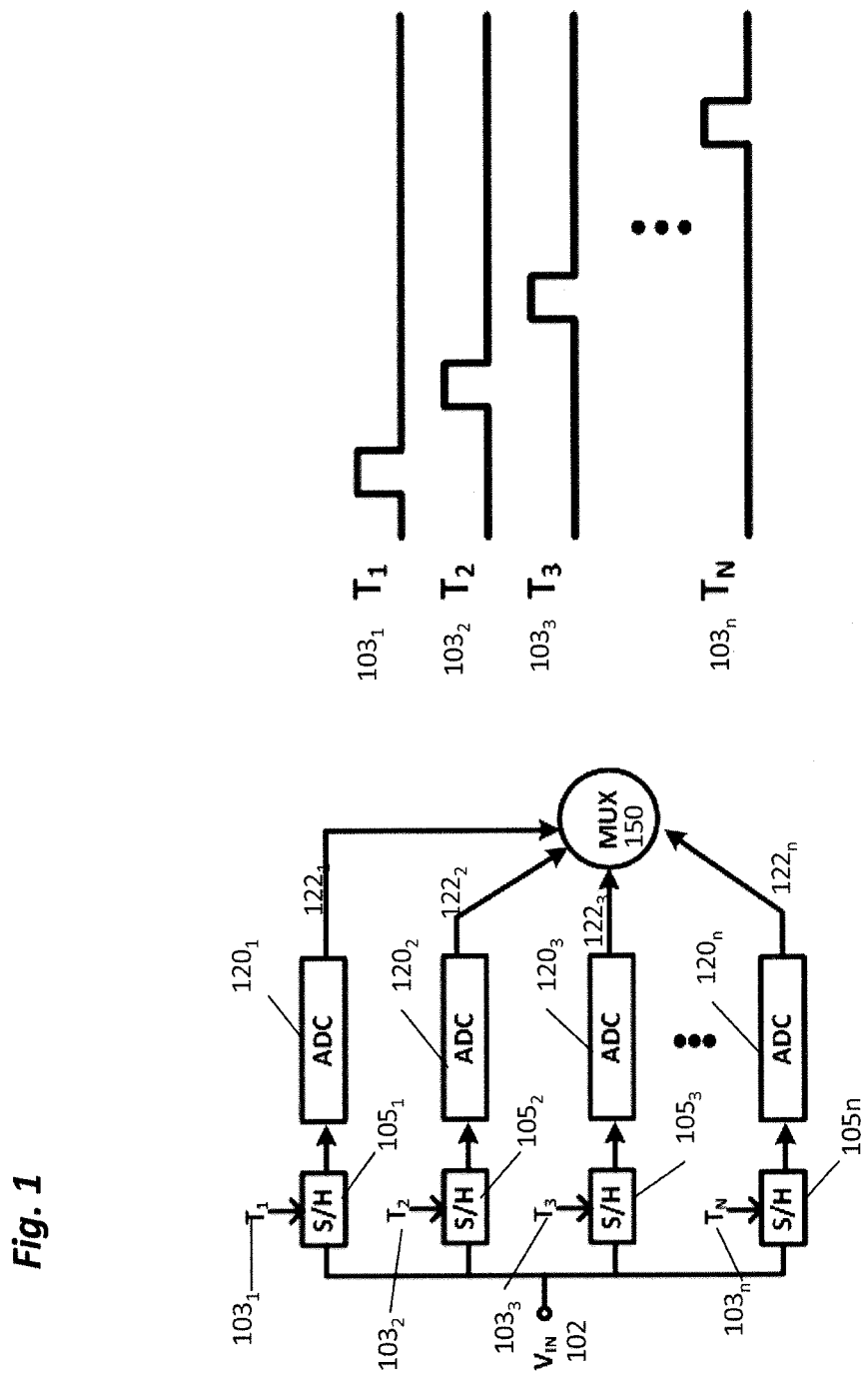
FIG. 1 is a block diagram of a conventional TI ADC architecture and multiple clock signals for sampling an input signal.
Figure 2:
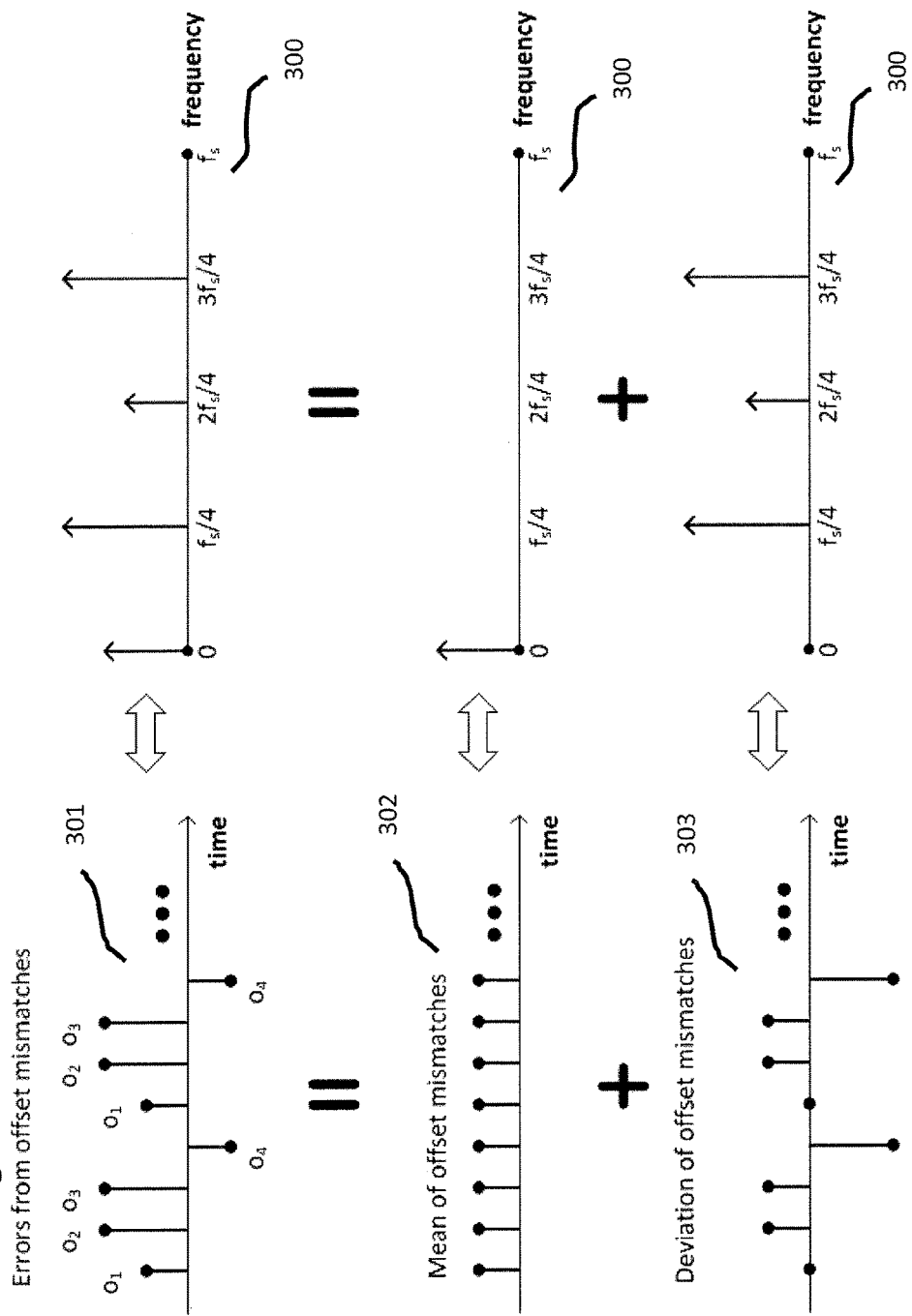
FIG. 2 illustrates the concept of offset error in a four channel TI ADC based on the architecture of FIG. 1.
Figure 3:
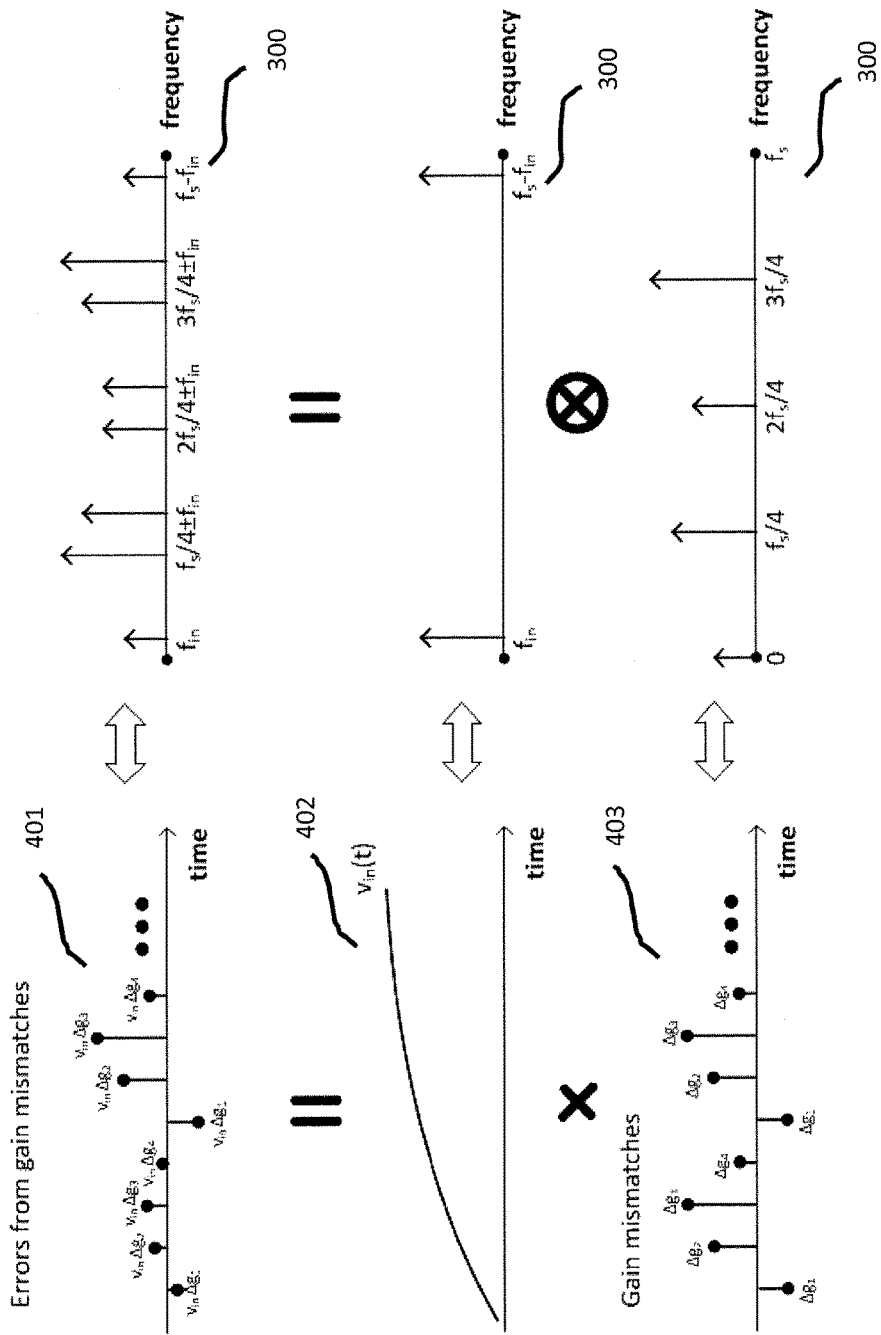
FIG. 3 illustrates the concept of gain error in a four channel TI ADC based on the architecture of FIG. 1.
Figure 4:
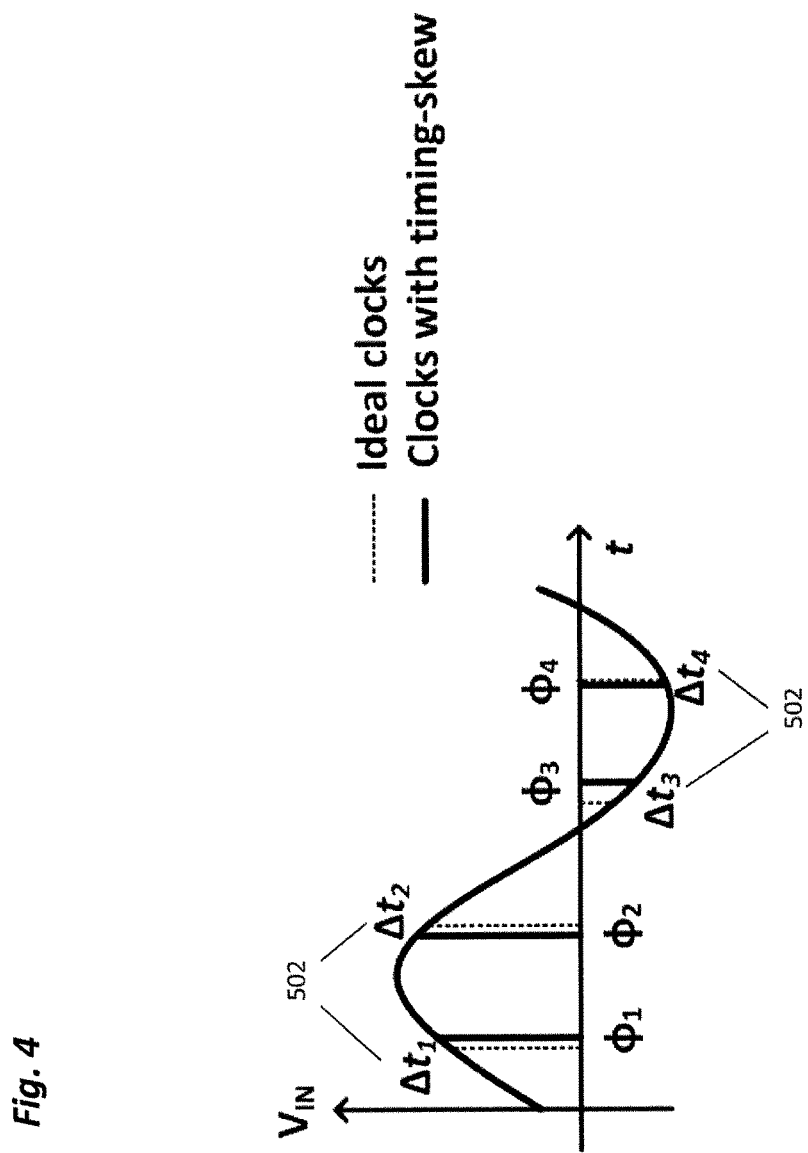
FIG. 4 illustrates the concept of timing-skew error in the architecture of FIG. 1.
Figure 5:
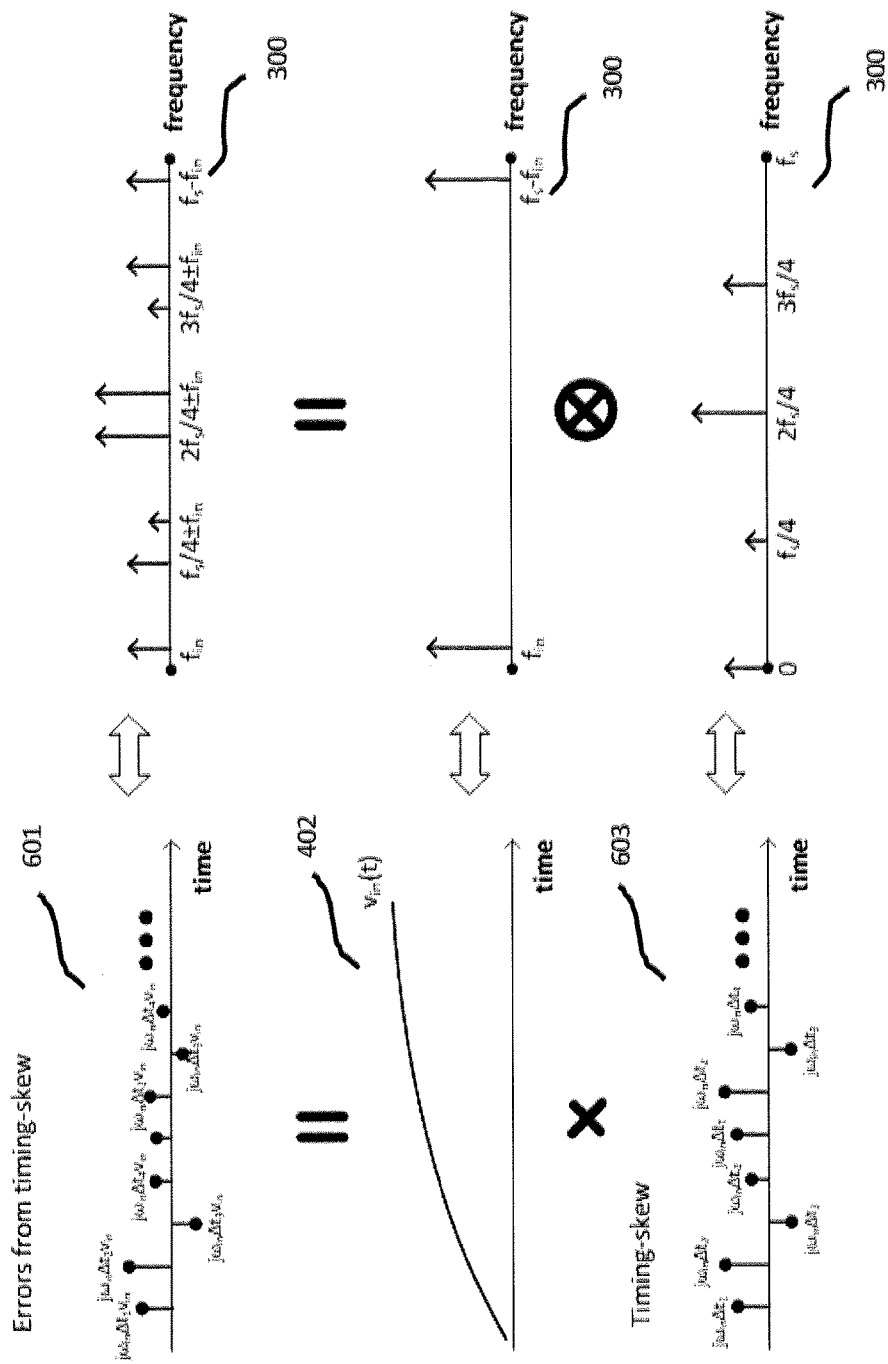
FIG. 5 illustrates an example of timing-skew error in a four channel TI ADC based on the architecture of FIG. 1.
Figure 9:
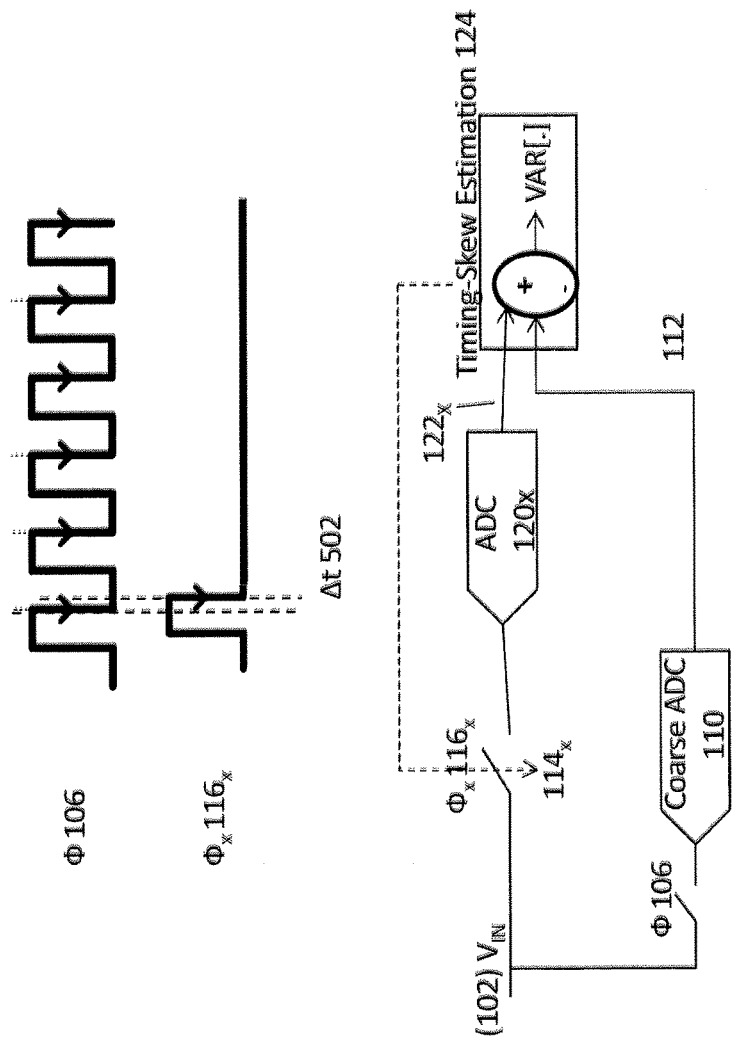
FIGS. 9-10 are block diagrams illustrating details of respective channels of the apparatus shown in FIGS. 7 through 9, according to embodiment of the present invention.

FIG. 9 shows another illustrative diagram of a single TI ADC channel of the apparatus 100, channel TI ADC 120x with variable delay to reduce timing-skew. As shown in FIG. 9, when the timing signal $\phi x$ 116x is not aligned with the timing signal of the coarse ADC $\phi$ 106, e.g., the falling edges of the two signals have a gap $\Delta t$ 502 (as also illustrated in FIG. 4), a timing-skew can be estimated at the timing-skew estimation block 124, e.g., by calculating a variance of the difference between the output of the ADC 120x and the output of the coarse ADC 110. The output of 124 can generate a variable delay to the sampling switch 114x to adjust the timing-skew based on the calculated variance. Methods of timing-skew estimation are further discussed in Part IV of this application.

Figure 10:
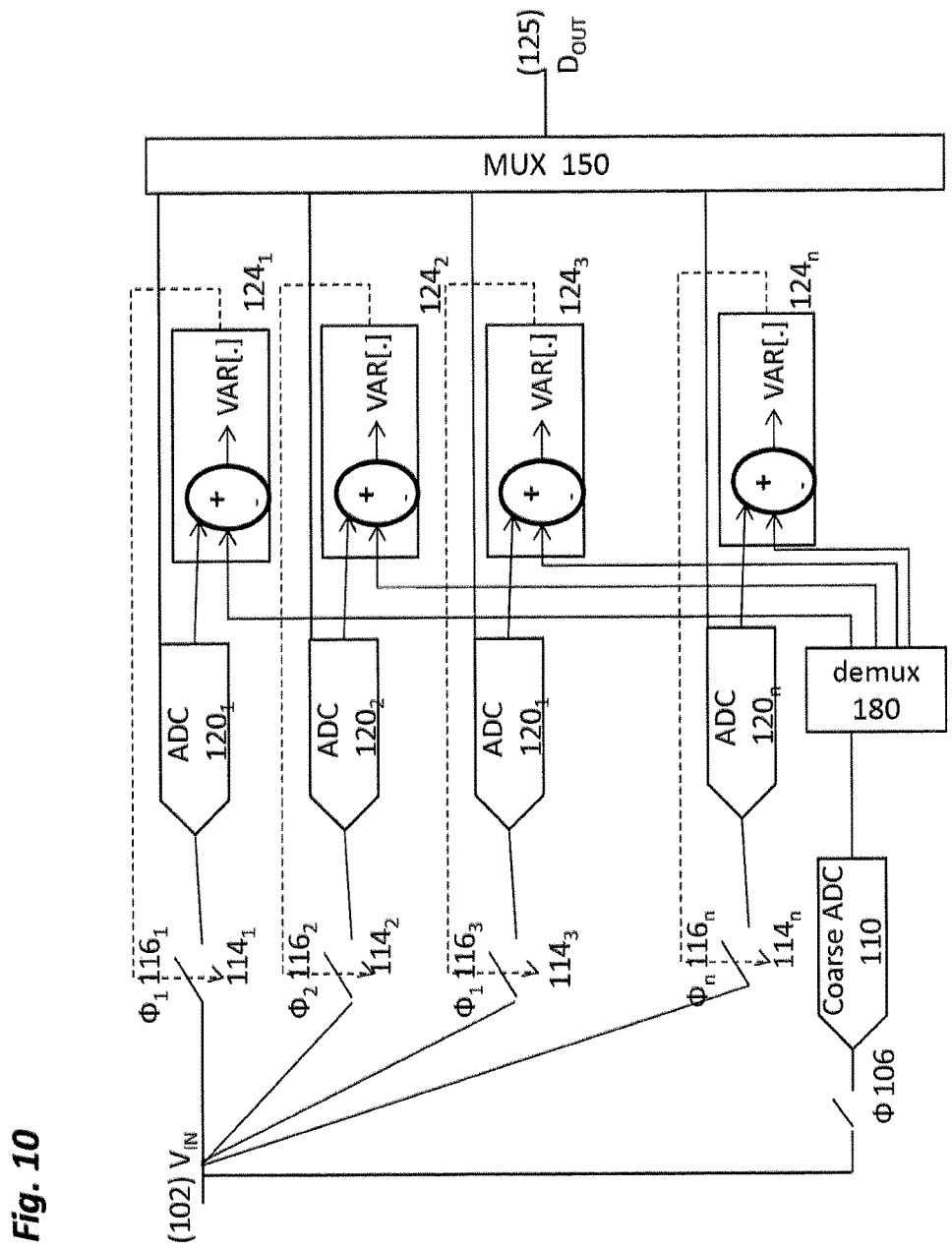

FIG. 10 shows an illustrative diagram of an apparatus according to another embodiment of the invention, in which the function of the timing-skew controller 124 may be distributed to each of multiple TI ADC channels (including TI ADCs $120_1$-$120_n$). As shown in FIG. 10, similar to the single channel TI ADC example in FIG. 9, each TI ADC $120_1$-$120_n$ is connected to a timing-skew estimation $124_1$-$124_n$ to calculate the timing-skew variance of the TI ADC channel. The output of the coarse ADC can be demultiplexed at 180 to be fed into each timing-skew estimation block $124_1$-$124_n$ so that the output of the coarse ADC is compared with the output of each channel for timing-skew estimation. Similar to that in FIG. 9, a variable delay is applied to the sampling switch $114_1$-$114_n$ of each TI ADC channel to reduce timing-skew based on the calculated variance. Methods of timing-skew estimation are further discussed in Part IV of this application.

II. Circuit Implementations

A. Clock Generator Controller

Figure 11:
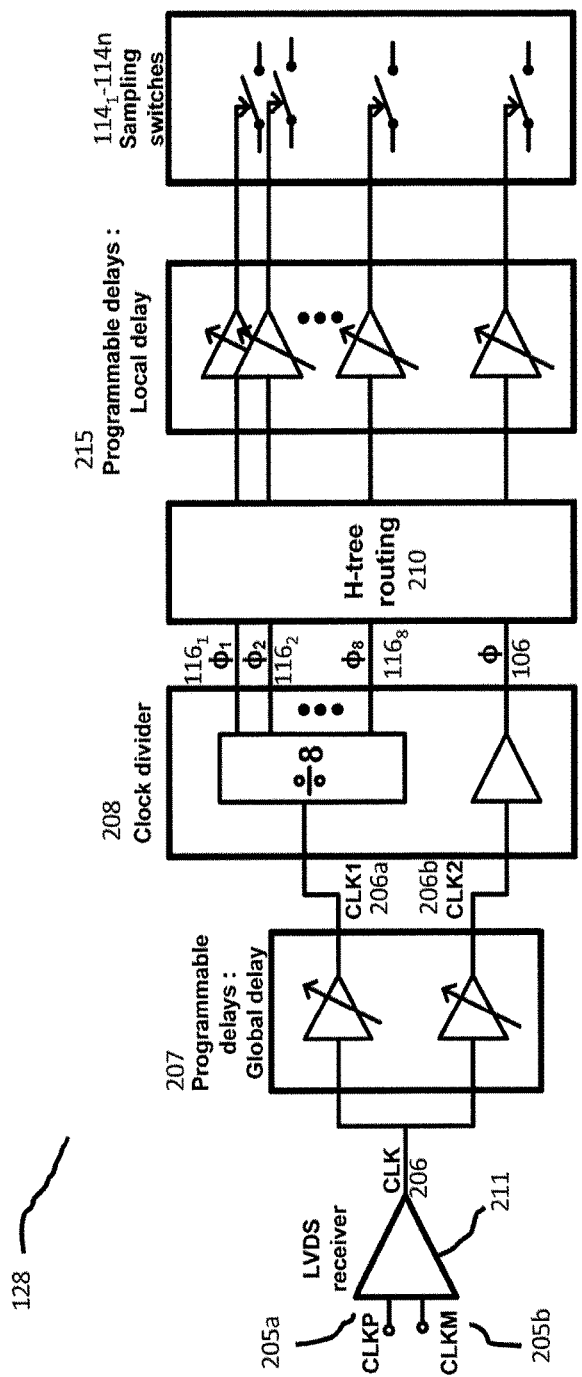
FIG. 11 is a block diagram illustrating a clock generator controller for the apparatus of FIGS. 6 through 8, according to one embodiment of the present invention.

FIG. 11 shows an example block diagram of the clock generator controller 128 in one implementation. A low-voltage differential signal (LVDS) clock 205a-b is provided externally and converted to a single-ended signal 206 via a LVDS receiver 211 on-chip. Global delay block shown in FIG. 11 corrects the average mismatch between the flash clock ($\phi$) 106 and SAR clocks ($\phi_1$-$\phi_8$) $116_1$-$116_n$. Since they are located before the clock divider 208, the global delay block 207 affects all SAR clocks $116_1$-$116_n$ equally. Thus, they do not change timing-skew among SAR clocks $116_1$-$116_n$. A clock divider 208 is used to generate the divided clocks from the globally delayed clock 206a for the interleaved SAR channels, $\phi_1$-$\phi_8$ $116_1$-$116_n$ in FIG. 11; and the globally delayed clock 206b is provided as the clock 106 to be supplied to a flash ADC. To minimize the systematic mismatches in the clock path, H-tree structure 210 is used to route clocks. Local delay block 215 shown in FIG. 11 adjusts the timing of divided SAR clocks ($\phi_1$-$\phi_8$) $116_1$-$116_n$ separately to correct timing-skew among the SAR ADCs $120_1$-$120_n$.

Figure 12:
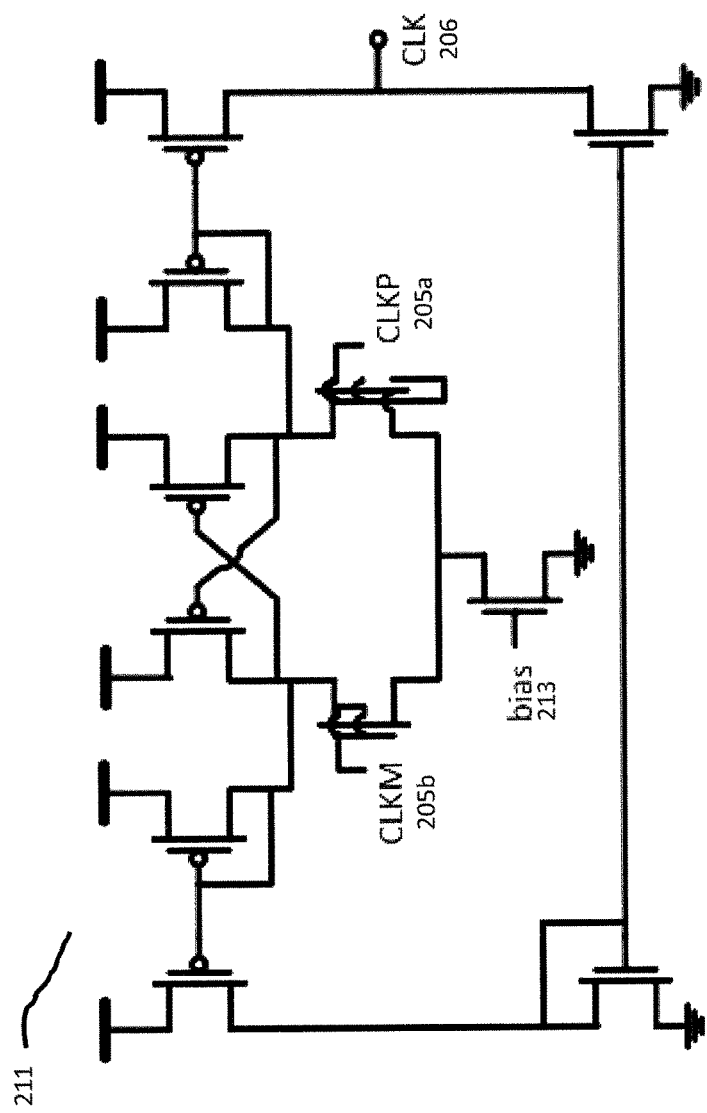
FIG. 12 provides a block diagram illustrating circuit implementation of an LVDS clock receiver for the clock generator controller of FIG. 12.

FIG. 12 shows an example of a schematic structure of the LVDS clock receiver 211 that converts the differential signal inputs 205a-b to a signal 206. The differential structure improves supply noise rejection and input common-mode signal rejection. The cross-coupled PMOS load provides weak positive feedback which increases the differential gain and transition speed. The bias voltage 213 of the tail current source is generated on-chip using a current mirror.

Figure 13:
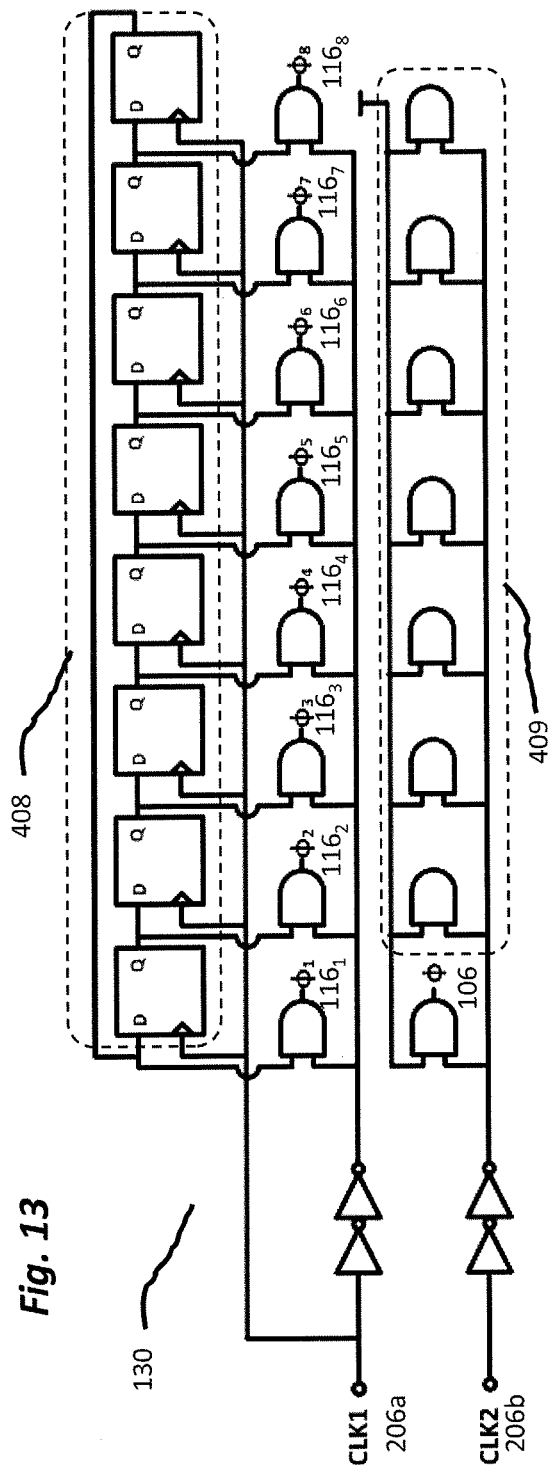
FIG. 13 provides a logic design circuit diagram of a clock generator for the clock generator controller of FIG. 11.

FIG. 13 shows the schematic of the clock generator 128. A chain of eight D flip-flops 408 is used to divide the high frequency clock 206a. A power on reset signal is connected to the SET and RESET of the D flip-flops to initialize the divider, which is not shown in the figure for simplicity. To minimize the systematic mismatch between the flash clock ($\phi$) 106 and SAR clock ($\phi_X$) $116_1$-$116_n$, several dummy logic gates 409 are added for the flash clock path.

Figure 14:
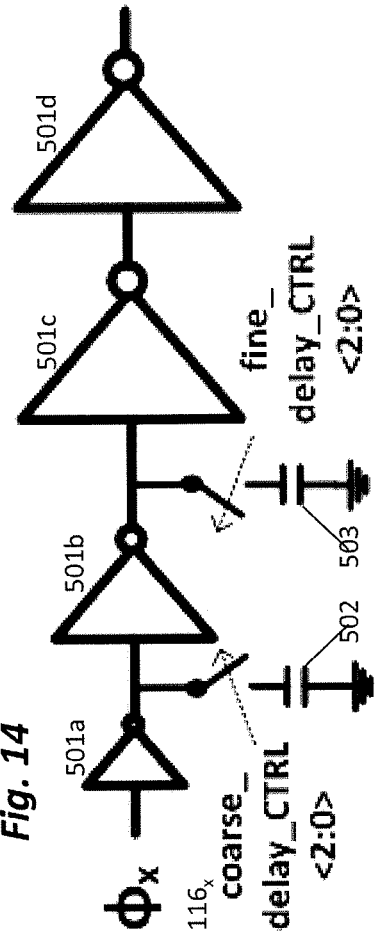
FIG. 14 provides a schematic diagram of a programmable delay block for the clock generator controller of FIG. 11.

The schematic of the programmable delay block is shown in FIG. 14. It is composed of four inverters 501a-d with different sizes. A capacitor bank (including 502,503) with switches is placed between the inverters to control the delay. Each capacitor bank has seven minimum size MOS-capacitors which are controlled by 3 bit binary code. Capacitors 502 at the output of a small inverter control the coarse delay and capacitors 503 at the output of a large inverter control the fine delay. The last two inverters 501c-d are added to recover the sharpness of the transition edge. The coarse and fine delays are designed to have 2 ps and 0.8 ps delay steps, respectively. After timing-skew calibration in 0.8 ps fine delay steps, the maximum timing-skew is 0.4 ps and the variance of the timing-skew is about 0.28 ps, which is within the requirement from Equation (6).

B. Flash ADC

Figure 15:
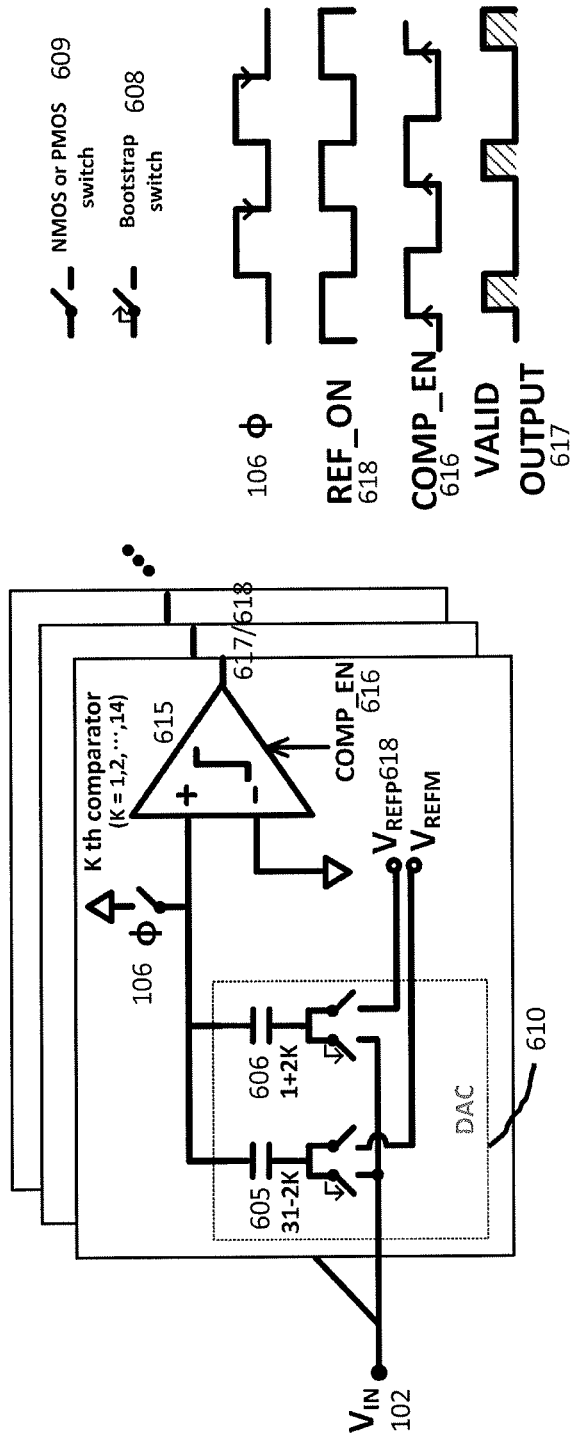
FIG. 15 provides a block diagram illustrating circuit implementation of flash ADC serving as the coarse ADC, according to one embodiment of the present invention.

FIG. 15 shows the implementation of a 4-bit flash ADC 110 with the timing waveforms (the valid output signal 616 (as part of the output used as reference 618) and comparator enabling signal 617). Each comparator 615 samples the input signal 102 with a bottom plate switch on two capacitors 605-606 with different sizes, which are then switched to the reference voltages. When the reference voltages settle, comparators are enabled. Although a single-ended version is shown for simplicity, a differential structure can be implemented for the flash ADC.

In another example, bootstrap switches 608 can be used for input tracking to minimize the variation of on-resistance over a wide range of input voltages. NMOS or PMOS switches 609 are used for the bottom plate sampling and the reference switches, because they always connect to the same voltage.

The two sampling capacitors 605-606 are sized to generate digital-to-analog converter (DAC) 610 voltages which are the threshold of the flash ADC 110. For the kth comparator, the two capacitors $C_1=0.5+k$ and $C_2=DAC_k=V_{REFP}C_1/(C_1+C_2)_+$. $V_{REFM}C_2/(C_1+C_2)=15.5-k$. The reason for having a non-integer capacitor size is that the threshold voltage of the flash ADC 110 should be shifted by 0.5 $LSB_{flash}$ to have a symmetrical redundancy between flash 110 and SAR ADCs $120_1$-$120_n$. In one implementation, to avoid non-integer size of capacitors, capacitors 605-606 are increased by two times while keeping the relative ratio, $C_1=31-2k$ and $C_2=1+2k$. A custom designed unit capacitor may be used, which is described in FIG. 21.

In a further implementation, a dynamic latch can be used for the comparators 605-606 in the flash ADC. Due to the redundancy in SAR ADCs, offsets of the comparators are not corrected as long as they are in the correction range which is $\pm0.5LSB_{FLASH}=\pm32LSB_{SAR}\pm62.5$ mV. Simulations based on the device mismatches show the $\sigma$ of the comparator offset is about 5.2 mV, thus the comparator has enough margin for offset.

The flash ADC 110 described herein has several advantages over a conventional flash ADC that compares the input directly with a reference voltage. First, a rail-to-rail input range is enabled. Because most flash comparators have limited common-mode range, a rail-to-rail input signal cannot be utilized. Second, it allows a true fully differential implementation. Although conventional flash comparators with two differential input pairs is topologically fully-differential, when input or reference voltages are large, one of the differential pairs dominates leading to effectively single-ended comparison. This causes errors when common-mode level is not stabilized and suffers from lower power supply rejection ratio (PSRR). Also, the lack of resistor ladders in the sampling flash comparator makes this flash ADC power efficient. Finally, because it is a scaled version of a SAR ADC, the SAR and flash sampling clocks are closely matched, which is crucial for the proposed TI ADC because the sampling clocks of SAR ADCs must be aligned as closely to the sampling clock of the flash ADC as possible to minimize the timing skew correction range.

C. SAR ADC

SAR ADCs are widely used due to their highly digital operation and power efficiency. However, designing a high-performance SAR ADC can be challenging. Example implementations to improve the performance of SAR ADCs include switching schemes for low power operation, calibration algorithms for capacitor mismatches, high speed SAR design, and comparator noise reduction. Although a conventional SAR ADC is illustrated in this disclosure for the timing-skew calibration of a TI ADC, the above mentioned advanced SAR ADCs are also applicable.

Figure 16:
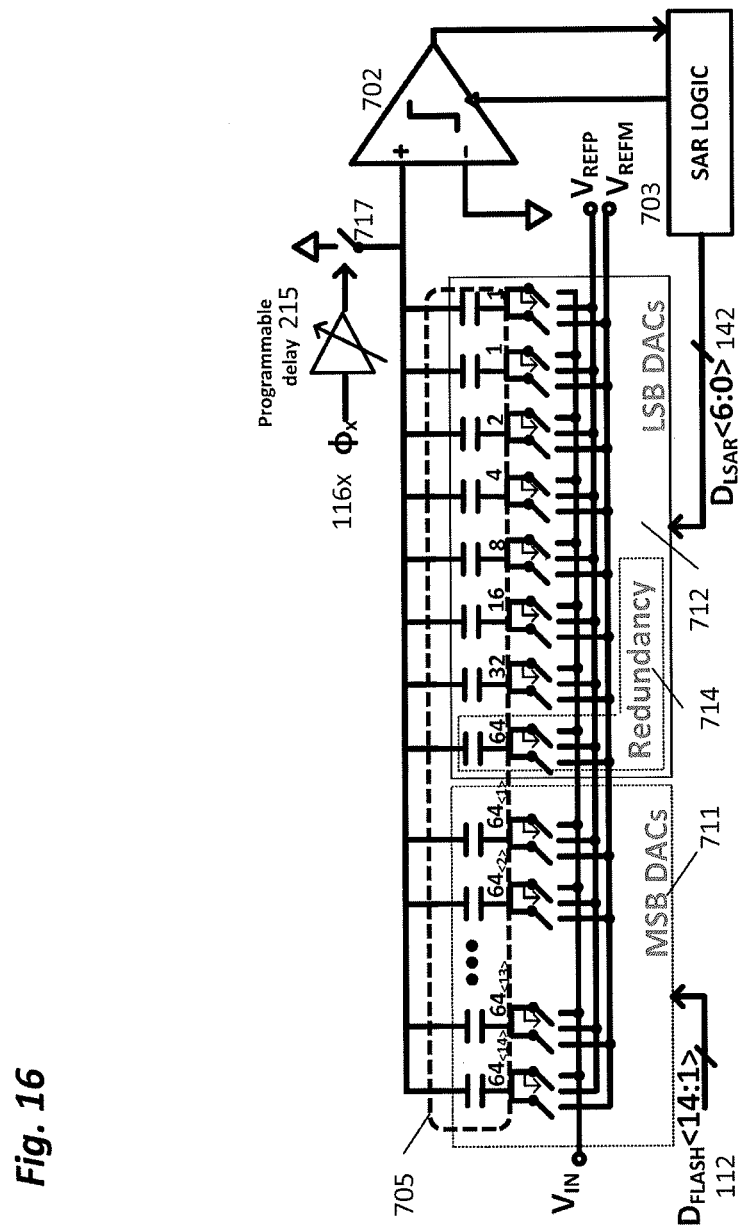
FIG. 16 provides a block diagram illustrating a circuit implementation of 10 bit SAR ADC serving as a TI ADC according to one embodiment of the present invention.

FIG. 16 shows a 10 bit SAR ADC composed of 1024 unit capacitors 705, one comparator 702, and SAR logic 703. Most Significant Bit (MSB) DACs 711 have 14 unary weighted capacitors whose size is 64 and are controlled by the output of the flash ADC. LSB DACs 712 are composed of binary weighted capacitors (size of 1 to 64) and controlled by a SAR logic block 703. 1 bit redundancy 714 between the flash ADC 110 and the SAR ADCs $120_1$-$120_n$ is added to cover the error from the flash ADC 110 and to extract the timing-skew information. The final output of each channel ($D_{CHANNEL}$) (not shown in FIG. 16) is the weighted sum of the flash ADC output 112 ($D_{FLASH}$) and the lower output bits of SAR conversion ($D_{LSAR}$) 142, $D_{CHANNEL}=64*D_{FLASH}+D_{LSAR}$ (here the total number of binary-weighted bits N of the channel output is 10). For the same reason as in the flash ADC, bootstrap switches (e.g., see 608 in FIG. 15) are used for the input tracking and NMOS or PMOS switches (e.g., see 609 in FIG. 15) are used for the bottom plate sampling and the reference switches. A programmable delay block, similar to 215 in FIG. 11, can be placed between the sampling clock $116_x$ and the NMOS bottom plate switches 717 to correct the timing-skew.

Figure 17:
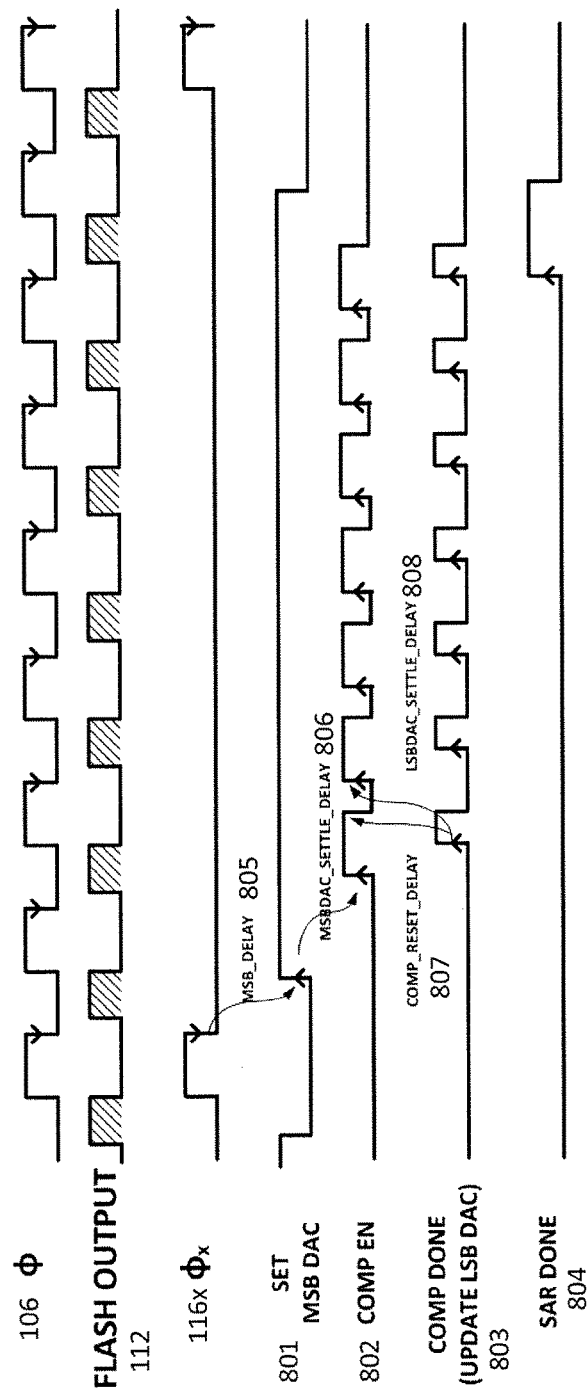
FIG. 17 provides a timing diagram of the SAR ADC of FIG. 16.

The timing diagram of the SAR conversion is shown in FIG. 17, showing the waveforms for the flash ADC clock $\phi$ 106, the flash ADC output 112, SAR ADC clock $\phi_x$, MSB DAC set signal 801, comparator enabling signal 802, comparator-done signal 803, and SAR-done signal 804. To avoid requiring a high frequency clock and to increase SAR conversion speed, asynchronous SAR logic is implemented with programmable delays. The input signal (e.g., 102) is sampled on the capacitor array, at the falling edge of the SAR sampling clock ($\phi_x$) $116_x$, which is ideally synchronized with the sampling clock of the flash ADC($\phi$) 106. MSB_DELAY 805 controls the timing to capture the output of the flash ADC 110. MSBDAC_SETTLE_DELAY 806 provides time for the MSB DAC settling and triggers the comparator. An XOR gate at the output of the differential comparator generates COMP_VALID (the comparator enabling signal 802) and UPDATE_LSBDAC (the comparator-done signal 802) signals when the comparison is done. The UPDATE_LSBDAC signal 802 is used to update the LSB DACs. COMP_RESET_DELAY 807 adjusts reset timing of the comparator and LSBDAC_SETTLE_DELAY 808 provides settling time to the LSB DACs. After the last comparison, SAR_DONE 804 is generated which indicates the completion of the SAR conversion. A digital logic circuit to generate these signals is shown at the end of this section.

Figure 18:
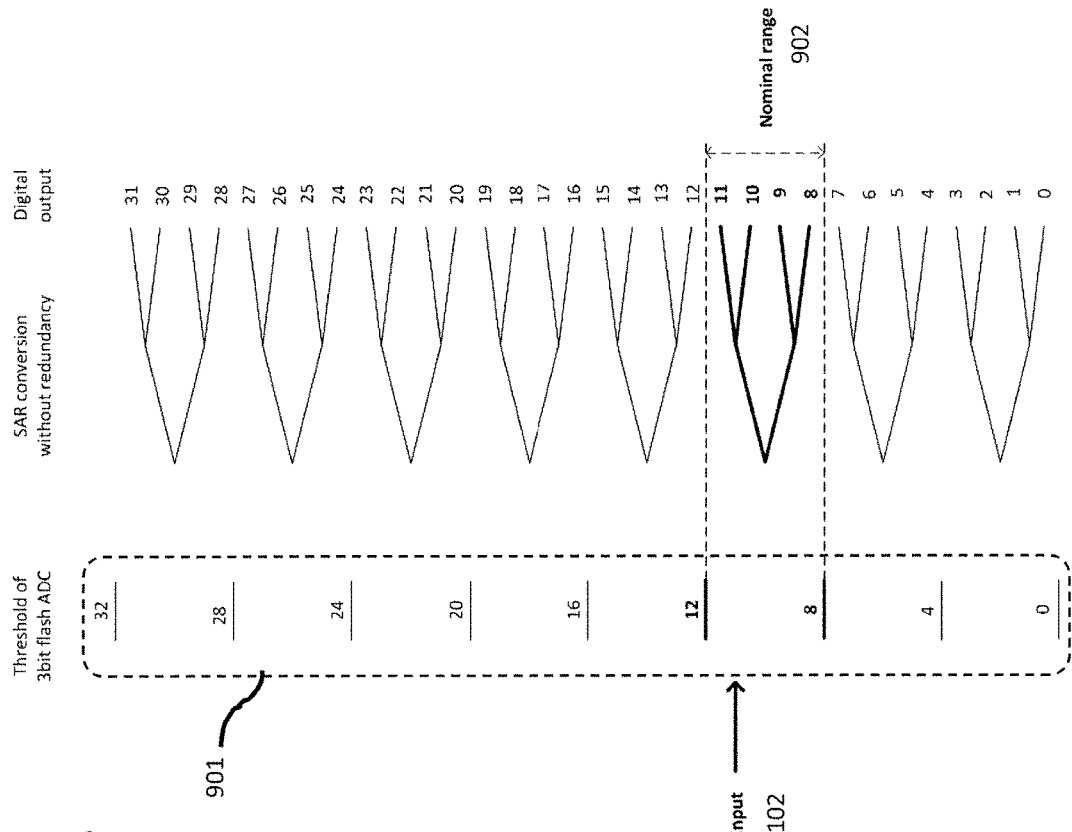
FIG. 18 provides a diagram illustrating an example of TI ADC performance without redundancy.
Figure 19:
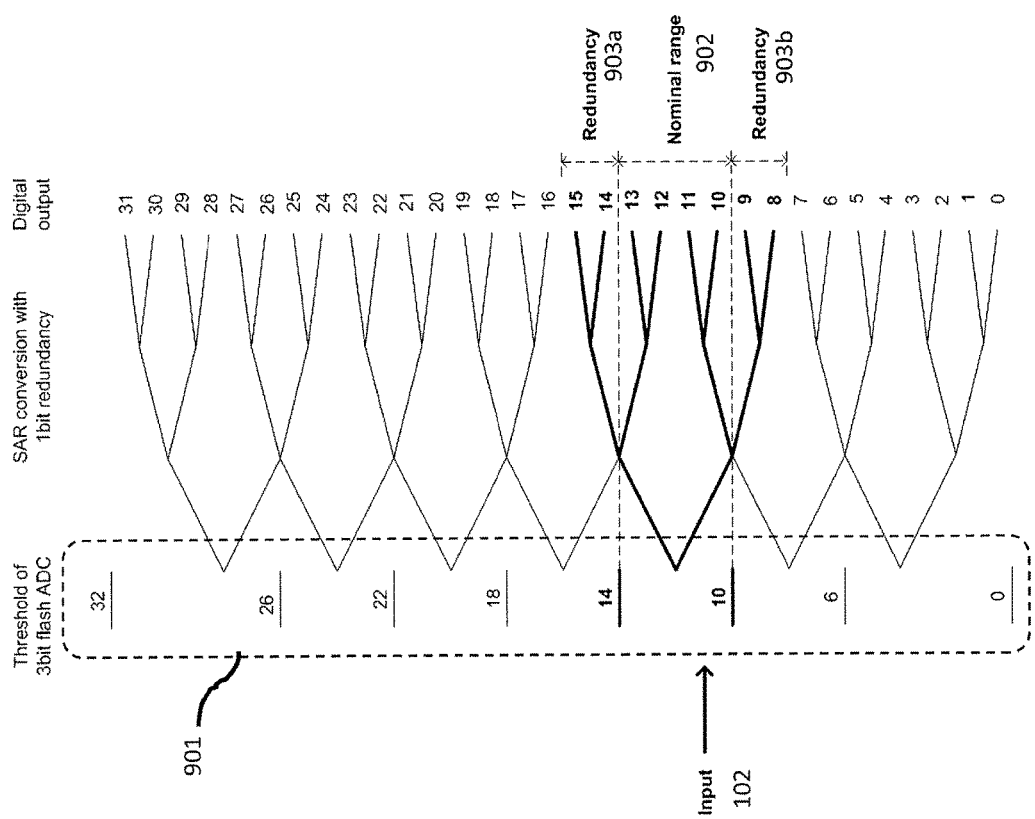
FIG. 19 provides a diagram illustrating an example of TI ADC performance with redundancy, according to one embodiment of the present invention.

FIGS. 18 and 19 describe the redundancy (e.g., see 714 in FIG. 16). A simplified example with 3 bit flash and 5 bit SAR to convert the input signal 102 is shown in FIGS. 18-19 for illustrative purposes. FIG. 18 shows the case without redundancy. In this case, the flash ADC needs 7 comparators for 8 level quantization. The thresholds 901 of the flash ADC are uniformly distributed between the full input range. Note that the SAR searching range is the same as the uncertainly provided from the flash ADC. In the particular example shown in FIG. 18, the flash ADC confines the input signal 102 to between 8-11 and the same range (8-11) 902 is covered by the SAR ADC in two cycles. This structure may not be ideally robust to small errors from the flash ADC and could be impractical for real implementation, as it requires the flash ADC to be accurate to the full ADC resolution.

FIG. 19 shows the case with redundancy. In this case, the flash ADC needs 6 comparators for 7 level quantization. Compared to FIG. 18, the thresholds 901 are shifted by 0.5 $LSB_{flash}$. The redundancy 903a-b comes from the fact that the SAR searching range is wider than the uncertainly provided from the flash ADC. Also, to use the redundancy efficiently, the SAR searching range is centered around the two thresholds of the flash ADC. In the particular example shown in FIG. 19, the flash ADC confines the input signal 102 between 10-13 (see 902), but a wider range (8-15) (see 902 and 903a-b) is covered by the SAR ADC in three cycles. Due to the 1 bit redundancy, the overall resolution of the whole ADC is reduced from 6 bits to 5 bits. The ADC with redundancy, however, has improved robustness compared to the flash ADC error performance in FIG. 18, and more practical implementation.

When selecting a capacitor size for the ADC (e.g., 502-503 in FIG. 14; 605-606 in FIG. 15; 705 in FIG. 16 and/or the like), two important factors are considered: thermal $$\left(\frac{kT}{c}\right)$$

noise and capacitor mismatches. The $$\frac{kT}{c}$$

noise limits me minimum size of total capacitance to 100 fF on each side for 10 bit ADC with $2V_{diff, p-p}$ input amplitude. This leads to a 0.1 fF unit capacitor for a 10 bit ADC, which is impractical and too small for 10 bit matching. For example, 1 fF unit capacitors can be a good compromise for 10 bit accuracy.

Figure 20:
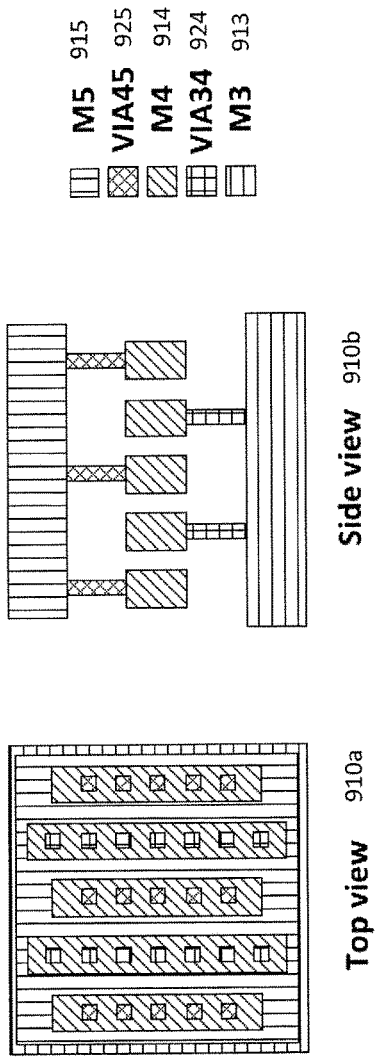
FIG. 20 provides a diagram illustrating an example of a custom designed unit capacitor of SAR ADC, according to one embodiment of the present invention.

The custom designed unit capacitor used in the ADC (e.g., 502-503 in FIG. 14; 605-606 in FIG. 15; 705 in FIG. 16 and/or the like) is shown in FIG. 20. It is a combination of metal-insulator-metal (MIM) and metal-oxide-metal (MOM) structures. M3 913 and M5 915 are two plates having a MIM structure. The benefit of capacitor arrays with the MIM structure (see the shaded area having patterns 913 and 915 in 910*a-b*) is that the top and bottom plates are shielded from each other in a capacitor array and each element can be accessed without adding parasitic capacitance. This is especially important when a small unit capacitor is used. Also, M5 915 is designed slightly smaller than M3 913 to reduce the errors from misalignment of metal layers. However, the density of MIM capacitance without special layer in the fabrication process is too low. To increase the density of the capacitor, interdigitated MOM structures are added in M4 914 and connected to M3 and M5. Metal strips in M4 914 are designed wider than minimum size to cover the capacitance from VIAs (e.g., 924, 925). In the capacitor array, M5 915 is used as a bottom plate that is connected to the comparator input for smaller parasitic capacitance.

Figure 21:
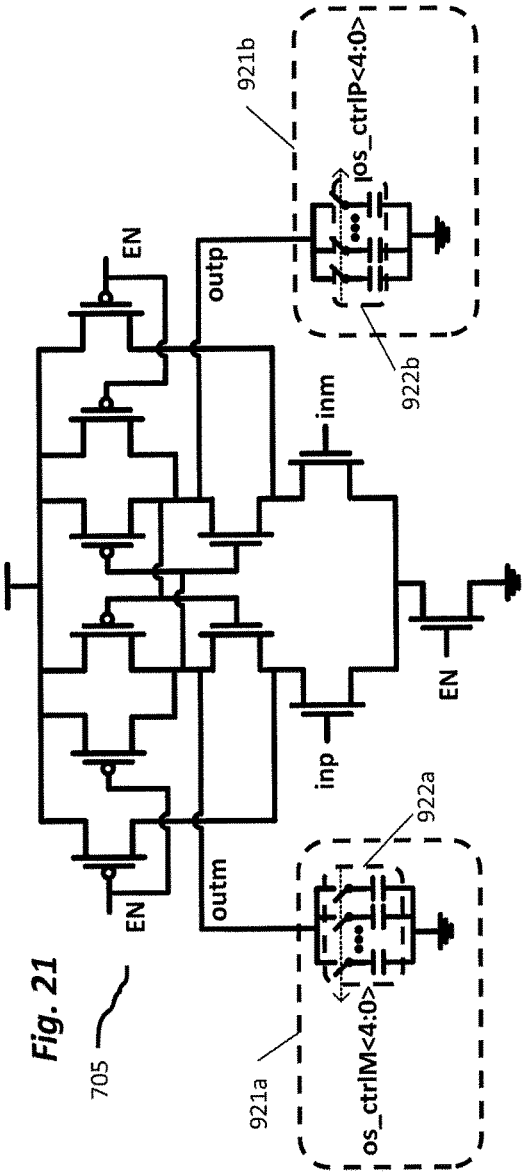
FIG. 21 provides a diagram illustrating the SAR ADC comparator with offset calibration, according to one embodiment of the present invention.

A dynamic latch with an offset control, shown in FIG. 21, can be used for the SAR ADC comparator (see 705 in FIG. 16). An offset calibration block 921*a-b*, which is a capacitor bank with switches 922*a-b*, is added at both outputs of the comparator 705. The offset calibration block has 31 switches and 31 capacitors controlled by the binary weighted 5 bit configuration bits. Although capacitors are shown in FIG. 21, the parasitic capacitance of switches are used to control the offset finely. According to the simulation and measurement results, the offsets can be adjusted up to ±12 mV±6LBSs with a 0.2LSB step size. The input NMOS pair of the comparators are sized to have the σ of the comparator offset below 1.5 mV. The noise of the comparator 705 can be controlled by the proper sizing of a NMOS strobe switch at the bottom of the comparator (not shown in FIG. 21). Simulations show that the input referred noise of the comparator is about 0.2 $mV_{rms,diff}$.

Figure 22:
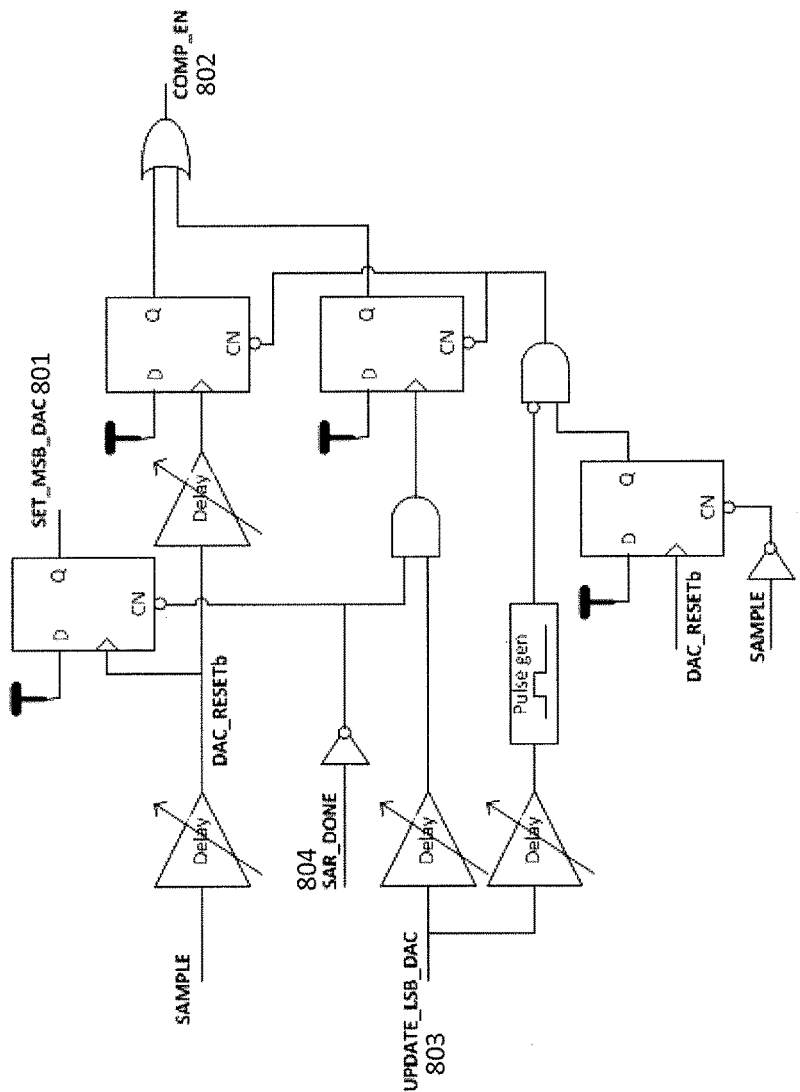
FIGS. 22-23 provide a diagram illustrating the SAR logic for the SAR of FIG. 16, according to one embodiment of the present invention.
Figure 23:
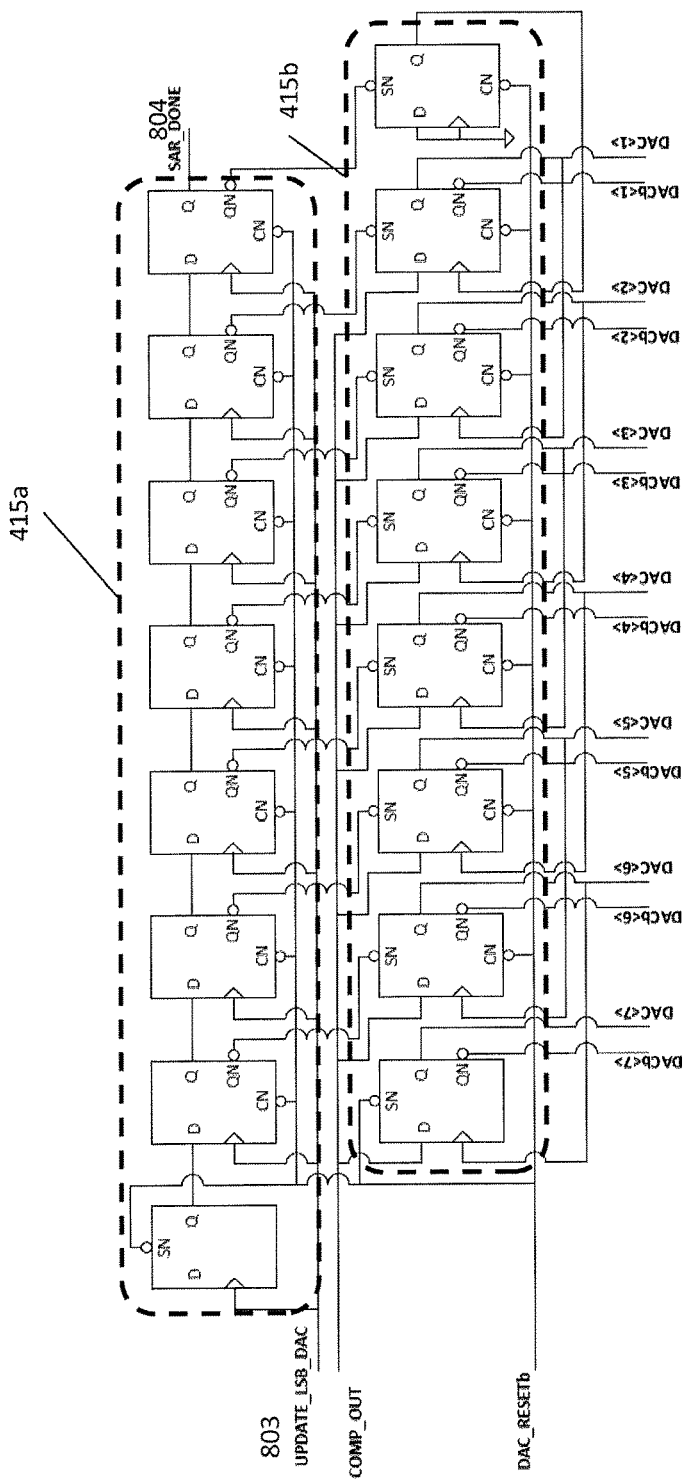

An example asynchronous SAR logic block is shown in FIGS. 22-23. Two D flip-flop chains 415*a-b* shown in FIG. 23 are used for LSB DAC control. The digital logic circuit to generate the signals (e.g., SET_MSB_DAC 801, COMP_EN 802, SAR_DONE 804, UPDATE_LSB_DAC 803) in FIG. 17 is shown in FIG. 22.

III. Timing-Skew Estimation

Two example background timing-skew estimation methods can be applicable to the TI ADC architecture according to various embodiments of the present invention (e.g., as shown in FIGS. 6-8) by using the coarse/flash ADC output 112 as a reference in timing.

A. Variance Based Estimation

Figure 24:
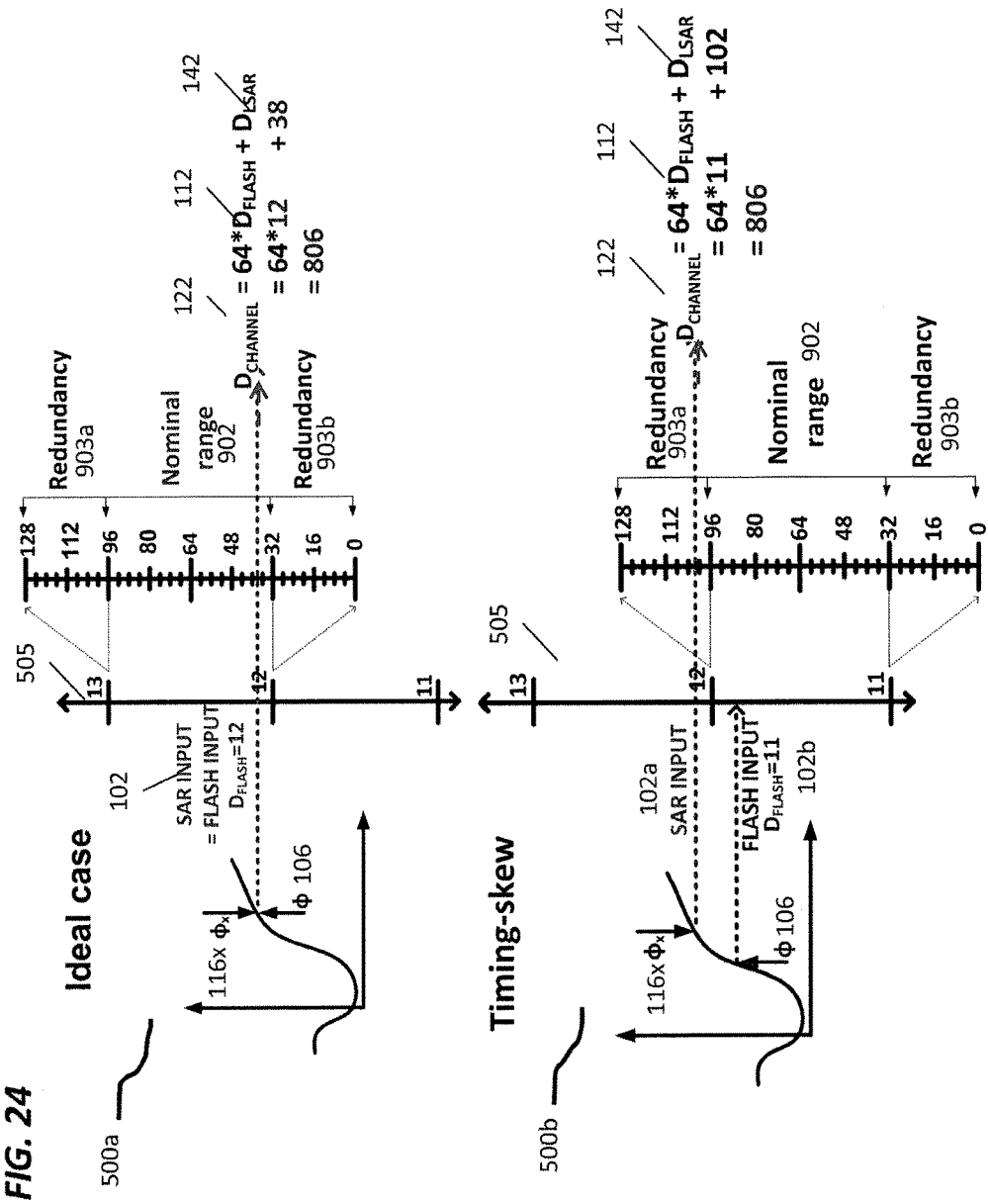
FIG. 24 provides a conceptual diagram of the ADC operation showing an ideal case without timing-skew and a realistic case with timing-skew.

An example data plot diagram of the ADC operation, shown in FIG. 24, is used to illustrate the variance based method based on the architecture shown in the embodiment of FIG. 8 using the SAR ADC of FIG. 16. The input signal (e.g., 102 in FIG. 8) and sampling clocks (e.g., 130 in FIG. 8) of the flash ADC(ϕ) and the SAR ADC(ϕ$_X$) (e.g., 116$_i$ in FIG. 8) are shown on the left side. A portion of a scale 505 showing digital output levels 112 of the flash ADC (e.g., 110 in FIG. 8) which are equivalent to the MSB DAC level of the SAR ADC 120*x* shown in FIG. 16 (14 unary weighted bits in the current example) are shown in the middle. Another scale showing digital output levels represented by the LSB DAC code of the SAR ADC shown in FIG. 16 (7 binary-weighted bits in the present example) is shown on the right side.

As shown in diagram 500*a*, the input signal 102 is sampled by the flash ADC clock (ϕ) 106 and the SAR ADC clock (ϕ$_X$) 116*x* simultaneously (i.e., no timing-skew). Thus, assuming the flash ADC is accurate, they sample the same input signal 102 and the coarse estimation (digital output 112) from the flash ADC is accurate. In this example, the flash ADC digital output 112 has a value of 12. Although the flash ADC confines the SAR searching range 902 between 32 and 96, due to the redundancy, the LSBs of the SAR cover a wider range than necessary (e.g., 902 and 903*a-b*). In the absence of noise, the digital value 142 (D$_{LSAR}$) of the LSBs of the TI SAR ADC channel in this case always falls between 32 and 96, which is a nominal range 902.

However, when ϕ 106 and ϕ$_X$ 116*x* are not aligned as shown in the diagram of 500*b* (e.g., the SAR ADC input 102*a* does not synchronize with flash ADC input 102*b*), the coarse estimation (digital output 112) from the flash ADC is not accurate. In this example, the flash ADC output 112 has a digital value of 11 (representing the flash ADC input 102*b*). Thus, the SAR ADC conversion starts from the wrong place. However, due to the redundancy, the SAR ADC is able to generate an accurate final value for the overall channel output D$_{CHANNEL}$. Although the channel output 122 (which is a weighted sum of the flash ADC output 112 and the LSBs of the TI SAR ADC, i.e., D$_{LSAR}$ 142) is the same as before, the digital value of the LSBs of the SAR ADC conversion output D$_{LSAR}$ in this example goes beyond the nominal range, but falls within the range of redundancy 903*a*.

Figure 25:
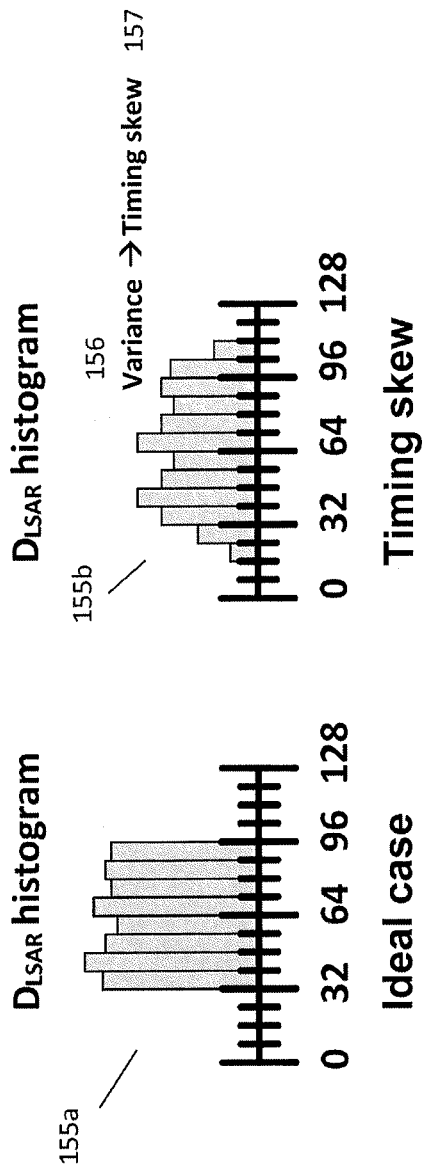
FIG. 25 provides data plot diagrams showing examples of the $D_{LSAR}$ histogram without timing-skew and with timing-skew.
Figure 26:
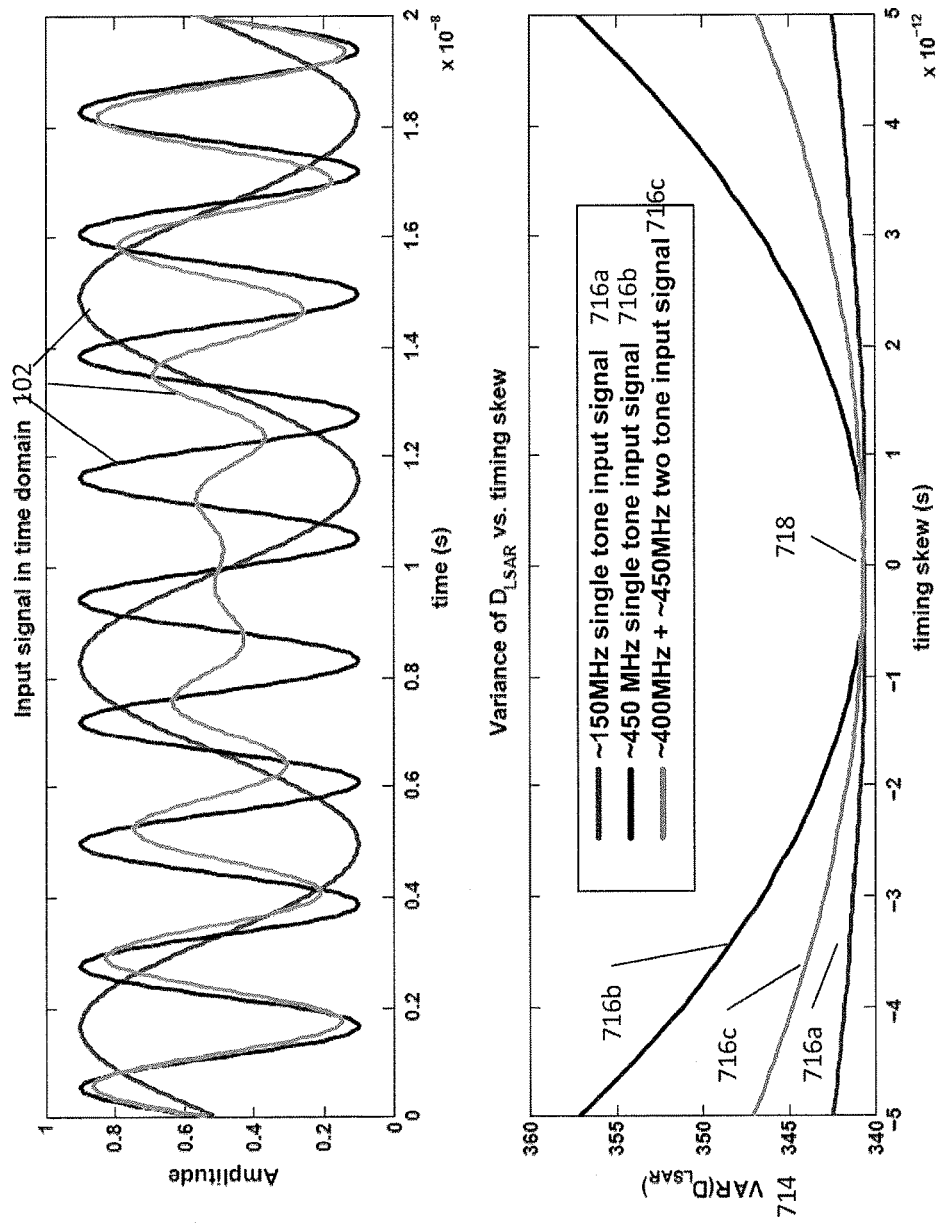
FIG. 26 provides a data plot diagram showing example timing-skew performance with different input signals, according to one embodiment of the present invention.

The effect of the timing-skew can be found from the histogram of D$_{LSAR}$ 142. FIG. 25 shows an example of the SAR conversion output 142, D$_{LSAR}$, histogram with (155*b*) and without (155*a*) the timing-skew error. In this ideal case shown at 155*a*, D$_{LSAR}$ 142 is confined in the nominal range and the density is uniform. However, with timing-skew shown at 155*b*, some of the D$_{LSAR}$ 142 codes at the edge go to the other side to cover the error from the flash ADC and this increases the variance 156 of the D$_{LSAR}$ histogram. Thus, timing-skew 157 can be estimated from the variance of D$_{LSAR}$. Behavioral simulations are performed and shown in FIG. 26. In this simulation, three input signals 102 with different frequencies are applied. Here, 128K ($2^{17}$) data values are used to calculate each variance value on the plot. As shown at 718, VAR(D$_{LSAR}$) is minimized or significantly reduced when the timing-skew is zero, regardless of the input frequency (e.g., as shown with the data plots 716*a-c* each representing a different input signal frequency). FIG. 26 also shows that VAR(D$_{LSAR}$) 714 has lower sensitivity when the input signal is at a low frequency. With a low frequency input signal, VAR($D_{LSAR}$) 714 curve has small slope because this method does not measure the timing-skew directly in the time domain, but measures the errors caused by timing-skew in the voltage domain. With a low frequency input signal, the errors caused by timing-skew are small and thus difficult to detect. In practical cases, this is not a problem because the input voltage typically contains large enough high frequency components.

It should be appreciated that the TI ADC channels in the various embodiments described herein share a common reference in timing (based on dividing the full rate sampling clock signal 106), but otherwise they do not significantly interact with each other and operate independently to convert the input signal 102. Thus, timing-skew estimation and corresponding adjustment and alignment of respective TI ADC clock signals may be performed independently for each channel (and, theoretically speaking, irrespective of the number of TI ADC channels). In view of the foregoing, variance-based timing-skew estimation can be mathematically modeled with respect to one TI ADC channel (e.g., see FIG. 9), and applied similarly to the remaining TI ADC channels of a given apparatus according to various embodiments of the present invention.

With reference to the embodiment of the apparatus shown in FIG. 8 (constituent components of which are discussed in connection with other figures), for purposes of illustration, the digital output 112 of the flash ADC and the digital output 122x of a given TI ADC channel can be written as:

$$D_{FLASH}[n] = v_{IN}(nT) + Q_{FLASH}[n] \quad (6a)$$

$$D_{CHANNEL}[n] = v_{IN}(nT+\Delta t) + Q_{CHANNEL}[n] \quad (6b)$$

where $D_{FLASH}[n]$ and $Q_{FLASH}[n]$ are the digital output and quantization noise, respectively, of the flash ADC corresponding in time to the particular TI ADC channel in question, $D_{CHANNEL}[n]$ and $Q_{CHANNEL}[n]$ are the digital output and quantization noise, respectively, of the TI ADC channel, and $\Delta t$ is the timing skew between the flash ADC and the TI ADC channel. It should be appreciated that in equations (6a) and (6b), for purposes of the present discussion, the right side of the respective equations is normalized based on the full scale range of the input analog voltage, and the left side of the respective equations is normalized based on the full scale range of the digital output (e.g., $D_{FLASH}[n]$ is scaled by a normalization factor $2^{Nflash}$, where $N_{flash}$ is the number of equivalent binary-weighted bits of the flash ADC output, and $D_{CHANNEL}[n]$ is scaled by a normalization factor $2^{Nchannel}$, where $N_{channel}$ is the number of binary-weighted bits of the particular TI ADC channel digital output). In the embodiment of FIG. 8, as discussed above it can be presumed that the error due to the timing skew is relatively small and covered by the redundancy in the TI SAR ADC for a given channel, such that the digital output for the TI SAR ADC channel is completely determined by the sampled value of the TI SAR ADC. Based on the foregoing, the variance of $D_{LSAR}$ can be expressed as $$\text{VAR}[D_{LSAR}[n]] = \text{VAR}[D_{CHANNEL}[n] - D_{FLASH}[n]] \quad (7)$$

$$= \text{VAR}\begin{bmatrix} v_{in}(nT+\Delta t) + Q_{CHANNEL}[n] - \\ v_{IN}(nT) - Q_{FLASH}[n] \end{bmatrix} \quad (8)$$

$$= E\left[\begin{pmatrix} v_{IN}(nT+\Delta t) - v_{IN}(nT) + \\ Q_{CHANNEL}[n] - Q_{FLASH}[n] \end{pmatrix}^2\right] \quad (9)$$

-continued $$= E[(v_{IN}(nT+\Delta t) - v_{IN}(nT))^2] + \quad (10)$$

$$Q^2_{CHANNEL,rms} + Q^2_{FLASH,rms}$$

where $Q^2_{CHANNEL,rms}$ and $Q^2_{FLASH,rms}$ are the quantization noise power of each channel ADC and the flash ADC respectively. Equation (10) shows that VAR[$D_{LSAR}[n]$] is a function of $\Delta t$ and it is minimized when $\Delta t$ is zero. Equation (10) also indicates that minimizing VAR[$D_{LSAR}[n]$] is equivalent to find a least mean square (LMS) error approximation between the two sampled signals: $v_{IN}(nT)$ and $v_{IN}(nT+\Delta t)$.

Figure 27:
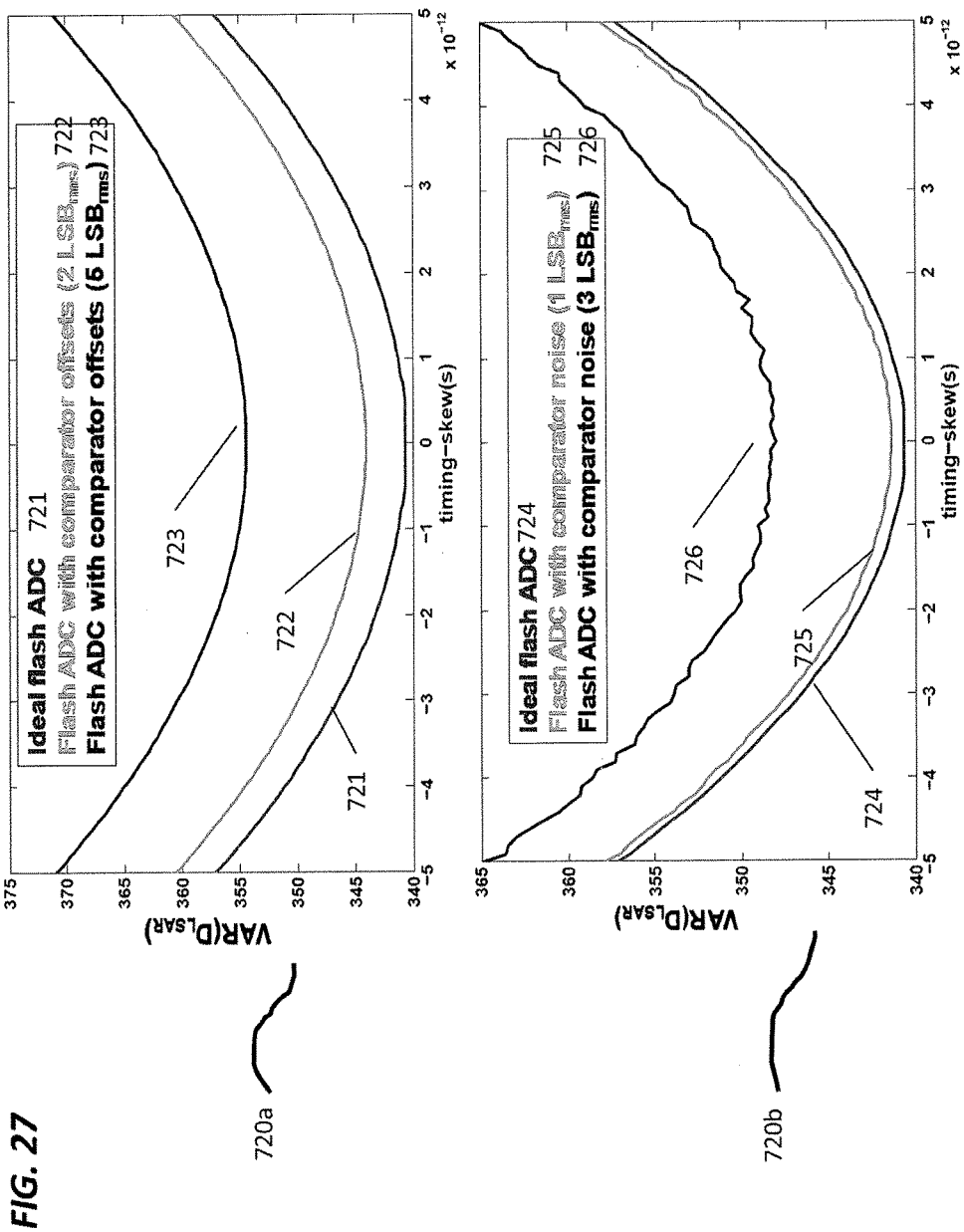
FIG. 27 provides a data plot diagram showing example timing-skew performance with comparator offsets in the flash ADC, according to one embodiment of the present invention.

In the above mathematical analysis in Equations (7)-(10), an ideal flash ADC is assumed. However, it is important to consider non-idealities of the flash ADC, such as offset and noise of the comparators. The comparator offsets in the flash ADC have negligible impact to the timing-skew estimation (shown at 720a in FIG. 27). It is true that the comparator offsets in the flash ADC provide inaccurate coarse estimation to the SAR ADCs and increase the range of $D_{LSAR}$. However, since the polarity and amplitude of the comparator offsets do not change, they can be distinguished from timing-skew errors easily. The behavioral simulation result, plotted in FIG. 27, shows that the comparator offsets in the flash ADC shift the VAR($D_{LSAR}$) curve upward (see the data plots 721-723 at 720a), but do not change the fact that VAR($D_{LSAR}$) is minimized when the timing-skew is zero. In this simulation, comparator offsets with two different RMS values are tested with 451 MHz-2 dBFS input signal. Here also, 128K ($2^{17}$) data values are used to calculate each variance value on the plot 720a-b.

Figure 28:
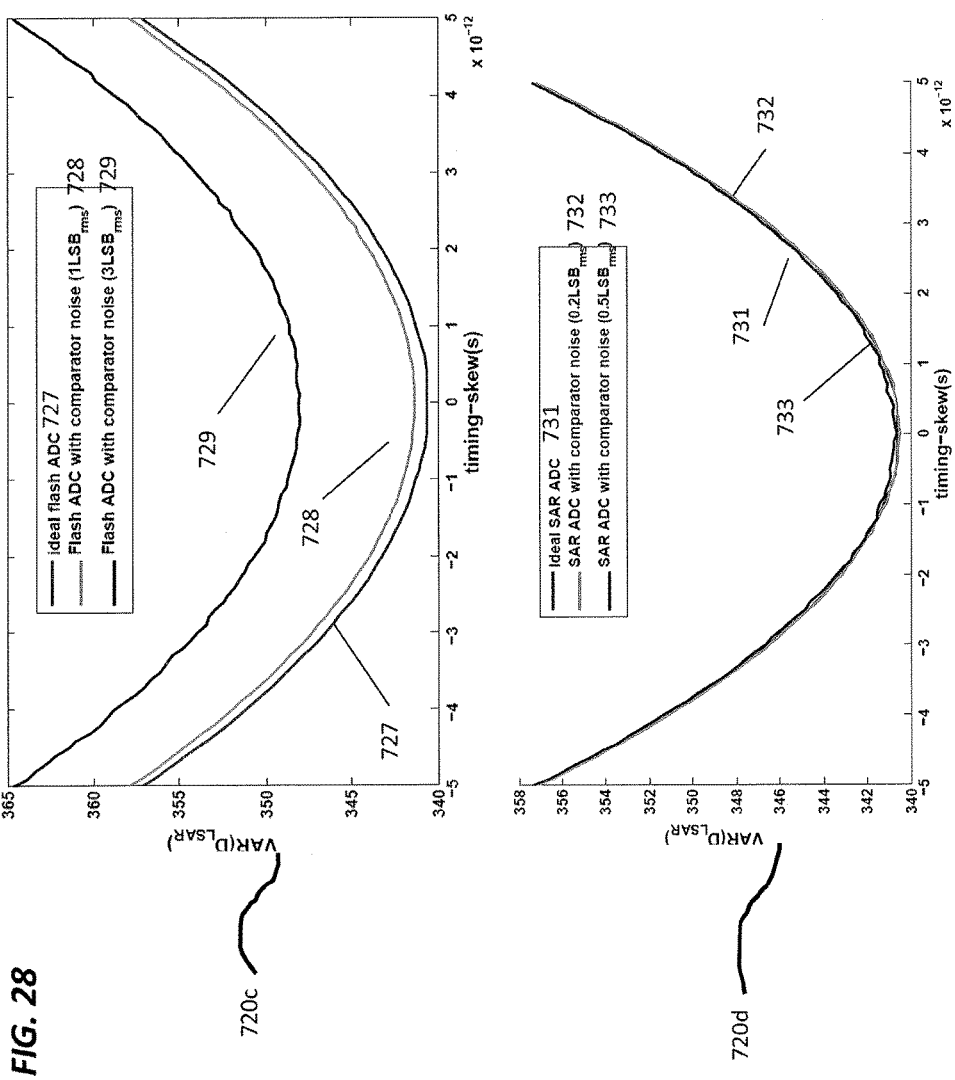
FIG. 28 provides a data plot diagram showing example timing-skew performance with comparator noise in the flash ADC, according to one embodiment of the present invention.

The noise of the comparators in the flash ADC has different impacts on the $D_{LSAR}$ histogram. Because the polarity and the amplitude of the comparator noise varies randomly, it is difficult to distinguish the error caused by the comparator noise in the flash ADC from the error caused by timing-skew with one sample. However, using statistics of noise such as mean and variance, the effect of the comparator noise can be distinguished statistically. When the histogram and variance of the $D_{LSAR}$ are calculated with sufficient number of data, the effect of the comparator noise is averaged and does not change. In other words, the variance of $D_{LSAR}$ is increased due to the comparator noise. However, with sufficient samples, the amount of increase is the same for every VAR($D_{LSAR}$) calculation. It is because the captured noise power of the comparators gives its convergence as the number of samples increases. The effects of the comparator noise are simulated with behavioral models. The comparator noise with two different RMS values is tested with 451 MHz-2 dBFS input signal. Similar to 720a, 128K ($2^{17}$) data values are used to calculate each variance value on the plot. Data plots 724-726 at 720b shows that the noise of the comparators in the flash ADC adds noisy patterns, which degrades the sensitivity of the timing-skew calibration. Thus, it is important to keep the comparator noise low. If the comparator noise is higher than the required level and cannot be controlled, a simple solution is using the averaging effect of noise power. By using more data for the variance calculation, the impact of the flash comparator noise can be reduced. FIG. 28 shows similar behavioral simulation result (data plots 727-729 at 720c) as in FIG. 27, but FIG. 28 use eight times more data ($2^{20}$) to calculate each variance. However, the improvement with increased data is significantly slower than the increased cost in time and power consumption of the calibration. Thus, the number of data for variance calculation should be optimized empirically to the noise level of the flash comparators.

Finally, the noise of the comparators in the SAR ADCs also affects the histogram of $D_{LSAR}$ and may limit the sensitivity of the calibration. However, since the noise level of the SAR comparator typically is kept significantly lower than 1 LSB, it is usually negligible, e.g., the behavioral simulation result is shown at 720*d* with negligible differences between the data plots 731-733.

B. Correlation Based Estimation

Figure 29:
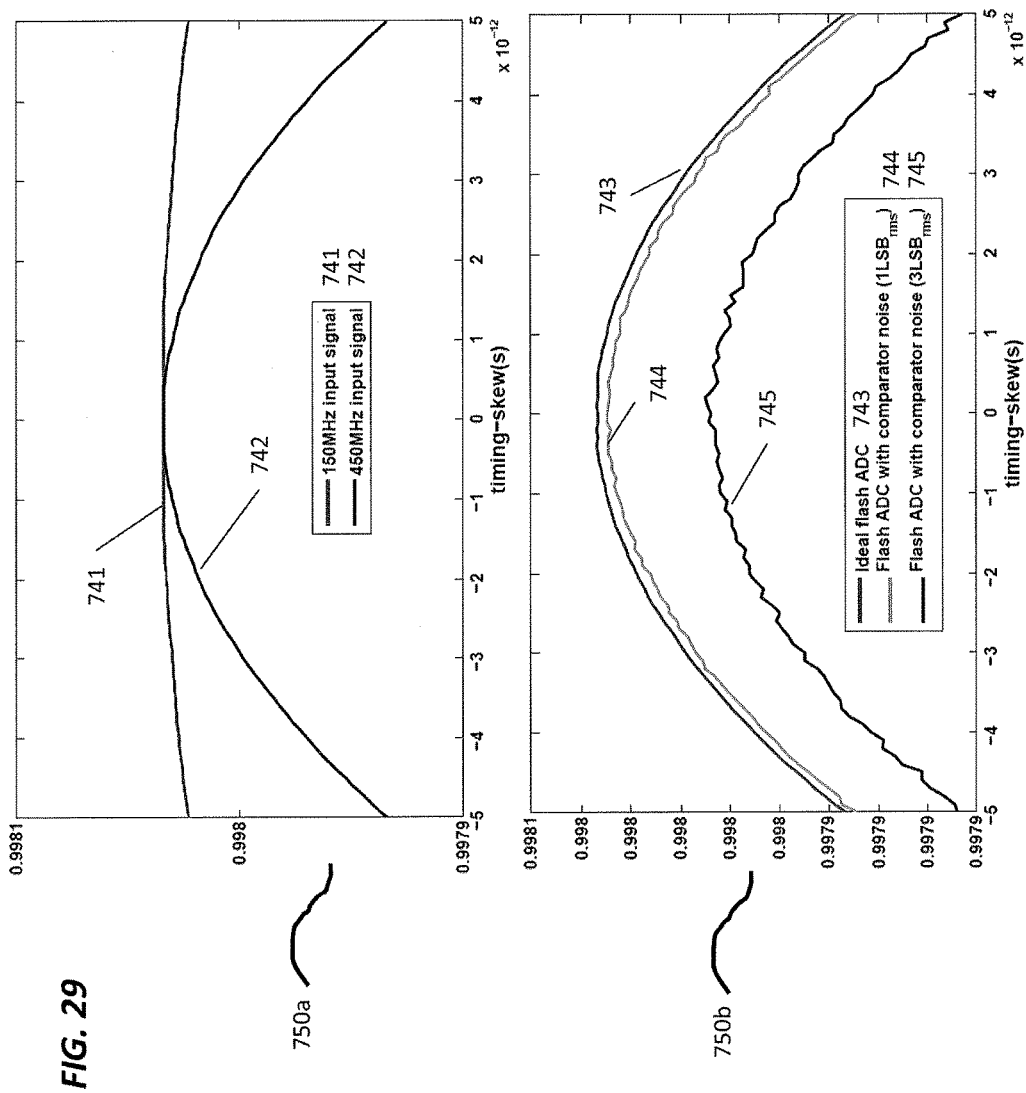
FIG. 29 provides a data plot diagram showing example timing-skew performance based on a correlation method, according to one embodiment of the present invention.

In another implementation, a correlation based skew-estimation approach can be used for timing-skew estimation. The correlation between $D_{FLASH}$ 141 and $D_{CHANNEL}$ or $D_{LSAR}$ 142 can be a measure of the sampling clock alignment, and the correlation reaches the maximum value at 743 for input signals at different frequencies 741-742 when the sampling clocks are aligned (e.g., when the time-skew is zero), as shown at 750*a* in FIG. 29.

Similar to the previous variance based method, the correlation based method can be robust to the offset of the comparators in the flash ADC. However, as shown by the data plots 743-745 with different comparator noise levels at the flash ADC, in 750*b* in FIG. 29, it is also affected by sensitivity degradation with the comparator noise in the flash ADC. Note that both $D_{FLASH}$ 141 and $D_{CHANNEL}$ or $D_{LSAR}$ 142 contains the input signal and have wide dynamic range. Thus, the calculation of the correlation between $D_{FLASH}$ and $D_{CHANNEL}$ requires multipliers and adders with wider input words.

Figure 30:
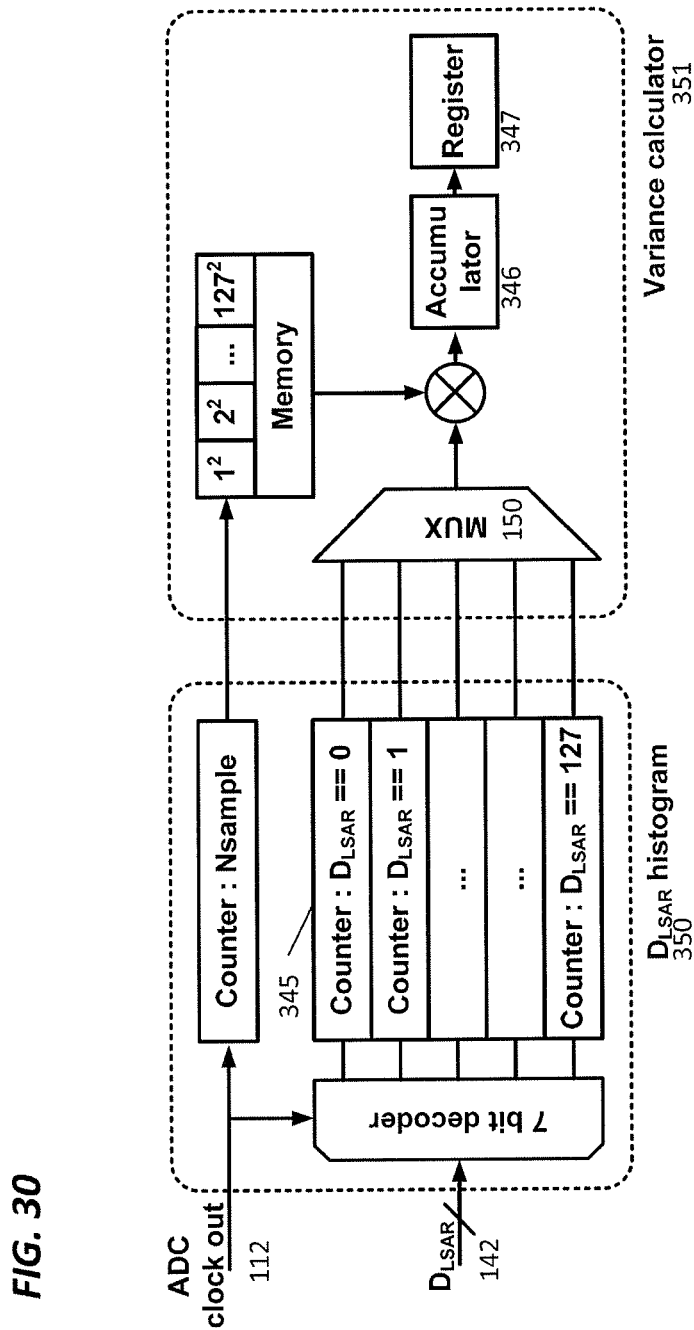
FIG. 30 shows a block diagram illustrating calculating a variance for timing-skew estimation, according to one embodiment of the present invention.

FIG. 30 shows a block level implementation of the timing skew calibration. For this prototype case, 128 counters 345 are required to generate histogram of $D_{LSAR}$ (e.g., 142) at 350. These counters operate at the speed of single channel clock (e.g., divided flash ADC clock 112), 125 MHz for this prototype. Another counter is needed to count the total number of samples. Once the total number of samples reaches to a certain value (e.g., at the accumulator 346), counters for $D_{LSAR}$ histogram at 350 hold their values and the variance is calculated at 351 and transmitted to the register 347. Note that during the most of the calibration time, only counters are active to generate histogram which can be implemented with low power consumption.

C. Considerations for Timing-Skew Estimation

There are some noteworthy considerations in applying the estimation techniques described above according to various embodiments of the invention. First, the input signal 102 typically should be busy or active, so that the input signal crosses at least one of the reference voltages of the flash ADC 110. This is because the techniques described herein detect the error (or correlation) between the two independent ADCs (flash ADC 110 and SAR ADC 120*x*). For example, with a very small input signal which is represented with one flash ADC output 112, the Corr($D_{FLASH}$,$D_{CHANNEL}$) is always zero. However, this is not a critical issue, because if the input signal is limited between two reference voltages of the flash ADC, the derivative of the input, $dV_{in}/dt$, is also limited. Thus, in this case, the errors from the timing-skew are likely to be insignificant.

Second, the input frequency typically should not be an integer multiple of fc, where fc is the conversion rate of each channel. Although this is a pathological case, if the input frequency is an integer multiple of fc, each channel samples the same signal repetitively. Thus, there is only one flash ADC output and one SAR output for each channel. Thus, VAR($D_{LSAR}$) and Corr($D_{FLASH}$, $D_{CHANNEL}$) are always zero.

Finally, because the timing-skew estimation techniques disclosed herein rely on statistics of the input signal, the input characteristic should be maintained during the timing-skew calibration. For example, if the input signal is busy, but appears more frequently where $D_{LSAR}$ is close to the edges of nominal range, 32 and 96 in the prototype, the $V_{AR}$ ($D_{LSAR}$) can increase. However, the increase of the variance is not caused by the timing-skew, but by an unexpected characteristic of the input. Similarly, if the input frequency increases temporarily only for one calibration cycle, the VAR($D_{LSAR}$) can also increase regardless of actual timing-skew.

IV. Chip Layout

Figure 31:
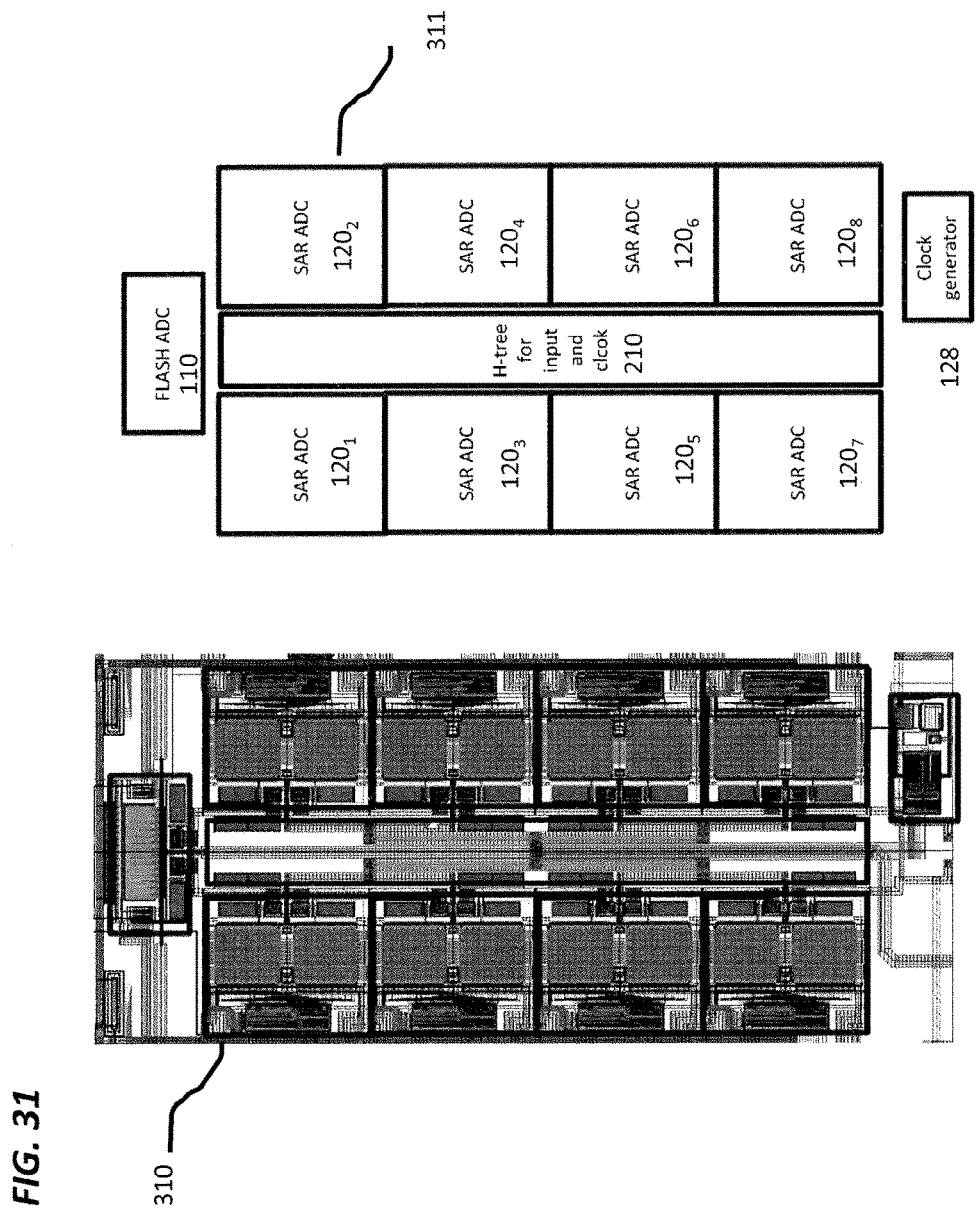
FIG. 31 shows a floor plan and top layout of the ADC chip, according to one embodiment of the present invention.

The floor planning of a TI ADC on chip can keep the symmetry of the channels. Asymmetry in the chip layout can exacerbate offset and timing-skew errors. A signal traveling a long distance can be affected by the voltage drop and local noisy circuits. FIG. 31 shows the example floor plan on a chip 311 and the top layout 310 of the TI SAR ADC in this work. Four SAR ADCs (120$_1$, 120$_3$, 120$_5$, and 120$_7$) and (120$_2$, 120$_4$, 120$_6$, and 120$_8$) are located on each of the right and left sides of the chip. The flash ADC 110 is placed at the top of the chip. Input signals and clocks are distributed to the interleaved channels from the bottom via the H-tree routing 210. To ensure the same distance to the TI channels, an H-tree structure is used to route the input signals and clocks. To avoid interference through capacitive coupling, clock generator 128 is shielded with ground.

Figure 32:
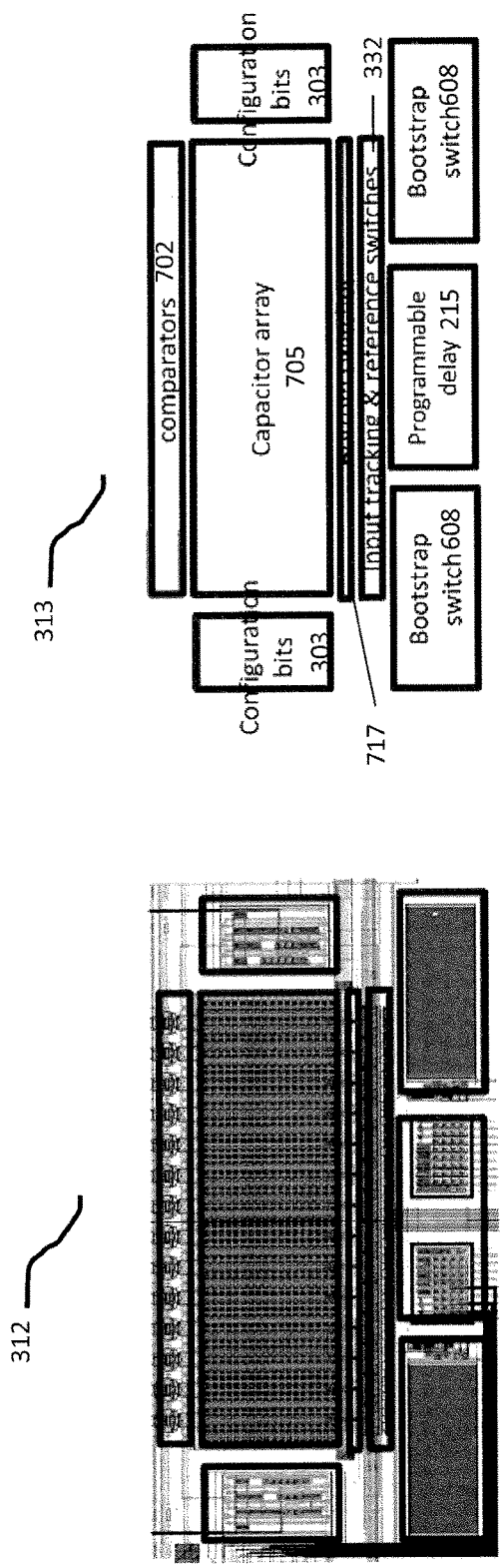
FIG. 32 shows a floor plan and top layout of the SAR ADC, according to one embodiment of the present invention.

FIG. 32 shows the example floor plan 312 and the top layout 313 of the SAR ADC (e.g., the circuit implementation is discussed in FIG. 16). A symmetric layout is used to exploit benefits of fully differential implementation. Thus, the comparator 702 and the bottom sampling switches 717 are placed between the main and complementary DACs (not shown at the top layout 313). Dummy capacitors (not shown at the top layout 313) are added around the DAC for better matching. To make the wiring length short, the input tracking switches and the reference switches 332 are placed on the opposite sides of the DACs. Bootstrap switches 608 can be placed on two sides of the programmable delay 215, with bit configurations 303 placed on the left and right sides of the capacitor array 705.

Figure 33:
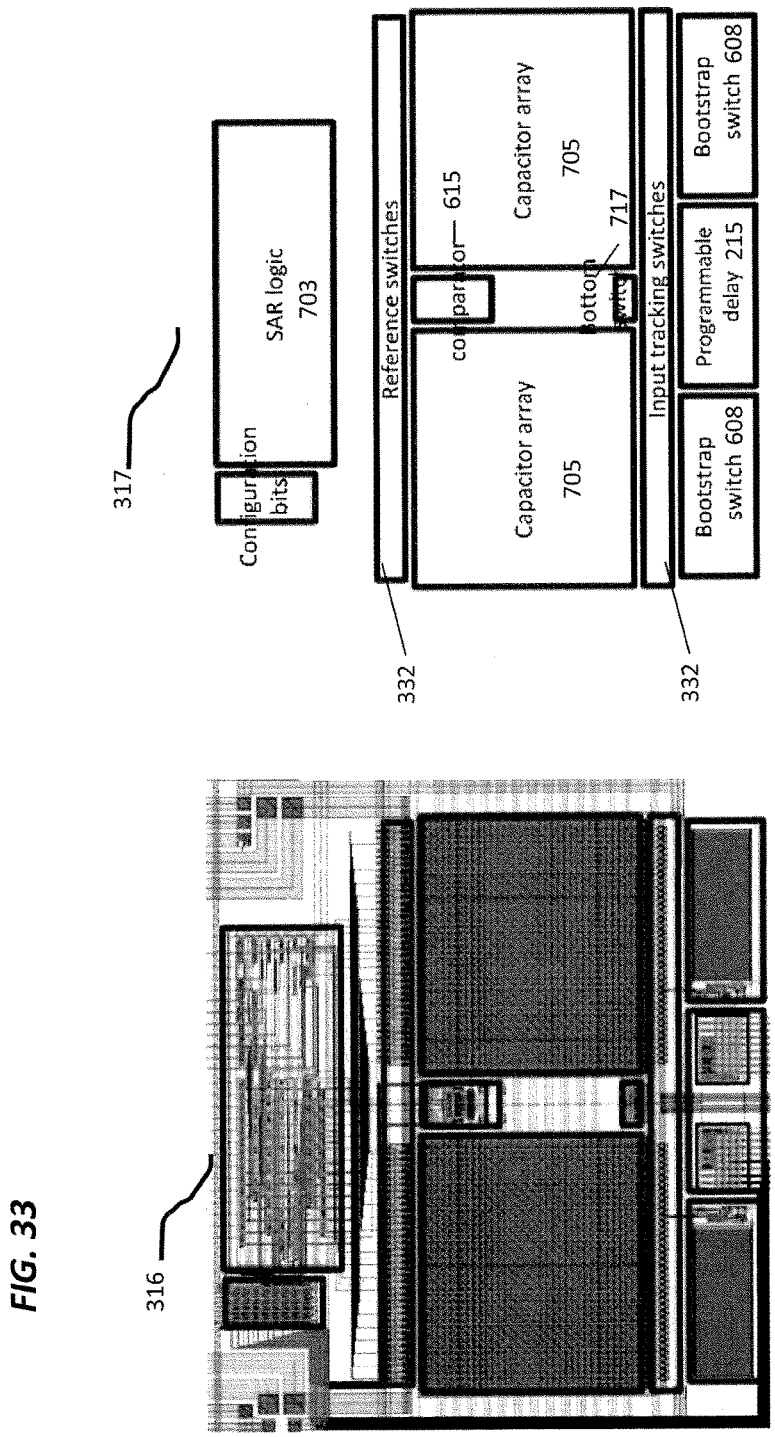
FIG. 33 shows a floor plan and top layout of the flash ADC, according to one embodiment of the present invention.

Example layout 316-317 of the flash ADC is shown in FIG. 33 (e.g., the circuit implementation is discussed in FIG. 15), which may share a similar top layout 317 as that of a SAR ADC shown at 313, including capacitor arrays 705 on both sides of the comparators 615, with bottom switches 717 to control sampling, and reference/input tracking switches 332 on top and bottom of the comparators. The SAR logic 703 can be placed beneath the references switches 332. The flash ADC layout also has bootstrap switches 608 and programmable delay 215 on one side of the top layout. Due to the fact that the sum of two capacitors 605-606 of each comparators 615 of the flash ADC are the same, flash ADC layout can be compact and modular.

V. Measurement

A. Measurement Setup

Figure 34:
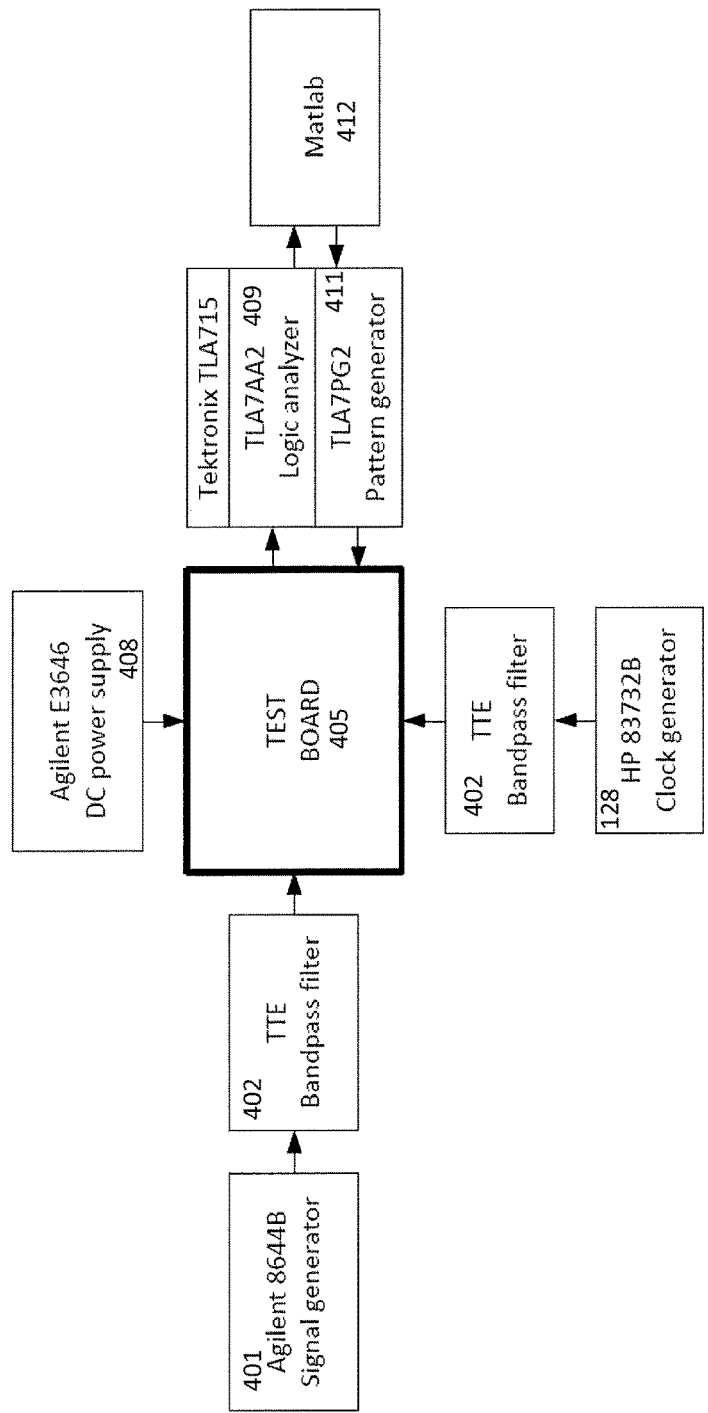
FIG. 34 shows a block diagram of the measurement setup.

An example block diagram of the measurement setup of the proposed ADC structure is shown in FIG. 34. Synthesized signal generators 401 are used for the low noise input signal and the clock source. To reduce the distortion and noise of the signal generator 401, a bandpass filter 402 is inserted between the signal generator 401 and the test board 405, which is connected to a power supply 408. The configuration bits 303 on the ADC chip are implemented by a flip-flop chain, and are programmed by a pattern generator 411. The LVDS output signals of the ADC are captured by a logic analyzer 409, which can be analyzed via interface a data analysis tool, such as Matlab 412.

Figure 35:
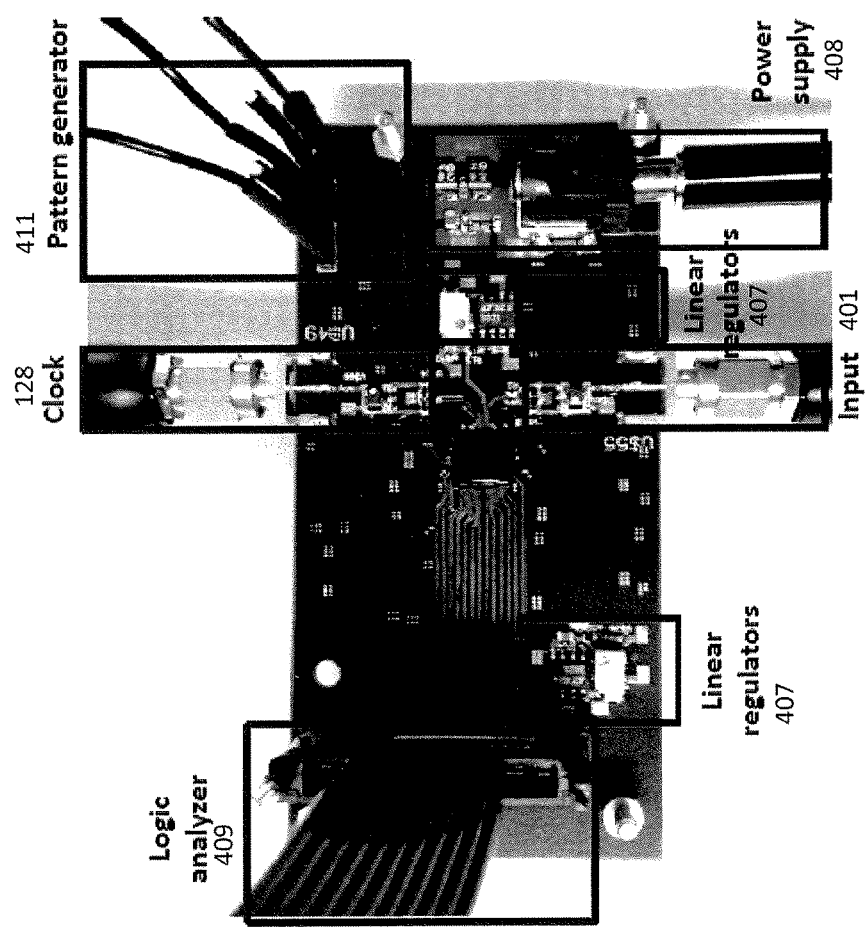
FIG. 35 shows a test board design for measurement.

FIG. 35 shows the test board 405 for the measurement of the chip. To minimize the effects of off-chip parasitics, the chip is bonded to the test board 405 directly. Single-ended input signal 102 (from input source 401) and clock (from clock generator 128) are converted to differential signals on the Printed Circuit Board (PCB) using off the shelf balun (TC1-1-13M+, Mini-circuits). Eight linear regulators 407 (LT3021, Linear technology) are used to generate supply voltages, reference voltages, and the common-mode voltage. An accurate 1 ohm resistor is added in series at the output of the regulators to measure the power consumption. Pattern generator 411 and a logic analyzer 409 are also attached to the PCB; and the PCB is powered by the power supply 408.

Figure 36:
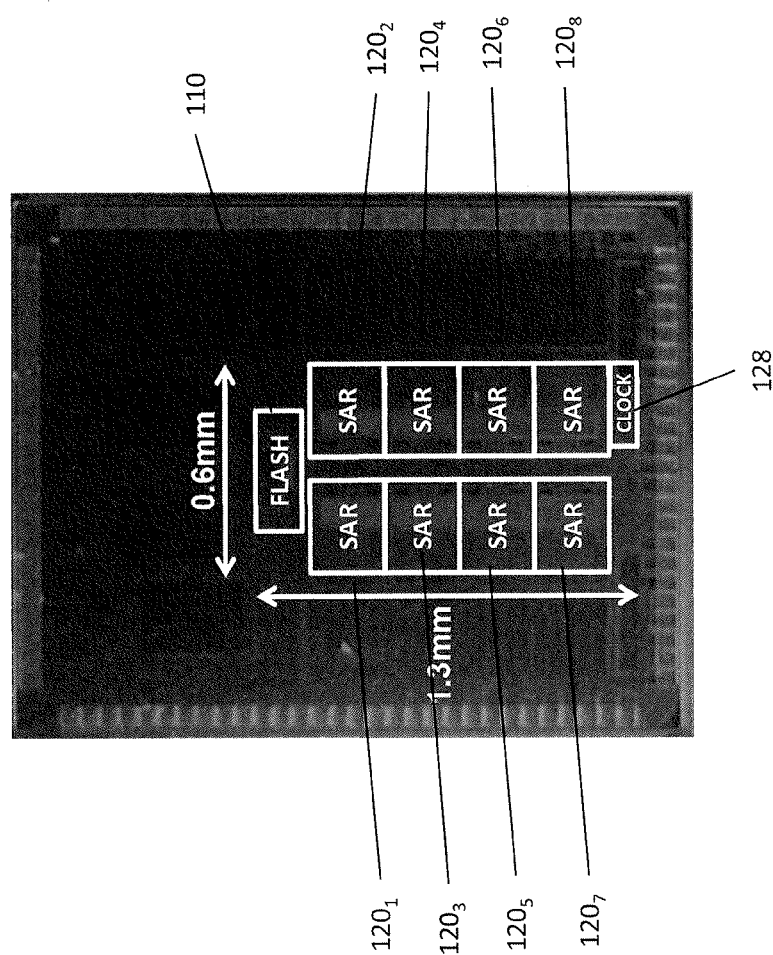
FIG. 36 shows a die photo of the time-interleaved SAR ADC, according to one embodiment of the present invention.

A prototype ADC can be fabricated in a 65 nm GP CMOS process. The die photo is shown in FIG. 36. The active area of the ADC including the SAR ADCs $120_1$-$120_8$, flash ADC 110, clock generator 128, is highlighted in FIG. 35 and occupies 0.78 mm$^2$. The unused area of the chip is filled with decoupling capacitors.

B. Measurement Result

Figure 37:
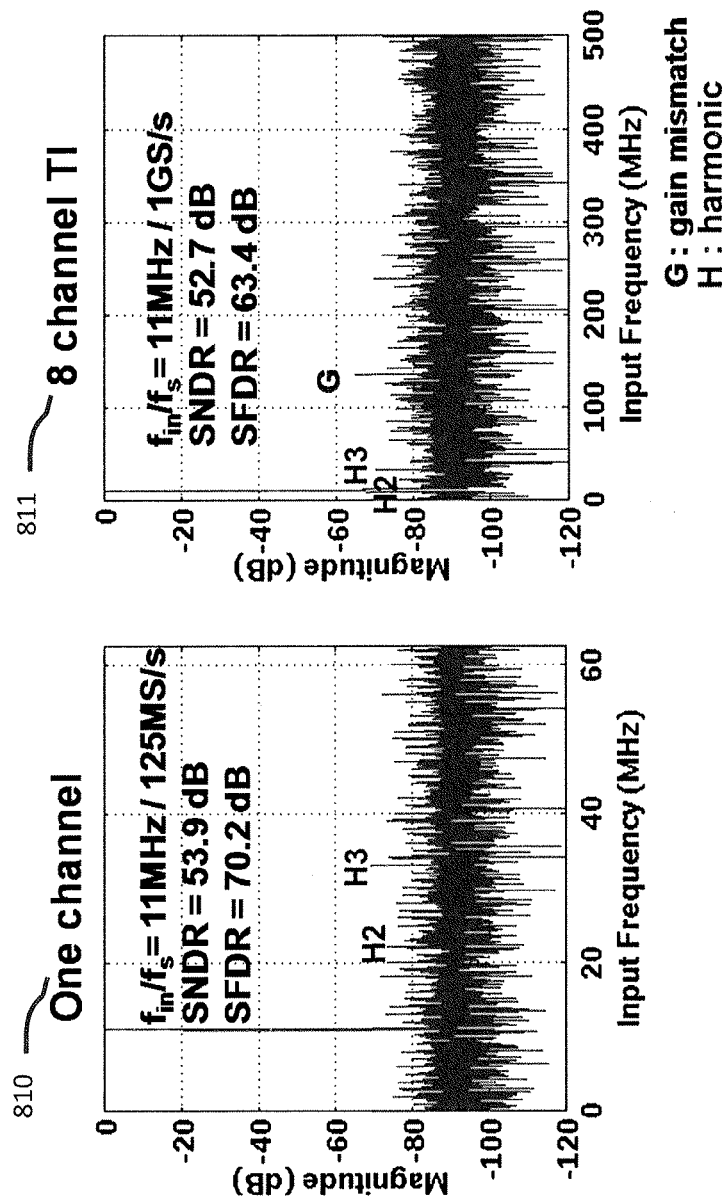
FIG. 37 shows a data plot diagrams illustrating measured spectrum before calibration: single channel result and time-interleaved result with a low frequency input signal at 11 MHz.

FIG. 37 shows the measured spectrum with a low frequency (11 MHz) input signal. The spectrum of a single channel result is shown on the left 810 and the spectrum of the time-interleaved result 811 is plotted on the right. A typical single channel achieves 53.9 dB SNDR and 70.2 dB SFDR. The SNDR in the time-interleaved result shows 52.7 dB SNDR and 63.4B SFDR. Considering that the input frequency is very low, the errors from the timing skew are negligible. The 1.2 dB SNDR degradation in the TI result is due to the gain and offset mismatches between the channels. For single channel result at low frequency input, the effect of offset, timing skew, gain mismatch, and clock jitter may not be dominant error sources. From the fact that SNDR is not limited by lower harmonics but noise, crosstalk through shared reference voltage between channels is believed as a liming factor of single channel SNDR.

Figure 38:
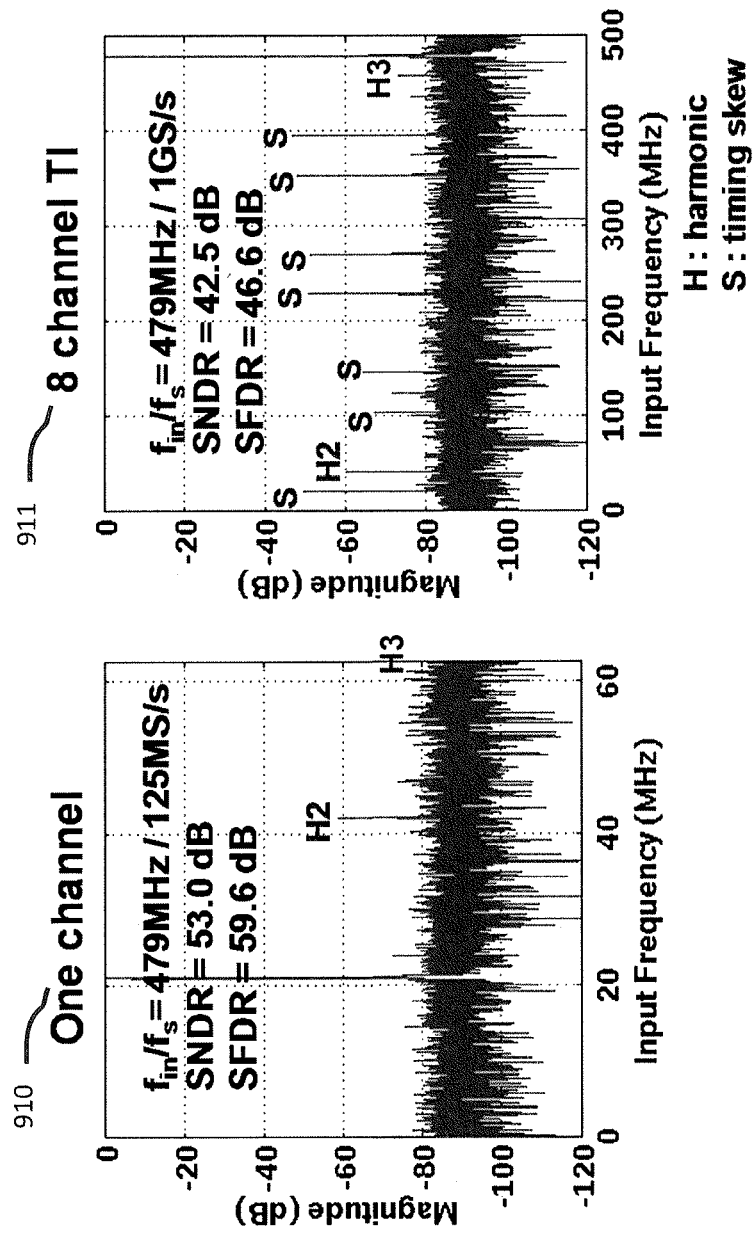
FIG. 38 shows a data plot diagram illustrating measured spectrum before calibration: single channel result and time-interleaved result with a Nyquist rate input signal at 479 MHz.

FIG. 38 shows the measured spectrum with an input signal close to the Nyquist rate (479 MHz) for a single channel 910 and an 8 channel TI ADC 911. A typical single channel result shows only a slight degradation in SNDR compared with the low frequency test. This means that clock jitter does not limit the performance. Although the SNDR of a single channel is maintained above 53 dB, the time-interleaved spectrum suffers from large tones caused by timing skews between channels. As a result, SNDR and SFDR are limited to 42.5 dB and 46.6 dB respectively without calibration. Estimated timing skew from the skew tone power is about 2.7 ps,rms.

Figure 39:
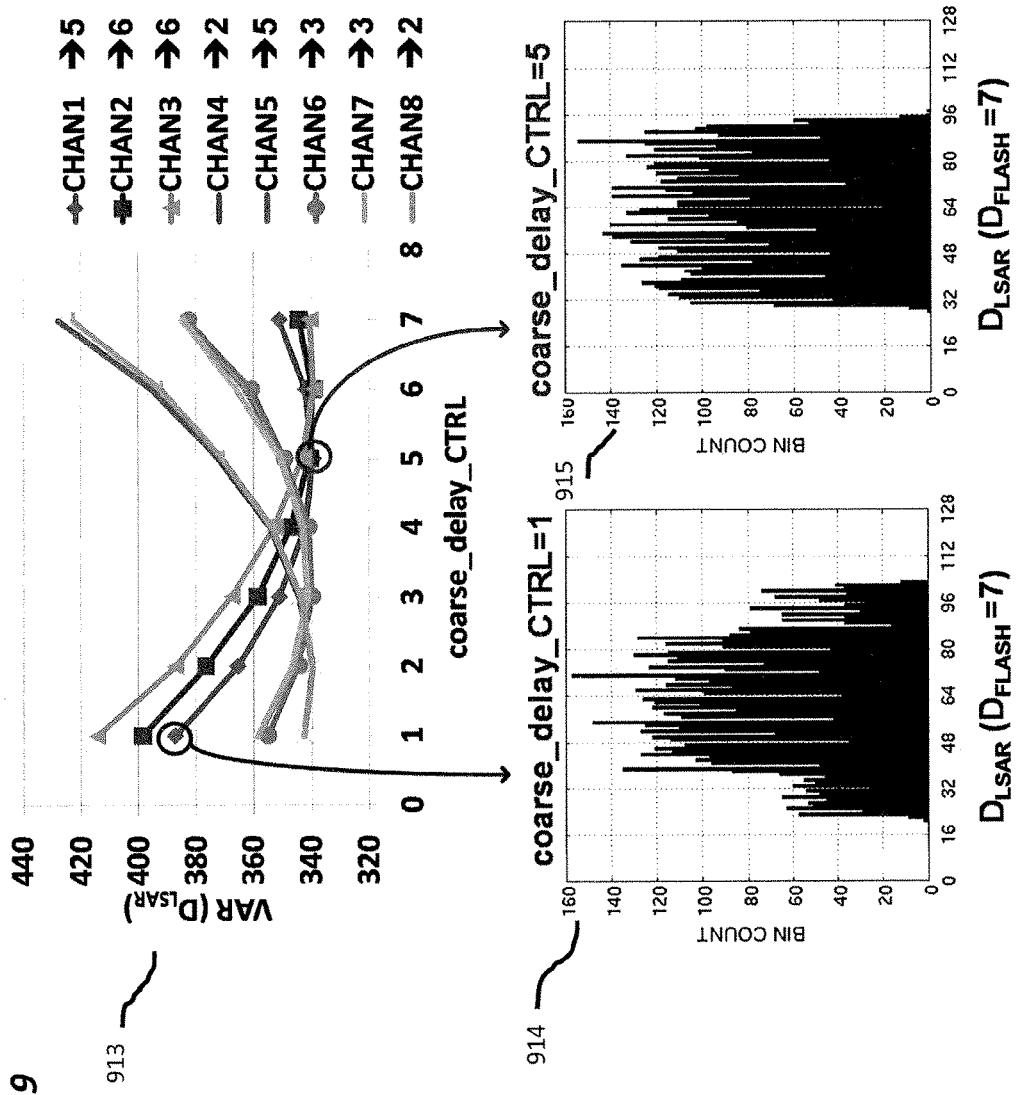
FIG. 39 provides data plot diagrams illustrating measured variance of SAR ADC output against coarse delay of SAR ADC sampling clock.
Figure 40:
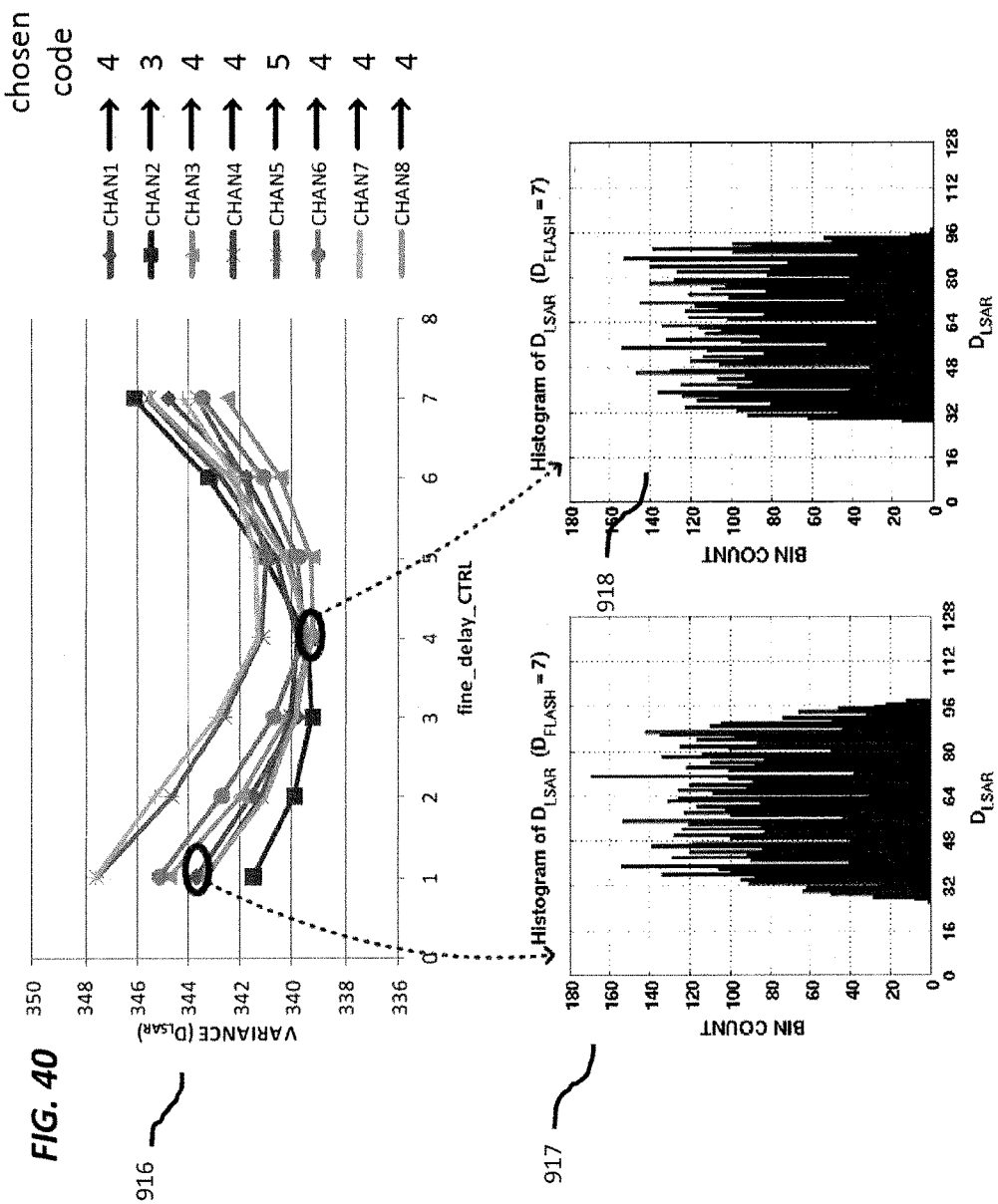
FIG. 40 provides data plot diagrams illustrating measured variance of SAR ADC output against fine delay of SAR ADC sampling clock.
Figure 41:
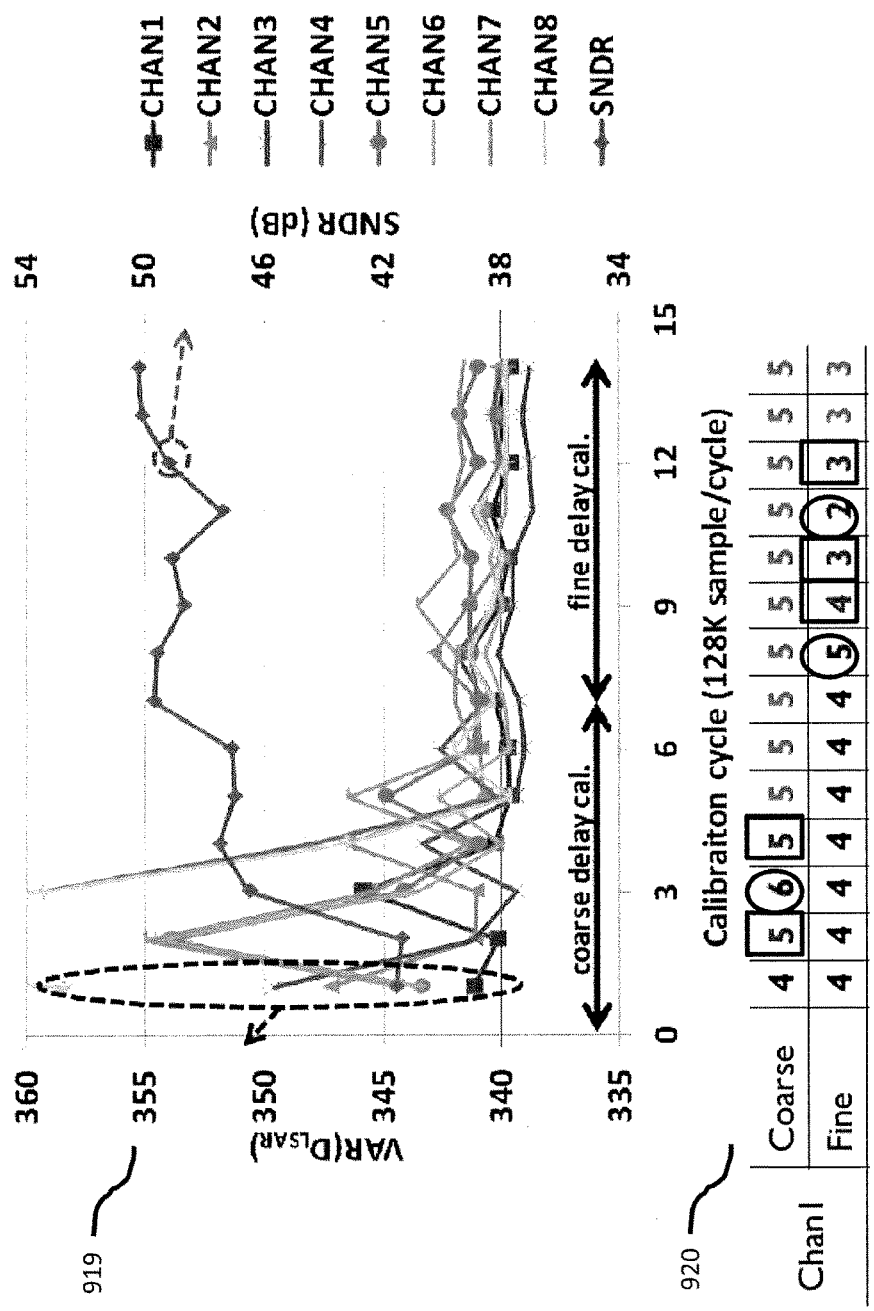
FIG. 41 provides a data plot diagram illustrating the convergence of the background timing-skew calibration performance.
Figure 42:
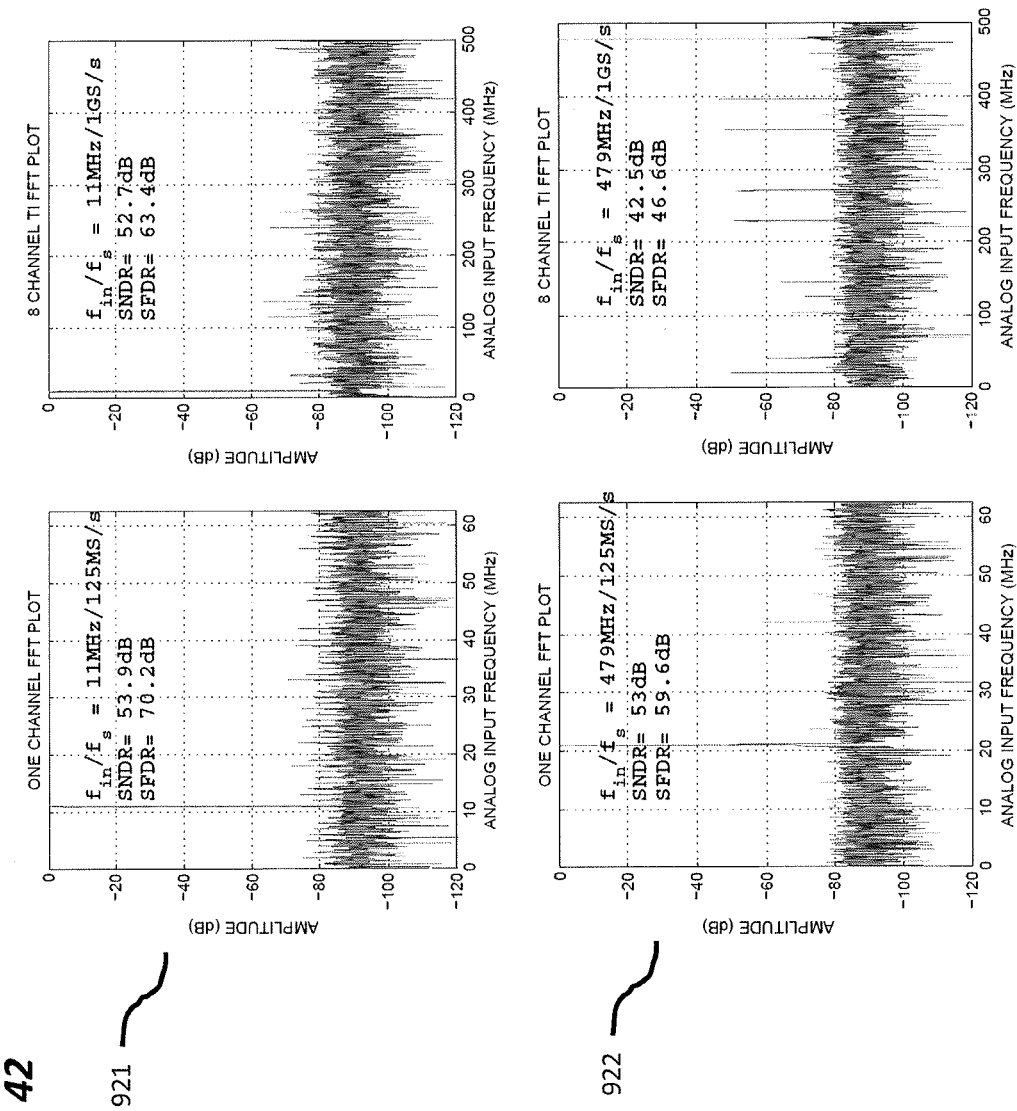
FIG. 42 provides data plot diagrams illustrating measured spectrum after background timing-skew calibration including single channel result and time-interleaved result with a Nyquist rate input signal at 479 MHz.

FIGS. 39-40 show the VAR($D_{LSAR}$) against the coarse delay control codes of the SAR sampling clocks (at 913) after timing-skew calibration is performed. Performances at different coarse delay control codes are shown at 914-915. Here, 128K data values are used to calculate each variance. All channels show a smooth curve with one minimum. The same process is repeated for the fine delay control code to complete the calibration and the result is shown in FIG. 42 at 913 for the performance of 8 channels. To demonstrate the possibility of background calibration and to avoid errors from a deterministic input signal, the calibration is performed over four different input frequencies and two different input amplitudes, and the differences are found to be insignificant. FIG. 41 shows the performance of VAR($D_{LSAR}$) against the fine delay control codes of the SAR sampling clocks after timing-skew calibration is performed at 916, and the histogram of $D_{LSAR}$ with different $D_{FLASH}$ at 917-918.

Although the above mentioned brute force sweeping of the delay codes can be used to find the minimum variance, this can be slow and inefficient because it includes unnecessary calculation. An iterative linear searching method can expedite the convergence speed and save power consumption of the calibration. FIG. 41 presents the performance of an iterative liner searching algorithm (at 919). In this example, a pure sine input signal (479 MHz, -1.5 dB$_{FS}$) is applied and the SNDR is calculated at the end of each calibration cycle to demonstrate the convergence and effectiveness of the calibration. The linear searching starts from default delay control codes and measure the variance of $D_{LSAR}$. In the second calibration cycle, the delay code is either increase or decrease by 1 randomly and measure the variance of $D_{LSAR}$. If the variance is decreased, the control code is updated further in the same direction in the next calibration cycle. If the variance is increased, the control code is updated in the opposite direction in the next calibration cycle. At the bottom (920) of FIG. 41, the coarse and fine codes for the channel 1 timing-skew calibration are presented as an example. The coarse and fine delay control codes are circled when the variance is increased; and are framed in a square when the variance is decreased. With this searching method, SNDR is significantly improved after a few cycles of the calibration. This linear searching method requires the monotonicity of the programmable delay block.

Figure 43:
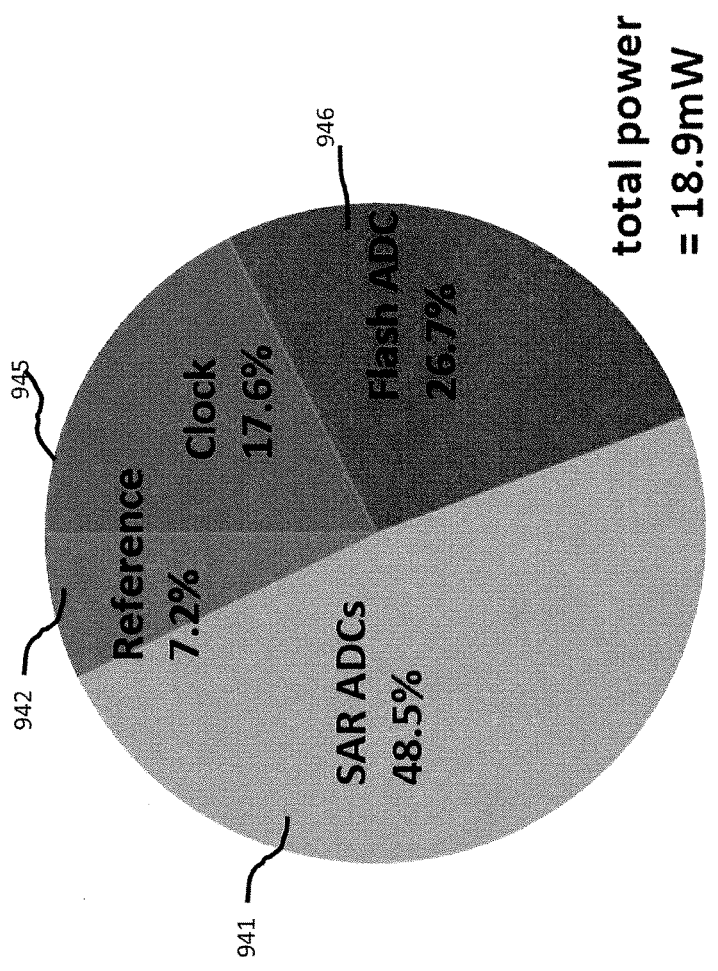
FIG. 43 provides a pie chart illustrating power breakdown of the chip.
Figure 44:
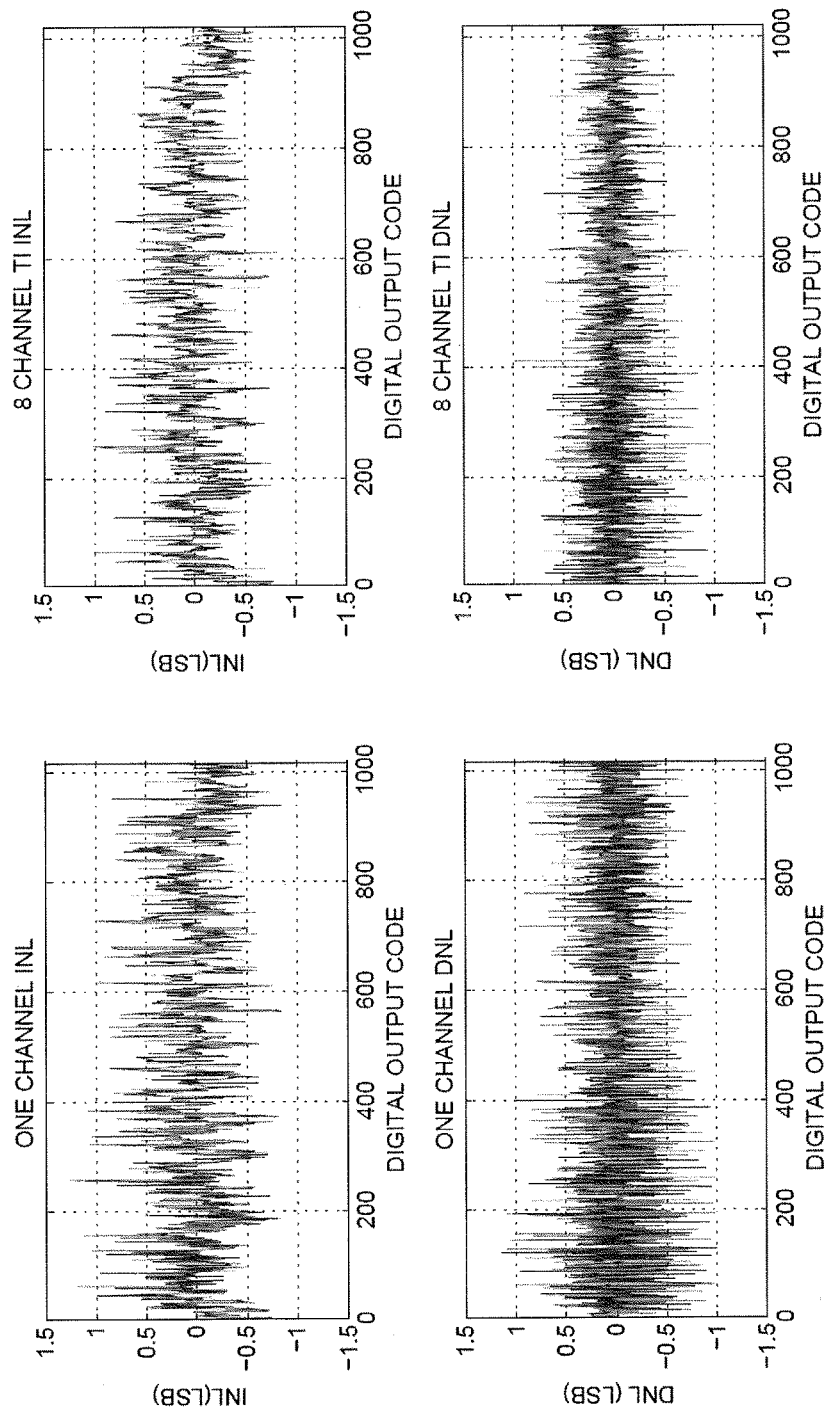
FIG. 44 provides data plot diagrams illustrating measured INL/DNL of the ADC: single channel result and time-interleaved result.

FIG. 42 shows the measured spectrum after timing-skew calibration. A typical single channel result is the same as before calibration shown at FIGS. 37-38. However, the error tones in the time-interleaved result are significantly reduced by the timing-skew calibration. SNDR and SFDR are improved to 51.4 dB and 60.0 dB respectively (see the data plots at 921, compared to the SNDR and SFDR performance before timing-skew calibration (see the data plots at 922). The power consumption is 18.9 mW (clock 3.34 mW, flash ADC 5.04 mW, SAR ADCs 9.18 mW, reference 1.35 mW), which corresponds to 62.3 fJ/step FoM. The power consumption of the digital circuits for background timing-skew estimation is not included. Because timing-skew does not change frequently, the calibration is not required to run continuously all the time. It may be initiated only when the chip is powered on and when temperature or voltage fluctuation is detected. Then, the power consumption of the calibration is insignificant and can be ignored. FIG. 43 shows the power breakdown of the chip, including power consumption percentage of the SAR ADC 941, flash ADC 946, reference 942, and clocks 945. The Differential non-linearity INL/DNL plots are shown in FIG. 44.

The residual error tones after calibration are about -60 dBFS, which is slightly worse than the expected value from the fine delay step (≈0.8 ps step). A foreground timing-skew calibration 951 is performed to find the limit of the calibration. For the foreground calibration, a pure sine wave is applied and the coarse and fine delay codes are tuned to maximize the SNDR. The result of foreground calibration is plotted in FIG. 45. SNDR (of foreground timing-skew calibration 951) is improved to 52.9 dB, which is 1.5 dB better than with the proposed background calibration 952.

Figure 45:
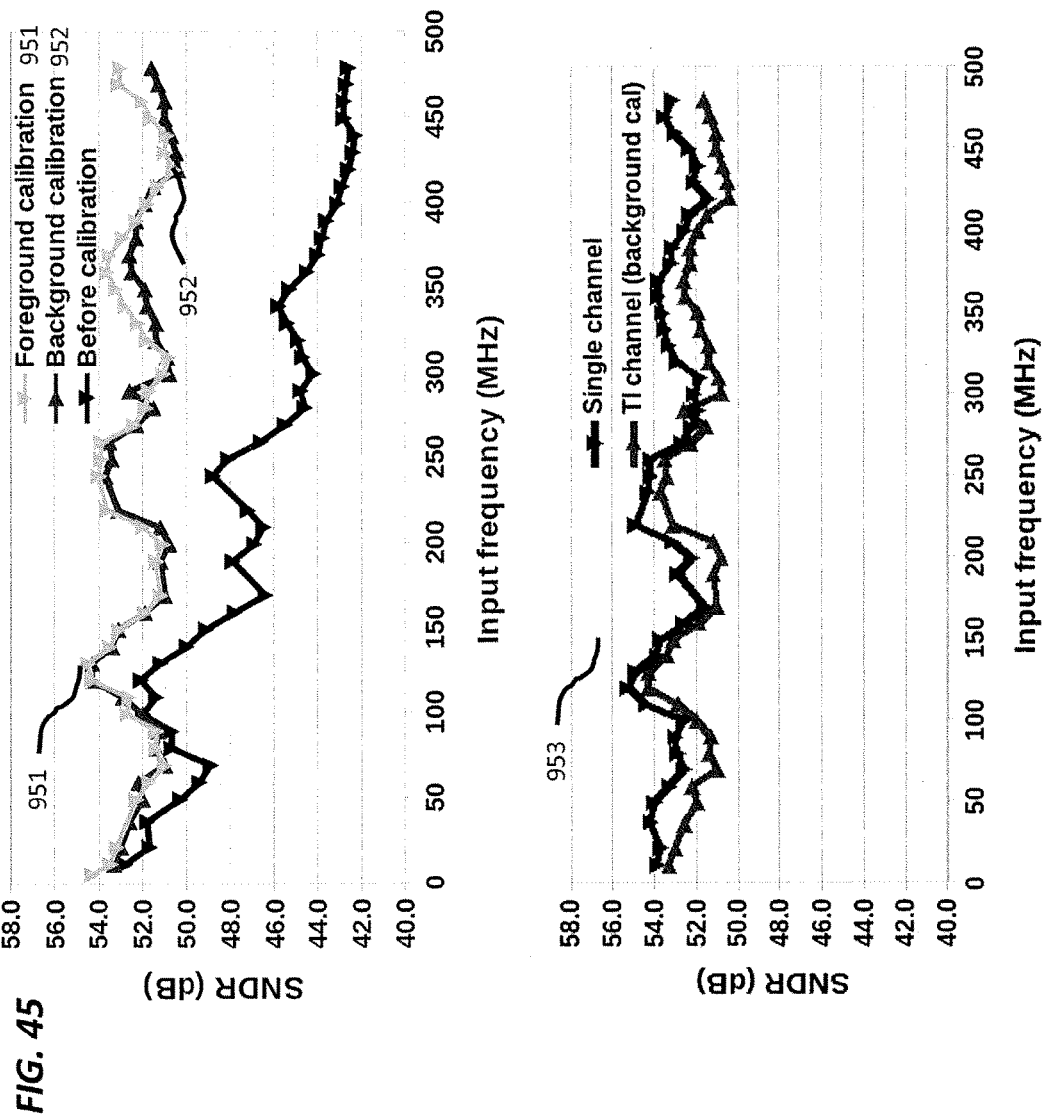
FIG. 45 provides data plot diagrams illustrating measured spectrum after foreground timing-skew calibration: single channel result and time-interleaved result with a Nyquist rate input signal including measured SNDR versus input frequency.

To illustrate the effectiveness of the timing-skew calibration, SNDR versus input frequency is plotted in the latter half 953 of FIG. 45. It clearly shows that SNDR drop at high input frequency is recovered by both background and foreground calibration. It is also notable that SNDR after calibration has a repetitive pattern over input frequency. To explain this SNDR fluctuation, a typical single channel SNDR curve is plotted at 953 in FIG. 45. A similar SNDR pattern over input frequency is also observed in a single channel result. It means that the SNDR fluctuation should be explained from a single channel operation.

The SNDR waviness is believed to be caused by data-dependent disturbances on the external input network. SNDR curves have peaks at input frequency around 0 MHz, 125 MHz, 250 MHz, 375 MHz, and 500 MHz. At these frequencies, each channel converts an aliased low frequency input signal. Thus, the charge sampled in the previous cycle of each channel is very similar to the charge sampled by that channel. This means that the input network is not disturbed by the sampling capacitors at the beginning of the sampling phase. In contrast, about 3 dB worse SNDR is measured at input frequency around 62.5 MHz, 187.5 MHz, 312.5 MHz, and 437.5 MHz. These are the frequencies that each channel experiences an aliased Nyquist rate input signal. In this case, each channel sees the worst case difference in charge sample-to-sample. Therefore, it causes maximum disturbance on the input network. If this disturbance does not settle with in 1 ns, the next sample taken by the next channel will have an error. One possible solution to mitigate this data-dependent input network disturbances is adding a reset phase to clear the charge in the previous sample. This reset phase does not eliminate disturbance on the input network, but makes disturbance constant and data-independent. Another solution is to use a small sampling capacitor. With a small sampling capacitor, the charge provided from the input network in the sampling phase is also small. Thus, disturbance of the input network can be reduced. However, it may worsen thermal noise and matching of sampling capacitor.

Figure 46:
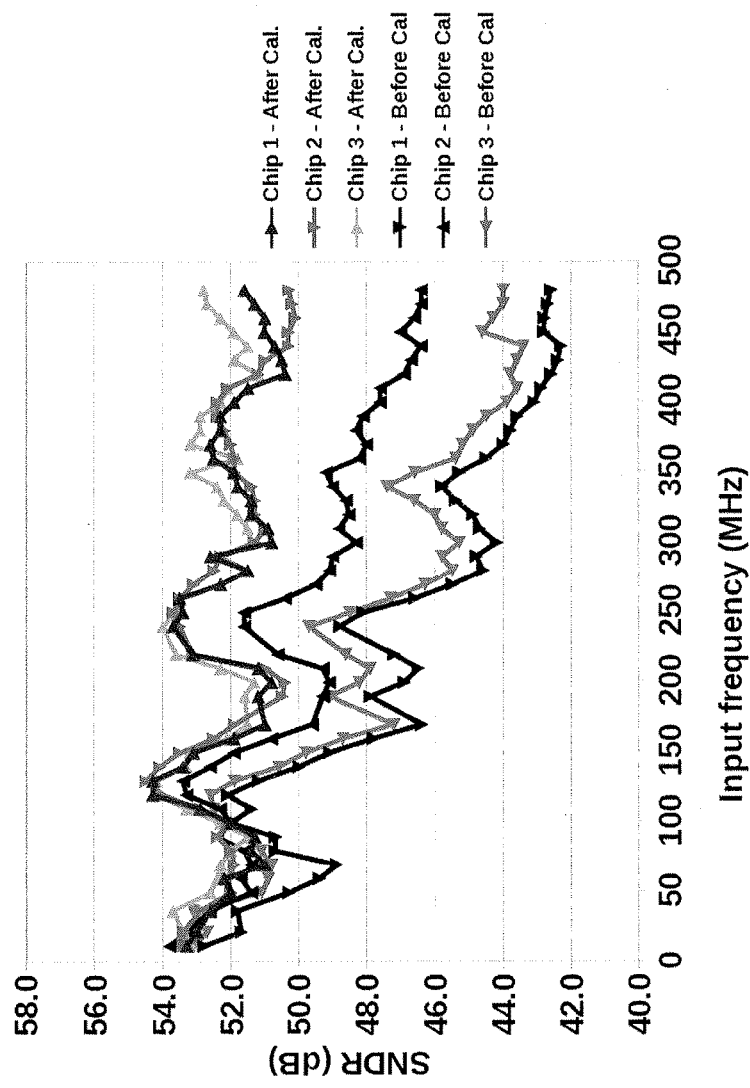
FIG. 46 provides a data plot diagram illustrating measured SNDR versus input frequency from three different chips.

The measurement results of three different chips are plotted in FIG. 46. Before calibration, SNDR is spread widely and limited by the timing-skew for all three chips at high frequencies. After calibration, the three chips provide similar performance with 1.2 dB SNDR variation at Nyquist input rate. The output spectrum plots shown in the previous part of this section are the result from Chip 1.

Although some embodiments described herein demonstrate good SNDR at targeted operating speed, the TI ADC is designed to achieve better than 58 dB SNDR (60 dB SNDR for single channel) at 1 GS/s. SNDR degradation by the additional errors caused by time-interleaved structure is about 1-2 dB. However, SNDR of a typical single channel result is significantly worse than simulation results, and is a limiting factor of the overall SNDR.

The output spectrum of a typical single channel (e.g., at 921 in FIG. 42) indicates that SDNR of a typical single channel is limited by the noise power. However, based on simulation results, thermal noise of the sampling capacitors and SAR comparators is well below the measured noise power.

VI. Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto; inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the embodiments (e.g., of designing and/or operating transparent displays) may be implemented using hardware, software, or a combination thereof. When implemented in software, the software code can be executed on any suitable processor or collection of processors, whether provided in a single computer or distributed among multiple computers.

Further, it should be appreciated that the present displays and methods of making and operating displays may be used in conjunction with a computer, which may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices, including one or more displays as disclosed herein. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

A flow diagram is used herein. The use of flow diagrams is not meant to be limiting with respect to the order of operations performed. The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedia components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An analog-to-digital converter (ADC) apparatus, comprising:
    a coarse ADC to convert an input analog signal to a coarse digital output at a first sampling rate in response to a first clock signal having a first frequency, the coarse digital output constituting a timing reference for the ADC apparatus;
    a plurality of time-interleaved (TI) ADCs comprising at least a first TI ADC to convert the input analog signal to a first TI digital output at a second sampling rate in response to a second clock signal having a second frequency, wherein:
        the second frequency of the second clock signal is less than the first frequency of the first clock signal;
        the first TI ADC is coupled to the coarse ADC so as to receive the coarse digital output;
        the first TI digital output includes a plurality of most significant bits (MSBs) and a plurality of least significant bits (LSBs); and
        the plurality of MSBs of the TI digital output are based on the coarse digital output; and
    a timing-skew controller, coupled to at least the first TI ADC, to make a first comparison of the coarse digital output constituting the timing reference and the first TI digital output and significantly reduce a first timing-skew error between the coarse digital output and the first TI digital output based at least in part on the first comparison.

2. The apparatus of claim 1, wherein:
    the timing-skew controller, in operation of the apparatus, generates at least one first delay control signal based on the first comparison; and
    the second clock signal is variably adjusted in time with respect to the first clock signal, based on the at least one first delay control signal, so as to substantially align the second clock signal and the first clock signal and thereby significantly reduce the first timing-skew error between the coarse digital output and the first TI digital output.

3. The apparatus of claim 1, wherein in operation of the apparatus, the timing-skew controller makes the first comparison by subtracting the coarse digital output from the first TI digital output.

4. The apparatus of claim 1, further comprising:
    a first sampling switch to receive the first clock signal and to sample the input analog signal at the first sampling rate corresponding to the first frequency of the first clock signal, so as to provide a first sampled input signal to the coarse ADC, such that the coarse ADC provides the coarse digital output corresponding to the first sampled input signal; and
    a plurality of additional sampling switches comprising at least a second sampling switch to receive the second clock signal and to sample the input analog signal at the second sampling rate corresponding to the second frequency of the second clock signal, so as to provide a second sampled input signal to the first TI ADC, such that the first TI ADC provides the first TI digital output corresponding to the second sampled input signal.

5. The apparatus of any of claim 1, wherein the coarse ADC is a flash ADC.

6. The apparatus of claim 5, wherein the flash ADC is a sampling flash ADC.

7. The apparatus of claim 2, further comprising:
    a clock generator controller, coupled to at least the timing-skew controller, to receive the at least one first delay control signal from the timing-skew controller and a master clock signal, generate the first clock signal and the second clock signal based at least in part on the master clock signal, and variably adjust the second clock signal in time, with respect to the first clock signal, based on the at least one first delay control signal.

8. The apparatus of claim 7, wherein the clock generator controller comprises programmable delay circuitry to receive the at least one first delay control signal and to variably adjust the second clock signal in time, based on the at least one first delay control signal, to have a variable coarse delay and a variable fine delay.

9. The apparatus of claim 8, wherein:
    the at least one first delay control signal includes a coarse digital code and a fine digital code; and
    the programmable delay circuitry includes:
        a first inverter coupled to a first capacitor bank controlled by the coarse digital code to provide the variable coarse delay; and
        a second inverter coupled to a second capacitor bank controlled by the fine digital code to provide the variable fine delay.

10. The apparatus of claim 2, wherein in operation of the apparatus the timing-skew controller calculates a first variance of at least a portion of the first TI digital output based on the coarse digital output, and generates the at least one first delay control signal based on the first variance.

11. The apparatus of claim 10, wherein the timing-skew controller calculates the first variance based on a difference between the first TI digital output and the coarse digital output.

12. The apparatus of claim 10, wherein the timing-skew controller generates the at least one first delay control signal so as to minimize the first variance over a succession of first TI digital outputs and corresponding coarse digital outputs.

13. The apparatus of claim 12, wherein the timing-skew controller comprises a plurality of counters to generate a histogram of the difference between the first TI digital output and the coarse digital output over the succession of first TI digital outputs and corresponding coarse digital outputs so as to calculate the first variance.

14. The apparatus of claim 10, wherein:
    the first TI ADC is a successive approximation register (SAR) ADC to provide the first TI digital output as an N-bit digital word including the plurality of most significant bits (MSBs) and the plurality of least significant bits (LSBs); and
    the SAR ADC includes:
        a first plurality of unary-weighted MSB capacitors on which the plurality of MSBs are based, each unary-weighted MSB capacitor having a same first unit capacitance; and a second plurality of binary-weighted LSB capacitors on which the plurality of LSBs are based, wherein:
the first variance is calculated by the timing-skew controller based at least in part on successive digital values represented by the plurality of binary-weighted LSB capacitors as a function of time.

15. The apparatus of claim 14, wherein:
the first plurality of unary-weighted MSB capacitors and the second plurality of binary-weighted LSB capacitors have a total unit capacitance of $2^N$; and
a largest unit capacitance of the second plurality of binary-weighted LSB capacitors is equal to the first unit capacitance of each of the first plurality of unary-weighted MSB capacitors.

16. The apparatus of any of claim 1, wherein:
the plurality of TI ADCs further comprises at least a second TI ADC to convert the input analog signal to a second TI digital output in response to a third clock signal;
the apparatus further comprises a multiplexer/combiner, coupled to the plurality of TI ADCs, to receive at least the first TI digital output and the second TI digital output and to provide a multiplexed digital output corresponding to the input analog signal;
the timing-skew controller is further coupled to the second TI ADC, to make a second comparison of the coarse digital output constituting the timing reference and the second TI digital output, and generate at least one second delay control signal based on the second comparison; and
the third clock signal is variably adjusted in time with respect to the first clock signal, based on the at least one second delay control signal, so as to substantially align the third clock signal and the first clock signal and thereby significantly reduce a second timing-skew error between the coarse digital output and the second TI digital output.

17. The apparatus of claim 16, wherein:
the plurality of TI ADCs includes a number n of TI ADCs to provide a corresponding number n of TI digital outputs including the first TI digital output and the second TI digital output;
each of a plurality of n clock signals, including the second clock signal and the third clock signal, has a frequency that is 1/n times the first frequency of the first clock signal; and
the timing-skew controller is coupled to the number n of TI ADCs, to make respective comparisons of the coarse digital output constituting the timing reference and respective ones of the number n of TI digital outputs to generate corresponding delay control signals to variably adjust in time respective ones of the plurality of n clock signals with respect to the first clock signal, so as to substantially align each of the plurality of n clock signals and the first clock signal.

18. An analog-to-digital converter (ADC) apparatus, comprising:
a flash ADC channel to sample an input analog signal according to a first clock signal having a first frequency, the flash ADC channel comprising:
a first sampling switch to receive the first clock signal and to sample the input analog signal at a first sampling rate corresponding to the first frequency of the first clock signal so as to provide a first sampled input signal;
a flash ADC coupled to the first sampling switch to receive the first sampled input signal and to provide a flash digital output corresponding to the first sampled input signal, the flash digital output constituting a timing reference for the ADC apparatus;
a plurality of time-interleaved (TI) successive-approximation-register (SAR) ADC channels to respectively sample the input analog signal, each of the TI SAR ADC channels controlled by a corresponding TI clock signal to sample the input analog signal, the plurality of TI SAR ADC channels comprising:
a plurality of additional sampling switches comprising at least a second sampling switch to receive a second clock signal and to sample the input analog signal at a second sampling rate corresponding to a second frequency of the second clock signal, so as to provide a second sampled input signal, wherein the second frequency of the second clock signal is less than the first frequency of the first clock signal;
a plurality of TI SAR ADCs respectively coupled to the plurality of additional sampling switches, the plurality of TI SAR ADCs comprising at least a first TI SAR ADC coupled to the second sampling switch to receive the second sampled input signal and coupled to the flash ADC so as to receive the flash digital output, to
provide a first TI digital output corresponding to the second sampled input signal and the flash digital output, wherein:
the first TI digital output includes a plurality of most significant bits (MSBs) and a plurality of least significant bits (LSBs); and
the plurality of MSBs of the first TI digital output are based on the flash digital output;
a timing-skew controller coupled to the flash ADC channel and the plurality of TI SAR ADC channels to calculate a first variance of at least a portion of the first TI digital output provided by the first TI SAR ADC, based at least in part on the flash digital output constituting the timing reference, and thereby generate at least one first delay control signal; and
a clock generator controller, coupled to at least the timing-skew controller, to receive the at least one first delay control signal from the timing-skew controller and a master clock signal, generate the first clock signal and the second clock signal based at least in part on the master clock signal, and variably adjust the second clock signal in time, with respect to the first clock signal, based on the at least one first delay control signal, so as to facilitate background timing-skew calibration of the ADC apparatus without interrupting normal operation of the ADC apparatus.

19. The apparatus of claims 18, wherein:
the first TI SAR ADC provides the first TI digital output as an N-bit digital word including the plurality of MSBs and the plurality of LSBs; and
the first TI SAR ADC includes:
a first plurality of unary-weighted MSB capacitors on which the plurality of MSBs are based, each unary-weighted MSB capacitor having a same first unit capacitance; and
a second plurality of binary-weighted LSB capacitors on which the plurality of LSBs are based,
wherein the first variance is calculated by the timing-skew controller based at least in part on successive digital values represented by the plurality of binary-weighted LSB capacitors as a function of time.

20. The apparatus of claims 19, wherein:
the first plurality of unary-weighted MSB capacitors and the second plurality of binary-weighted LSB capacitors have a total unit capacitance of $2^N$; and
a largest unit capacitance of the plurality of binary-weighted LSB capacitors is equal to the first unit capacitance of each of the unary-weighted MSB capacitors so as to provide for a redundancy between the flash digital output and the first TI digital output.

21. An analog-to-digital converter (ADC) apparatus, comprising:
a plurality of time-interleaved (TI) ADC channels to respectively sample an input analog signal, each of the TI ADC channels controlled by a corresponding TI clock signal to sample the input analog signal; and
a timing-skew controller coupled to the plurality of TI ADC channels to variably control a delay of at least one corresponding TI clock signal so as to facilitate background timing-skew calibration of the ADC apparatus without interrupting normal operation of the ADC apparatus,
wherein the ADC apparatus does not include a separate TI ADC channel of the plurality of TI ADC channels as a timing reference channel to facilitate the background timing-skew calibration.

22. The ADC apparatus of claim 21, wherein the input analog signal is a Nyquist-rate input signal.

23. The ADC apparatus of claim 21, further comprising:
a coarse ADC channel to sample the input analog signal according to a first clock signal having a first frequency.

24. The ADC apparatus of claim 23, wherein:
the at least one corresponding TI clock signal has a second frequency;
the first frequency of the first clock signal is higher than the second frequency of the at least one corresponding TI clock signal; and
the input analog signal includes a highest frequency component having a frequency that is less than or equal to half of the first frequency of the first clock signal.

25. The ADC apparatus of claim 23, wherein:
the coarse ADC channel provides a coarse digital output corresponding to a sampled input analog signal at the first frequency; and
the timing-skew controller is coupled to the coarse ADC channel and compares the coarse digital output to a first TI digital output provided by a first TI ADC channel of the plurality of TI ADC channels, the first TI ADC channel being controlled by the at least one corresponding TI clock signal, so as to variably control the delay of the at least one corresponding TI clock signal to facilitate the background timing-skew calibration of the ADC apparatus.

26. The ADC apparatus of claim 25, wherein the timing-skew controller calculates a first variance of the first TI digital output, based on the coarse digital output, so as to variably control the delay of the at least one corresponding TI clock signal.

27. An analog-to-digital converter (ADC) apparatus, comprising:
a coarse ADC channel to sample an input analog signal according to a first clock signal having a first frequency, the coarse ADC channel providing a coarse digital output corresponding to a sampled input analog signal at the first frequency and constituting a timing reference for the ADC apparatus; and
a plurality of time-interleaved (TI) ADC channels to respectively sample the input analog signal, each of the TI ADC channels controlled by a corresponding TI clock signal to sample the input analog signal, each corresponding TI clock signal having a TI clock signal frequency that is lower than the first frequency of the first clock signal, wherein:
a delay of at least one corresponding TI clock signal is variably controlled based at least in part on the coarse digital output constituting the timing reference for the ADC apparatus so as to facilitate background timing-skew calibration of the ADC apparatus without interrupting normal operation of the ADC apparatus; and
the ADC apparatus does not include a separate timing reference TI ADC channel to facilitate the background timing-skew calibration.

28. The apparatus of claim 27, further comprising:
a timing-skew controller coupled to the coarse ADC channel and the plurality of TI ADC channels to compare the coarse digital output to a first TI digital output provided by a first TI ADC channel of the plurality of TI ADC channels, the first TI ADC channel being controlled by the at least one corresponding TI clock signal, so as to variably control the delay of the at least one corresponding TI clock signal to facilitate the background timing-skew calibration of the ADC apparatus.

29. The apparatus of claim 28, wherein during operation of the apparatus, the timing-skew controller calculates a first variance of the first TI digital output, based on the coarse digital output, so as to variably control the delay of the at least one corresponding TI clock signal.

30. The apparatus of claim 29, wherein the timing-skew controller calculates the first variance based on a difference between the first TI digital output and the coarse digital output.

31. The apparatus of claim 30, wherein the timing-skew controller variably controls the delay of the at least one corresponding TI clock signal so as to minimize the first variance over a succession of first TI digital outputs and corresponding coarse digital outputs.

32. The apparatus of claim 31, wherein the timing-skew controller comprises a plurality of counters to generate a histogram of the difference between the first TI digital output and the coarse digital output over the succession of first TI digital outputs and corresponding coarse digital outputs so as to calculate the first variance.

33. A method for converting an input analog signal to a digital output, the method comprising:
A) sampling the input analog signal according to a first clock signal having a first frequency to provide a coarse digital output corresponding to a sampled input analog signal at the first frequency and constituting a timing reference for the ADC apparatus;
B) respectively sampling the input analog signal via a plurality of time-interleaved (TI) channels according to a plurality of corresponding TI clock signals, each corresponding TI clock signal having a TI clock signal frequency that is lower than the first frequency of the first clock signal; and
C) variably controlling a delay of at least one corresponding TI clock signal based at least in part on the coarse digital output constituting the timing reference for the ADC apparatus so as to facilitate background timing-skew calibration of the ADC apparatus without interrupting normal operation of the ADC apparatus,
wherein the plurality of TI channels does not include a separate timing reference TI channel to facilitate the background timing-skew calibration.

34. The method of claim 33, wherein C) comprises:
C1) comparing the coarse digital output to a first TI digital output provided by a first TI ADC channel of the plurality of TI ADC channels, the first TI ADC channel being controlled by the at least one corresponding TI clock signal, so as to variably control the delay of the at least one corresponding TI clock signal to facilitate the background timing-skew calibration of the ADC apparatus.

35. The method of claim 34, wherein C1) comprises:
C2) calculating a first variance of the first TI digital output, based on the coarse digital output, so as to variably control the delay of the at least one corresponding TI clock signal.

36. The method of claim 35, wherein C2) comprises:
C3) calculating the first variance based on a difference between the first TI digital output and the coarse digital output.

37. The method of claim 36, further comprising:
D) variably controlling the delay of the at least one corresponding TI clock signal so as to minimize the first variance over a succession of first TI digital outputs and corresponding coarse digital outputs.

38. The method of claim 37, wherein in C3) comprises:
generating a histogram of the difference between the first TI digital output and the coarse digital output over the succession of first TI digital outputs and corresponding coarse digital outputs so as to calculate the first variance.

\* \* \* \* \*